US012614508B2

(12) United States Patent
Zhang

(10) Patent No.: US 12,614,508 B2
(45) Date of Patent: Apr. 28, 2026

(54) GATE DRIVING CIRCUIT AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Huanxi Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/962,925

(22) Filed: Nov. 27, 2024

(65) Prior Publication Data

US 2025/0124857 A1 Apr. 17, 2025

Related U.S. Application Data

(63) Continuation of application No. 18/282,921, filed as application No. PCT/CN2023/112930 on Aug. 14, 2023, now Pat. No. 12,183,266.

(30) Foreign Application Priority Data

Jul. 26, 2023 (CN) .......................... 202310928332.5

(51) Int. Cl.
G09G 3/20 (2006.01)
G09G 3/32 (2016.01)
G11C 19/28 (2006.01)

(52) U.S. Cl.
CPC ....... *G09G 3/32* (2013.01); *G09G 2300/0809* (2013.01); *G09G 2310/0267* (2013.01);
(Continued)

(58) Field of Classification Search
CPC ............. G09G 3/32; G09G 2300/0809; G09G 2310/0267; G09G 2310/0286;
(Continued)

(56) References Cited

U.S. PATENT DOCUMENTS

2004/0227718 A1 11/2004 Park
2019/0096500 A1* 3/2019 Gu ............................ G09G 3/20
(Continued)

FOREIGN PATENT DOCUMENTS

CN 109308864 A 2/2019
CN 110972504 A 4/2020
(Continued)

OTHER PUBLICATIONS

German Office Action issued in corresponding German Patent Application No. 11 2023 000 049.2 dated Jun. 28, 2024, pp. 1-5, 10pp.

(Continued)

*Primary Examiner* — Abdul-Samad A Adediran
(74) *Attorney, Agent, or Firm* — The Roy Gross Law Firm, LLC; Roy Gross

(57) ABSTRACT

The present disclosure provides a gate driving circuit and a display panel. by the control of one of the fourth node, the output end of the second output module, and the first node of the shift register of the next stage, the voltage regulating module may utilize a low voltage signal to stabilize or reduce the gate voltage of the second transistor, so that the second transistor is stable or preferably in the cut-off state to reduce the leakage current. In this way, voltage level of the second gate driving signal can be maintained at a high voltage level or a pulse amplitude.

20 Claims, 54 Drawing Sheets

(52) U.S. Cl.
CPC . *G09G 2310/0286* (2013.01); *G09G 2310/08*
(2013.01); *G11C 19/28* (2013.01)

(58) Field of Classification Search
CPC .... G09G 2310/08; G09G 3/20; G09G 3/3677;
G11C 19/28
See application file for complete search history.

(56) References Cited

U.S. PATENT DOCUMENTS

| | | | | |
|---|---|---|---|---|
| 2020/0372873 | A1 * | 11/2020 | Huang | G09G 3/3677 |
| 2021/0350734 | A1 * | 11/2021 | Wang | G11C 19/28 |
| 2023/0154409 | A1 | 5/2023 | Wang et al. | |
| 2023/0207031 | A1 | 6/2023 | Wang et al. | |

FOREIGN PATENT DOCUMENTS

| | | | |
|---|---|---|---|
| CN | 112259038 | A | 1/2021 |
| CN | 113284457 | A | 8/2021 |
| CN | 113299223 | A | 8/2021 |
| CN | 114724613 | A | 7/2022 |
| CN | 115862541 | A | 3/2023 |
| KR | 20080104726 | A | 12/2008 |
| WO | 2022160802 | A1 | 8/2022 |
| WO | 2022174376 | A1 | 8/2022 |

OTHER PUBLICATIONS

PCT International Search Report for International Application No.
PCT/CN2023/112930, mailed on Apr. 24, 2024, 8pp.
PCT Written Opinion of the International Searching Authority for
International Application No. PCT/CN2023/112930, mailed on Apr.
24, 2024, 13pp.

* cited by examiner

GATE DRIVING CIRCUIT AND DISPLAY PANEL

CROSS REFERENCE TO RELATED APPLICATIONS

This application is a continuation application of U.S. application Ser. No. 18/282,921, filed on Sep. 19, 2023, which is a National Phase of an International Application No. PCT/CN2023/112930, filed on Aug. 14, 2023, which claims the priority of Chinese Patent Application No. 202310928332.5, entitled "GATE DRIVING CIRCUIT AND DISPLAY PANEL", filed on Jul. 26, 2023, the disclosure of which is incorporated herein by reference in its entirety.

TECHNICAL FIELD

The present disclosure relates to a display technology, and more particularly, to a gate driving circuit and a display panel.

BACKGROUND

In a display panel, the gate driving circuit is usually used to provide the corresponding gate driving signal to different transistors. The stability of the gate driving signal is critical to the operational stability of the transistors.

However, the transition of the voltage level of corresponding signals in the gate driving circuit easily affects the stability of the voltage level of internal nodes, and the stability of the internal node will further affect the stability of the gate driving signal.

SUMMARY

One objective of an embodiment of the present disclosure is to provide a gate driving circuit and a display panel to alleviate the technical issue of the low stability of the voltage level of the gate driving signal.

TECHNICAL SOLUTION

According to an embodiment of the present disclosure, a gate driving circuit is disclosed. The gate driving circuit comprises a plurality of shift registers. At least one of the plurality of shift registers comprises: a cascade signal selection module, electrically connected between a first wiring and a first node; a pull-up control module, configured to control a voltage level of a second node according to a voltage level of the first node, a voltage level of a first clock signal; a first filter module, electrically connected between the second node and a third node, wherein a control end of the first filter module receives a reset signal; a second filter module, electrically connected between the first filter module and the third node, wherein a control end of the second filter module receives a filter control signal; a first inverting module, connected between the second node and a fourth node; a first output module, configured to output a first gate driving signal according to a voltage level of the third node and a voltage level of the fourth node; a second output module, comprising a P-type first transistor and an N-type second transistor, wherein a first electrode of the first transistor is electrically connected to a first high voltage line, a second electrode of the first transistor is electrically connected to a first electrode of the second transistor to output a second gate driving signal, a second electrode of the second transistor is receives a first low voltage signal, the second node is electrically connected to a gate of the first transistor and a gate of the second transistor; and a voltage regulating module, receiving a low voltage signal and connected to the gate of the second transistor, wherein a control end of the voltage regulating module is electrically connected to one of the fourth node, an output end of the second output module and the first node of the shift register of a next stage.

According to another embodiment of the present disclosure, a display panel is disclosed. The display panel comprises a pixel circuit and the above-mentioned gate driving circuit. The pixel circuit comprises: a writing transistor, configured to control an input of a data signal; and a compensation transistor, configured to control the data signal to be inputted to a gate of driving transistor.

Advantageous Effect

In the gate driving circuit and the display panel in the present disclosure, by the control of one of the fourth node, the output end of the second output module, and the first node of the shift register of the next stage, the voltage regulating module may utilize a low voltage signal to stabilize or reduce the gate voltage of the second transistor, so that the second transistor is stable or preferably in the cut-off state to reduce the leakage current. In this way, voltage level of the second gate driving signal can be maintained at a high voltage level or a pulse amplitude. This improves the stability of the gate driving signal.

DETAILED DESCRIPTION OF PREFERRED EMBODIMENTS

In order to make the purpose, technical solution and effect of the present disclosure more clear and definite, the present disclosure will be further described in detail below with reference to the accompanying drawings and examples. It should be understood that the specific embodiments described here are only used to explain the present disclosure, not to limit the present disclosure.

In the gate driving circuit of the Chinese patent application No. 202310191137.9, the Nth negative pulse gate driving signal Pout [N] has a negative pulse in one frame. The Nth stage positive gating driving signal Nout[N] has two positive pulses in one frame, and the pulse widths of the two positive pulses must be equal to be 2H. This limits that the width of the positive pulse of the Nth positive pulse gate driving signal Nout[N] must be consistent and cannot be changed, so that if the width of the positive pulse of the Nth stage positive pulse gate driving signal Nout[N] is greater than 2H, the number of negative pulses of the Nth negative pulse gate driving signal Pout[N] in one frame increases.

Figure 1:
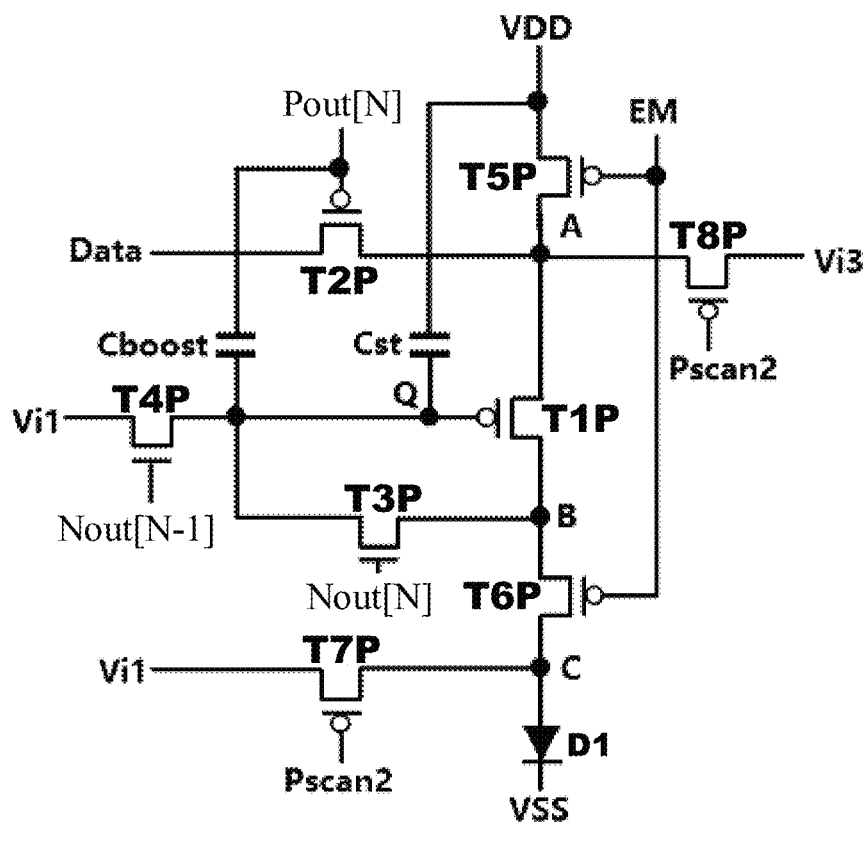
FIG. 1 is a diagram of a conventional pixel circuit.
Figure 2:
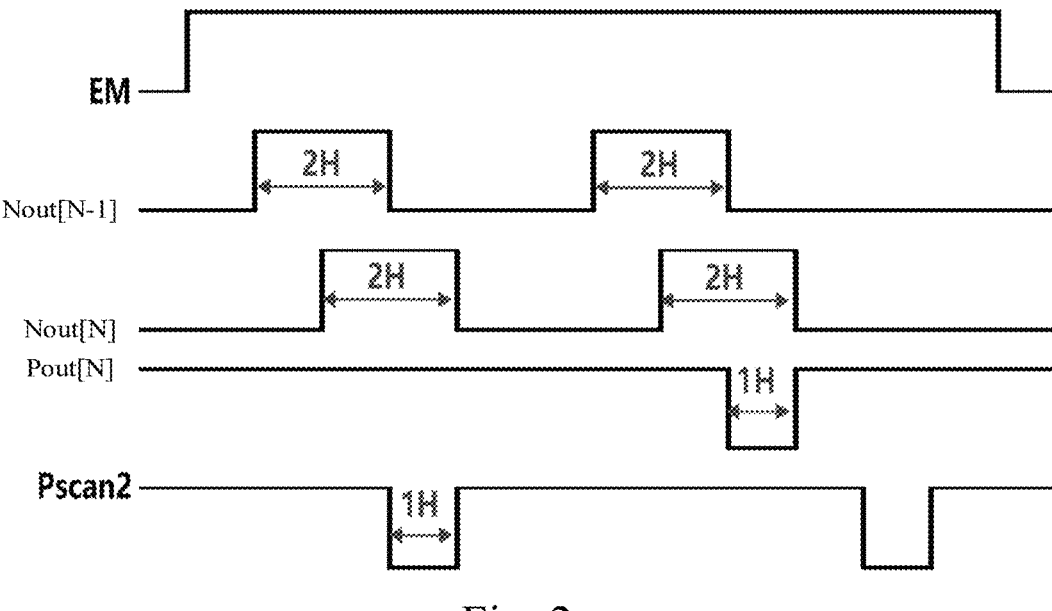
FIG. 2 is a timing diagram of the pixel circuit shown in FIG. 1.

Therefore, this limits the pixel circuit shown in FIG. 1 to operate in the timing shown in FIG. 2. Specifically, the pixel circuit shown in FIG. 1 may include at least one of a writing transistor T2P, a driving transistor T1P, a first light-emitting control transistor T5P, a second light-emitting control transistor T6P, a first initialization transistor T4P, a second initialization transistor T7P, a third initialization transistor T8P, a compensation transistor T3P, a light-emitting device D1, a storage capacitor Cst, and a bootstrap capacitor CbOst.

The first power line is electrically connected to the first electrode of the first light-emitting control transistor T5P and one end of the storage capacitor Cst. The second electrode of the first light-emitting control transistor T5P is electrically connected to the first electrode of the driving transistor T1P and the first electrode of the writing transistor T2P. The second electrode of the driving transistor T1P is electrically connected to the first electrode of the compensation transistor T3P and the first electrode of the second light-emitting control transistor T6P. The second electrode of the second light-emitting control transistor T6P is electrically connected to the first electrode of the second initialization transistor T7P and the anode of the light-emitting device D1. The cathode of the light-emitting device D1 is electrically connected to the second power line.

The light-emitting control line is electrically connected to the gate of the first light-emitting control transistor T5P and the gate of the second light-emitting control transistor T6P.

The second electrode of the writing transistor T2P is electrically connected to the data line. The gate of the writing transistor T2P is electrically connected to one end of the bootstrap capacitor CbOst and receives the Nth negative pulse gate driving signal Pout [N]. The second electrode of the second initialization transistor T7P is electrically connected to the second initialization line. The gate of the second initialization transistor T7P receives the gate driving signal Pscan2.

The second electrode of the compensation transistor T3P is electrically connected to the driving transistor T1P. The gate of the compensation transistor T3P receives the Nth positive pulse gate driving signal Nout [N].

The gate of the driving transistor T1P is electrically connected to the other end of the storage capacitor Cst, the other end of the bootstrap capacitor CbOst, and the first electrode of the first initialization transistor T4P.

The second electrode of the first initialization transistor T4P is electrically connected to the first initialization line, and the gate of the first initialization transistor T4P receives the (N−1)th positive pulse gate driving signal Nout [N−1].

The first electrode of the third initialization transistor T8P is electrically connected to the first electrode of the driving transistor T1P. The second electrode of the third initialization transistor T8P is electrically connected to the third initialization line. The gate of the third initialization transistor T8P shares the gate driving signal Pscan2 with the gate of the second initialization transistor T7P.

The second initialization line can also be replaced with the first initialization line, which reduces the one trace required for the pixel circuit and helps increase the density of the pixel circuit in the display panel.

In the present disclosure, the first electrode may be one of the source and the drain, and the second electrode may be the other of the source and the drain. For example, when the first electrode is the source, the second electrode is the drain. Alternatively, when the first electrode is the drain, the second electrode is the source.

The first power line is used to transmit the positive power signal VDD, and the second power line is used to transmit the negative power signal VSS. The voltage level of the positive power signal VDD is higher than the voltage level of the negative power signal VSS. The data line is used to transmit the data signal Data. The light-emitting control line is used to transmit the light-emitting control signal EM. The first initialization line is used to transmit the first initialization signal Vi1. The second initialization line is used to transmit the second initialization signal Vi2. The third initialization line is used to transmit the third initialization signal Vi3. The first gate driving line is used to transmit the Nth negative pulse gate driving signal Pout[N]. The second gate driving line connected to the shift registers of a different stage is used to transmit the (N−1)th positive gate driving signal Nout [N−1] and the Nth positive pulse gate driving signal Nout[N].

From the above, it can be seen that in the gate driving circuit shown in the patent application No. 202310191137.9, the Nth negative pulse gate driving signal Pout [N] has a negative pulse, which is generated by using the second pulse of the reset signal RST to filter out the first pulse of the starting control signal STV or the (N−Y)th positive pulse gating driving signal Nout [N−Y]. Therefore, the width of the two positive pulses of the starting control signal STV or the (N−Y)th positive gate driving signal Nout [N−Y] must be equal.

In the pixel circuit shown in FIG. 1, in order to synchronize the conduction of the compensation transistor T3P with the first initialization transistor T4P, the pulse of the (N−1)th positive pulse gate driving signal Nout [N−1] needs to partially overlap with the pulse of the Nth stage positive pulse gate driving signal Nout [N]. This is the reason why the first initialization transistor T4P in the pixel circuit shown in FIG. 1 needs to receive the (N−1)th positive pulse gate driving signal Nout [N−1].

In order to transmit the third initialization signal Vi3 to the node Q through the node A and the node B in turn to reset the voltage levels of the node A, the node B, and the node Q, the third initialization transistor T8P and the compensation transistor T3P need to be synchronously turned on. This requires the pulse of the gate driving signal Pscan2 to partially overlap with the pulse of the Nth positive pulse gate driving signal Nout[N].

In order for the pixel circuit shown in FIG. 1 to continue to use the gate driving signal Pscan2, having the pulse width 1H, it is necessary to adjust the driving timing of the pixel circuit shown in FIG. 2. Correspondingly, the gate driving circuit shown in FIG. 1 needs to be improved.

In this context, in order to alleviate the technical problem that the pulse of the gate driving signal is difficult to apply in terms of time and width, a gate driving circuit is disclosed. Please refer to FIGS. 3-30. As shown in FIGS. 3-20, the gate driving circuit comprises a plurality of shift registers. Each of the shift registers includes at least one of a cascade signal selection module 10, a pull-up control module 20, a first filter module 30, a second filter module 80, and a first output module 46.

The cascade signal selection module 10 is electrically connected between the first node O/O[N] and the starting control line and the (N−Y)th stage positive pulse gate driving line Nout[N−Y], where Y is an integer greater than or equal to 2.

The pull-up control module 20 controls the voltage level of the second node K according to the voltage levels of the first node O/O[N] and the first clock signal.

The first filter module 30 is electrically connected between the intermediate node and one of the second node K and the third node Q. The control end of the first filter module 30 is electrically connected to the (N−X)th positive pulse gate driving line, where X is an integer greater than or equal to 2.

The second filter module 80 is electrically connected between the intermediate node and another one of the second node K and the third node Q. The control end of the second filter module 80 is electrically connected to the (N−2)th positive pulse gate driving line.

The first output module 46 is electrically connected to the third node Q, the fourth node P, and the Nth negative pulse gate driving line.

In this embodiment, the gate driving circuit utilizes the first filter module 30 filter out the front part of the second pulse that appears later in a frame at the second node K and utilizes the second filter module 80 filter out the latter part of the first pulse that appears first in a frame at the second node K and the latter part of the second pulse that appears later in a frame. In this way, the front part of the fixed width of the first pulse may be retained, and then the first output module 46 is controlled to output the gate driving signal of the fixed width pulse at the corresponding time. With this improvement, the gate driving circuit could be used to meet the driving requirements of the backend.

In one embodiment, the shift register further comprises a first inverting module 50 and a second output module 70. The first inverting module 50 is electrically connected between the second node K and the fourth node P. The second output module 70 is electrically connected to the second node K, the Nth positive pulse gate driving line.

With the improvement of FIG. 3 and FIG. 20, because the first filter module 30 can filter out the front part of the second pulse that appears later in a frame at the second node K and the second filter module 80 can filter out the latter part of the first pulse that appears first in a frame at the second node K and the latter part of the second pulse that appears later, the front part of the fixed width of the first pulse can be retained, and then the first output module 46 is controlled to output the gate driving signal having the fixed width pulse at the corresponding time. The pulse width of the Nth positive pulse gating driving signal Nout[N] provided by the second output module 70 does not affect the pulse width of the Nth negative pulse gate driving signal Pout [N]. Therefore, two pulse widths of the Nth positive pulse gate driving signal Nout [N] in a frame can be modulated to a width greater than 2H. Furthermore, the two pulse widths could be separately modulated without being equal. This supports improvements in the driving timing of the pixel circuit.

In one embodiment, as shown in FIGS. 3-20, the first filter module 30 comprises a first filter transistor T11 and a first capacitor C2. One of the source and the drain of the first filter transistor T11 is electrically connected to the second node K, and the other of the source and the drain of the first filter transistor T11 is electrically connected to the intermediate node. The gate of the first filter transistor T11 is electrically connected to the (N–X)th positive pulse gate driving line. One end of the first capacitor C2 is electrically connected to the gate of the first filter transistor T11, and the other end of the first capacitor C2 is electrically connected to the other of the source and the drain of the first filter transistor T11.

Figure 30:
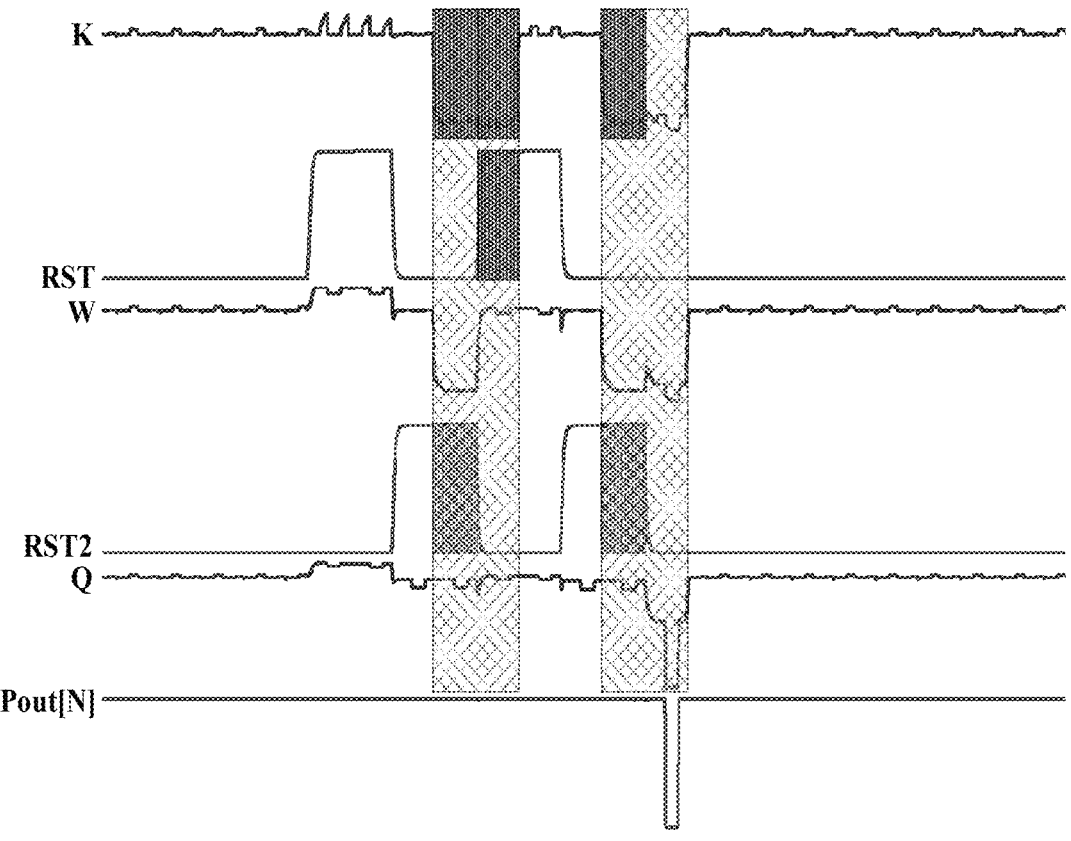
FIG. 30 is a timing diagram of the Nth level negative pulse gate driving signal according to an embodiment of the present disclosure.

As shown in FIG. 30, the first filter module 30 is used to filter out the front part of the second pulse that appears later in a frame at the second node.

Figure 3:
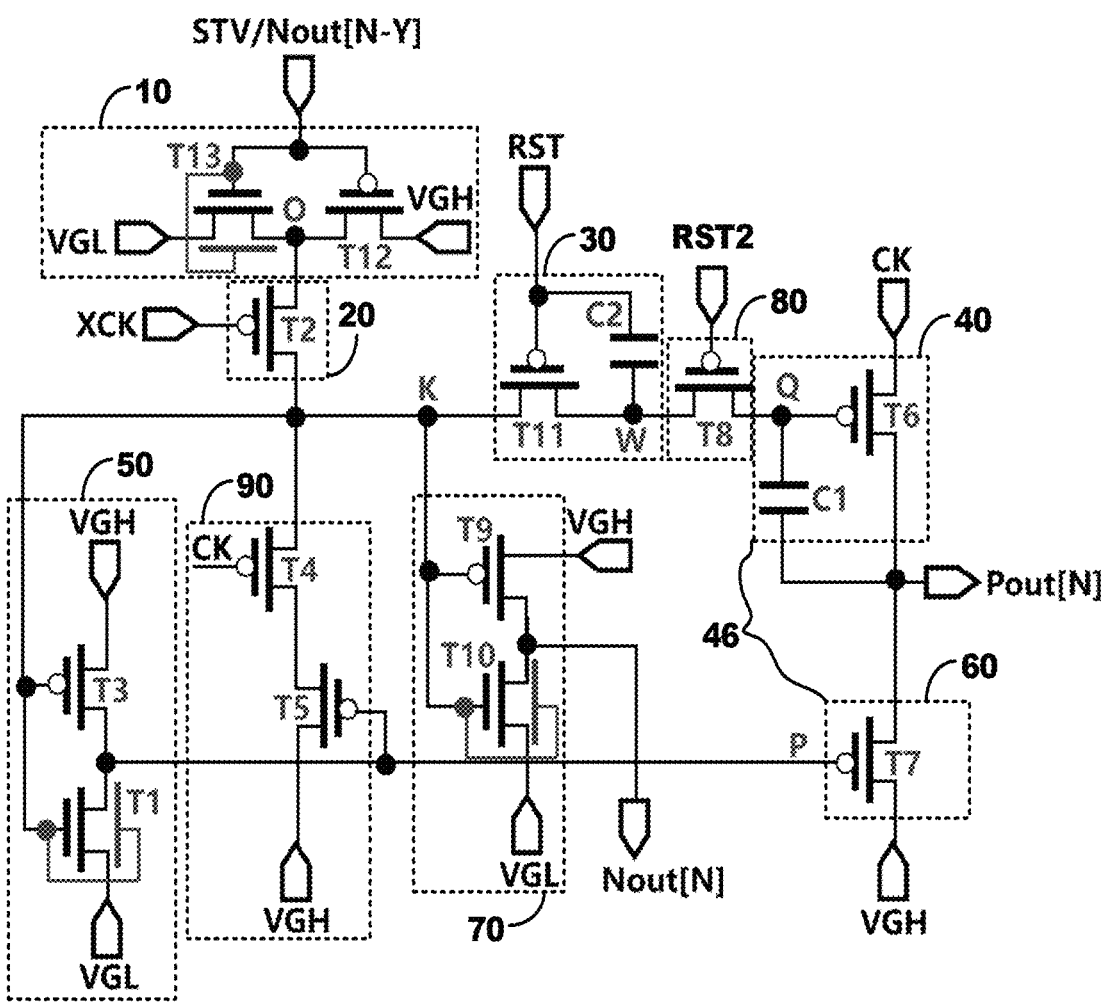
FIG. 3 is a diagram of a first structure of a conventional gate driving circuit.
Figure 20:
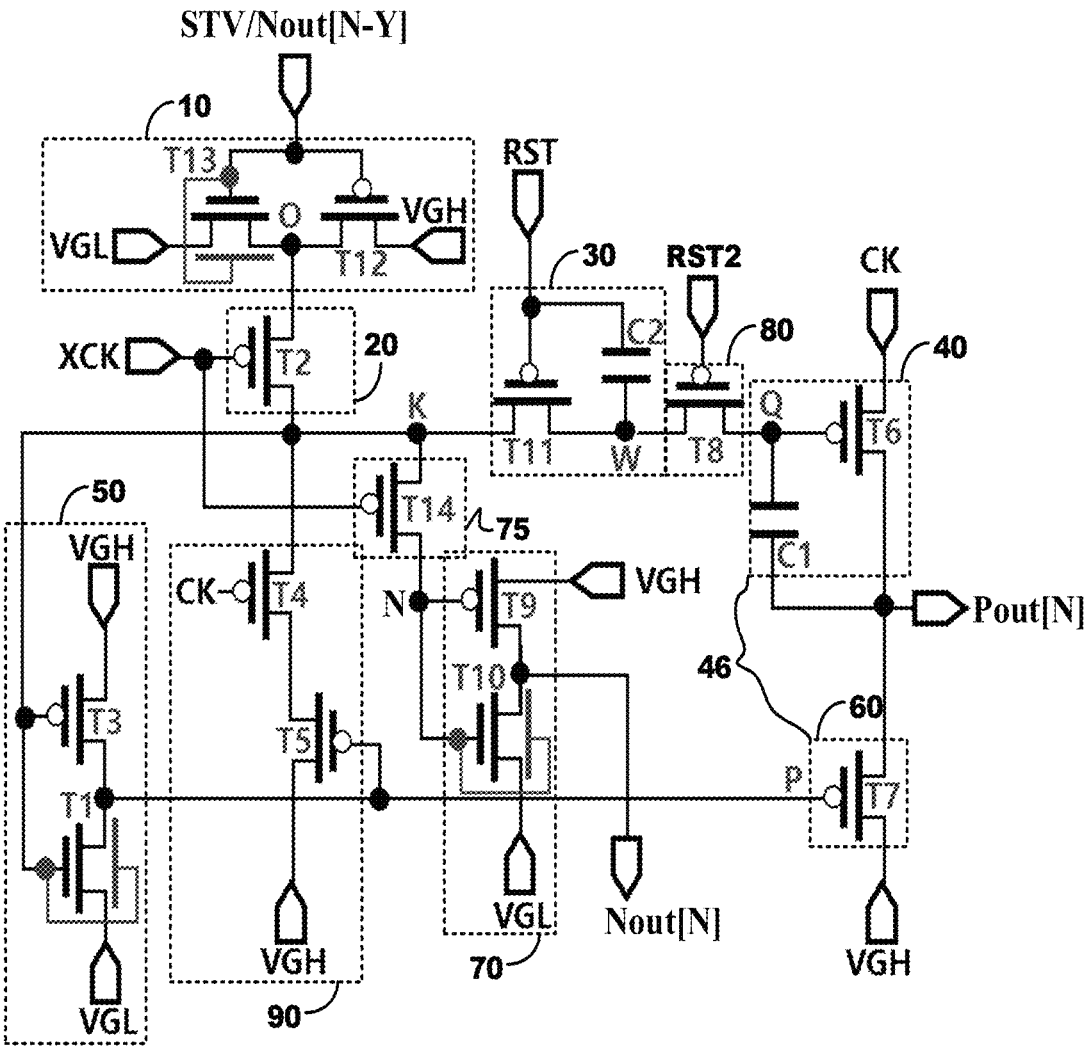
FIG. 20 is a diagram of a second structure of a conventional gate driving circuit.

In one embodiment, as shown in FIGS. 3 and 20, the second filter module 80 comprises a second filter transistor T8. One of the source and the drain of the second filter transistor T8 is electrically connected to the intermediate node, and the other of the source and the drain of the second filter transistor T8 is electrically connected to the third node Q. The gate of the first filter transistor T11 is electrically connected to the (N–2)th positive pulse gate driving line.

As shown in FIG. 30, the second filter block 80 is used to filter out the latter part of the first pulse that appears first in a frame and the latter part of the second pulse that appears later in a frame at the second node K.

It can be seen that the first filter module 30 and the second filter module 80 are used to filter out the second pulse and retain the front part of the fixed width of the first pulse.

In one embodiment, as shown in FIG. 20, the shift register further comprises an isolation module 75. The isolation module 75 is connected in series between the input of the second node K and the input end of the second output module 70. The control end of the isolation module 75 receives a first clock signal.

The isolation module 75 is used to reduce the coupling of the pulse amplitude of the Nth negative pulse gate driving signal Pout [N] to the pulse amplitude of the Nth positive pulse gate driving signal Nout [N], thereby stabilizing the high voltage level of the Nth positive pulse gate driving signal Nout [N].

In one embodiment, as shown in FIG. 20, the isolation module 75 comprises a sixth transistor T14. One of the source and the drain of the sixth transistor T14 is electrically connected to the second node K and the other of the source and the drain of the sixth transistor T14 is electrically connected to the input end of the second output module 70. The gate of the sixth transistor T14 receives the first clock signal. The sixth transistor T14 is a P-type thin-film transistor (TFT).

The sixth transistor T14 can reduce the coupling of the pulse amplitude of the Nth negative pulse gate driving signal Pout[N] to the pulse amplitude of the Nth positive pulse gate driving signal Nout[N], thereby stabilizing the high voltage level of the Nth positive pulse gate driving signal Nout[N].

In other embodiments, the isolation module 75 may further include a passive component connected between the gate of the sixth transistor T14 and the node N.

The input end of the cascade signal selection module 10 is electrically connected to the starting control line or the (N–Y)th positive pulse gate driving line. Here, N is an integer greater than or equal to 1, and Y is an integer greater than or equal to 1.

The input end of the pull-up control module 20 is electrically connected to the output end of the cascade signal selection module 10, and the control end of the pull-up control module 20 is electrically connected to the first clock line.

The input end of the first filter module 30 is electrically connected to the output end of the pull-up control module 20, and the control end of the first filter module 30 is electrically connected to the reset line.

The control end of the pull-up module 40 is electrically connected to the output end of the first filter module 30. The input end of the pull-up module 40 is electrically connected to the second clock line, and the output end of the pull-up module 40 is electrically connected with the Nth negative pulse gate driving line. The input of the first inverting module 50 is electrically connected to the output end of the pull-up control module 20.

The control end of the pull-down module 60 is electrically connected to the output end of the first inverting module 50, the input end of the pull-down module 60 is electrically connected to the high voltage line, and the output end of the pull-down module 60 is electrically connected with the Nth negative pulse gate driving line.

In one embodiment, the first output module 46 comprises a pull-up module 40 and a pull-down module 60.

The first line can be the starting control line or the (N–Y)th positive pulse gate driving line. When (N–Y) is less than or equal to 0, the first line is the starting control line. The Nth positive pulse gate driving line is the second gate control line for transmitting the Nth positive pulse gate driving signal Nout[N], which is the second gate driving signal. The Nth negative pulse gate driving line is the first gate control line for transmitting the Nth negative pulse gate driving signal Pout[N], which is the first gate driving signal.

In one embodiment, the first filter module 30 comprises a first filter transistor T11 and a first capacitor C2. One of the source and the drain of the first filter transistor T11 is electrically connected to the second node K, and the other of the source and the drain of the first filter transistor T11 is electrically connected to the third node Q. The gate of the first filter transistor T11 receives the reset signal RST. One end of the first capacitor C2 is electrically connected to the gate of the first filter transistor T11, and the other end of the first capacitor C2 is electrically connected to the other of the source and the drain of the first filter transistor T11.

The ratio of the channel width of the first filter transistor T11 to the channel length of the first filter transistor T11 is greater than or equal to 0.5 and less than or equal to 1.5.

In this embodiment, the output stability of the Nth negative pulse gate driving signal Pout[N] is ensured and the coupling pull-down phenomenon before the negative pulse comes could be alleviated.

In one embodiment, the pull-up module 40 comprises a pull-up transistor T6 and a second capacitor C1. The gate of the pull-up transistor T6 is electrically connected to one of the source and the drain of the first filter transistor T11. One of the source and the drain of the pull-up transistor T6 is electrically connected to the second clock line, and the other of the source and the drain of the pull-up transistor T6 is electrically connected to the Nth negative pulse gate driving line. One end of the second capacitor C1 is electrically connected to the gate of the pull-up transistor T6, and the other end of the second capacitor C1 is electrically connected to the other of the source and the drain of the pull-up transistor T6. The ratio of the capacitance of the first capacitor C2 to the capacitance of the second capacitor C1 is greater than or equal to 0.5.

In this embodiment, the ratio of the capacitance of the first capacitor C2 to the capacitance of the second capacitor C1 is well designed to ensure the output stability of the Nth negative pulse gate driving signal Pout[N]. This alleviates the coupling pull-down phenomenon before the negative pulse comes.

The capacitance of the first capacitor C2 can be greater than or equal to 50 fF. The capacitance of the second capacitor C1 can be greater than or equal to 100 fF.

The ratio of the channel width of the pull-up transistor T6 to the channel length of the pull-up transistor T6 is greater than 30:1. This could further ensure the output stability of the Nth negative pulse gate driving signal Pout[N]. The pull-up transistor T6 can be a P-type TFT.

In one embodiment, the cascade signal selection module 10 comprises a transistor T13 and a transistor T12. One of the source and the drain of the transistor T13 is electrically connected to a low voltage line, and the other of the source and drain of transistor T13 is electrically connected to the input end of the pull-up control module 20. The first gate of transistor T13 is electrically connected to the starting control line or the (N–Y)th positive pulse gate driving line. In addition, the first gate of transistor T13 is electrically connected to the second gate of transistor T13. The transistor T13 is an N-type TFT. One of the source and the drain of the transistor T12 is electrically connected to the high voltage line and the other of the source and the drain of the transistor T12 is electrically connected to the other of the source and the drain of the transistor T13. The gate of transistor T12 is electrically connected to the first gate of transistor T13. The transistor T12 is a P-type TFT.

In this embodiment, the cascade signal selection module 10 objectively has an inverting effect. That is, the input signal and the output signal have opposite voltages at the same time. In addition, the cascade signal selection module 10 could make the Nth stage positive pulse gate driving signal Nout[N] as a cascade signal between the shift registers. Otherwise, the cascade transmission between the shift registers cannot be realized and this may cause the gate driving circuit to fail to provide the corresponding gate driving signal.

The ratio of the channel width of transistor T13 to the channel length of transistor T13 is greater than 2:1. The ratio of the channel width of transistor T12 to the channel length of transistor T12 ranges from 0.5:1~3:1.

The high voltage line is used to transmit the high voltage signal VGH, which can turn on the N-type TFT or turn off the P-type TFT. The low voltage line is used to transmit the low voltage signal VGL, which can turn on the P-type TFT or turn off the N-type TFT.

The pull-up control module 20 comprises a pull-up control transistor T2. One of the source and the drain of the pull-up control transistor T2 is electrically connected to the output end of the cascade signal selection module 10, and the other of the source and the drain of the pull-up control transistor T2 is electrically connected to the input end of the first filter module 30. The gate of the pull-up control transistor T2 is electrically connected to the first clock line.

The pull-up control transistor T2 can be a P-type TFT. The ratio of the channel width of the pull-up control transistor T2 to the channel length of the pull-up control transistor T2 ranges from 0.5:1~3:1.

The first inverting module 50 comprises a fourth transistor T3 and a fifth transistor T1. One of the source and the drain of the fourth transistor T3 is electrically connected to the high voltage line, and the other of the source and the drain of the fourth transistor T3 is electrically connected to the one of the source and the drain of the fifth transistor T1 and the control terminal of the pull-down module 60. The other of the source and the drain of the fifth transistor T1 is electrically connected to the low voltage line. The output end of the pull-up control module 20 is electrically connected to the gate of the fourth transistor T3. The first gate of the fifth transistor T1 and the second gate of the fifth transistor T1 are electrically connected.

The fourth transistor T3 is a P-type TFT. The fifth transistor T1 is a dual-gate N-type TFT. This can improve the dynamic performances of the fourth transistor T3 and the fifth transistor T1 and thus improve the dynamic performance of the first inverting module 50.

The ratio of the channel width of the fourth transistor T3 to the channel length of the fourth transistor T3 ranges from 0.5:1~3:1. The ratio of the channel width of the fifth transistor T1 to the channel length of the fifth transistor T1 is greater than or equal to 2:1.

The pull-down module 60 comprises a pull-down transistor T7. One of the source and the drain of the pull-down transistor T7 is electrically connected to the high voltage line, and the other of the source and the drain of the pull-down transistor T7 is electrically connected with the Nth negative pulse gate driving line. The gate of the pull-down transistor T7 is electrically connected to the output end of the first inverting module 50, which is the fourth node P.

The pull-down transistor T7 can be a P-type TFT. In conjunction with the pull-down module 60 and the pull-up module 40, the required Nth negative pulse gate driving signal Pout [N] can be generated.

The ratio of the channel width of the pull-down transistor T7 to the channel length of the pull-down transistor T7 is greater than or equal to 30:1.

The second output module 70 comprises a transistor T9 and a transistor T10. One of the source and the drain of the transistor T9 is electrically connected to the high voltage line, and the other of the source and the drain of the transistor T9 is electrically connected to one of the source and the drain of the transistor T10 and the Nth positive pulse scan line. The other of the source and the drain of the transistor T10 is electrically connected with the low voltage line. The output end of the pull-up control module 20 is electrically connected to the gate of the transistor T9, the first gate of the transistor T10 and the second gate of the transistor T10.

The transistor T9 is a P-type TFT. The transistor T10 is a dual-gate N-type TFT. This can improve the dynamic performance of the transistor T9 and the transistor T10 and thus improve the dynamic performance of the second output module 70.

The ratio of the channel width of the first transistor T9 to the channel length of the first transistor T9 is greater than or equal to 30:1. The ratio of the channel width of the second transistor T10 to the channel length of the second transistor T10 is greater than or equal to 30:1.

The second filter module 80 comprises a second filter transistor T8. One of the source and the drain of the second filter transistor T8 is electrically connected to the output end of the first filter module 30, and the other of the source and the drain of the second filter transistor T8 is electrically connected to the control end of the pull-up module 40. The gate of the second filter transistor T8 receives the filter control signal RST2.

The second filter transistor T8 can be a P-type TFT or an N-type TFT.

The ratio of the channel width of the second filter transistor T8 to the channel length of the second filter transistor T8 can range from 0.5:1~3:1.

In one embodiment, the Nth shift register further comprises a feedback module 90. The feedback module 90 includes a transistor T4 and a transistor T5. One of the source and the drain of the transistor T4 is electrically connected to the output end of the pull-up control module 20. The gate of the transistor T4 is electrically connected to the second clock line. The other of the source and the drain of the transistor T4 is electrically connected to one of the source and the drain of the transistor T5. The other of the source and the drain of the transistor T5 is electrically connected to the high voltage line. The gate of the transistor T5 is electrically connected to the output end of the first inverting module 50.

The ratio of the channel width of the transistor T4 to the channel length of the transistor T4 ranges from 0.5:1~3:1. The ratio of the channel width of the transistor T5 to the channel length of the transistor T5 ranges from 0.5:1~3:1.

The feedback module 90 can maintain the second node K at a high voltage level according to the voltage level of the fourth node P and the voltage level of the second clock line. That is, in the case when the fourth node P is at a low voltage level and the second clock signal CK is at a low voltage level, the high voltage line can control the voltage level of the second node K to be the voltage level of the high voltage signal VGH.

The Nth positive gate driving line is used to transmit the Nth positive pulse gate driving signal Nout[N]. The Nth negative pulse gate driving line is used to transmit the Nth negative pulse gate driving signal Pout[N]. The first clock line is used to transmit the first clock signal XCK. The second clock line is used to transmit the second clock signal CK. The starting control line is used to transmit the starting control signal STV. The (N−Y)th positive pulse gate driving line is used to transmit the (N−Y)th positive pulse gate driving signal Nout [N−Y]. The (N−X)th positive pulse gate driving line is used to transmit the (N−X)th stage positive pulse gate driving signal Nout [N−X]. The reset line is used to transmit the reset signal RST.

Figure 4:
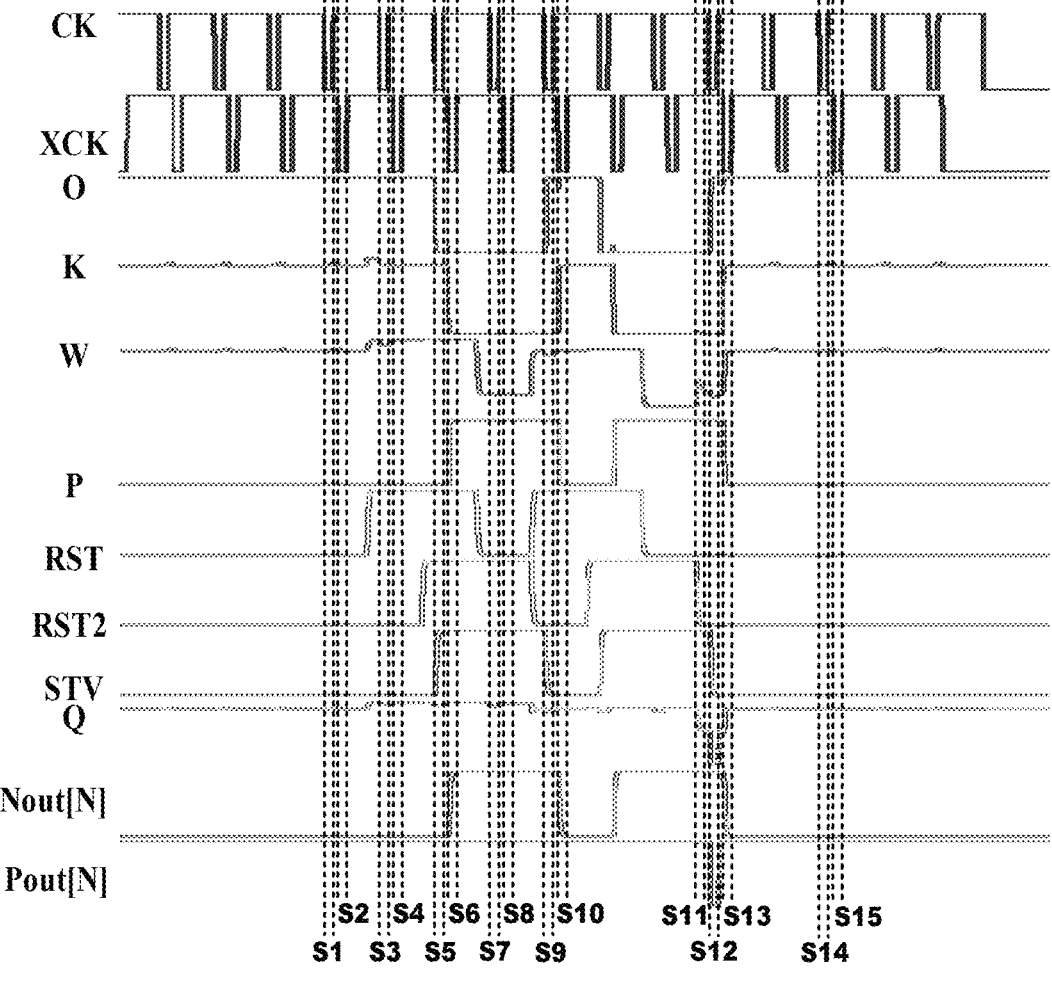
FIG. 4 is a timing diagram of the gate driving circuit shown in FIG. 3.
Figure 5:
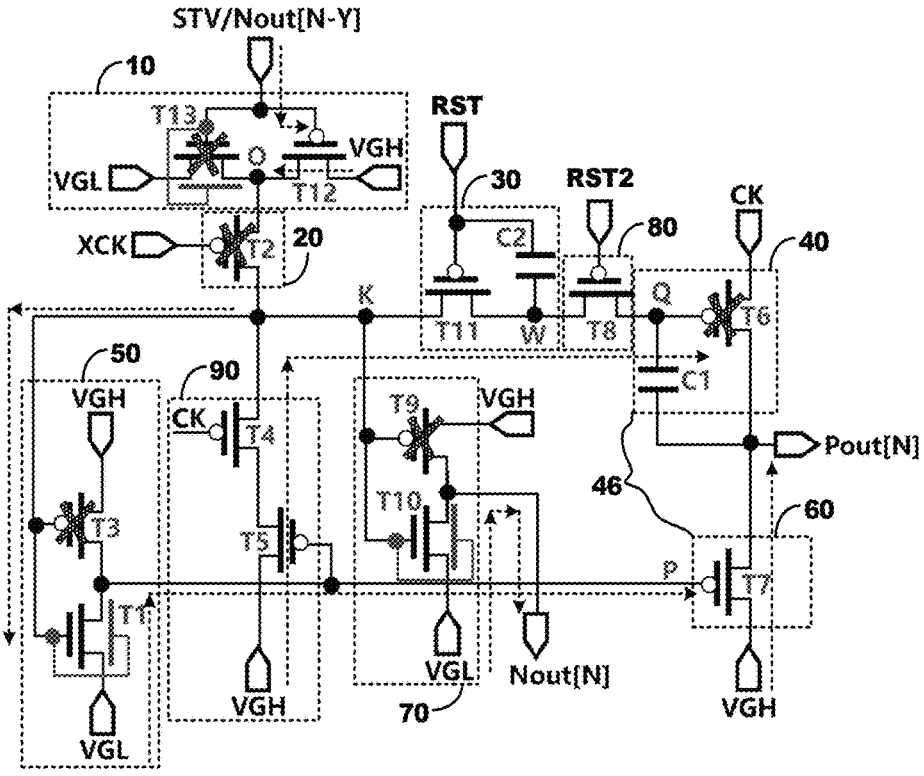
FIG. 5 illustrates the gate driving circuit shown in FIG. 3 at a first state shown in FIG. 4.

The operation of the shift register shown in FIG. 3 in a frame may include the following stages shown in FIG. 4:

The first stage S1: As shown in FIG. 4 and FIG. 5, the starting control signal STV, the reset signal RST, the second clock signal CK, and the (N−2)th positive pulse gate driving signal Nout [N−2] are all at a low voltage level. The first clock signal XCK is at a high voltage level. The first node O/O[N], the second node K, the intermediate node W and the third node Q are all at a high voltage level. The fourth node P is at a low voltage level. The Nth stage positive gate driving signal Nout [N] is at a low voltage level. The Nth negative pulse gate driving signal Pout[N] is at a high voltage level.

Figure 6:
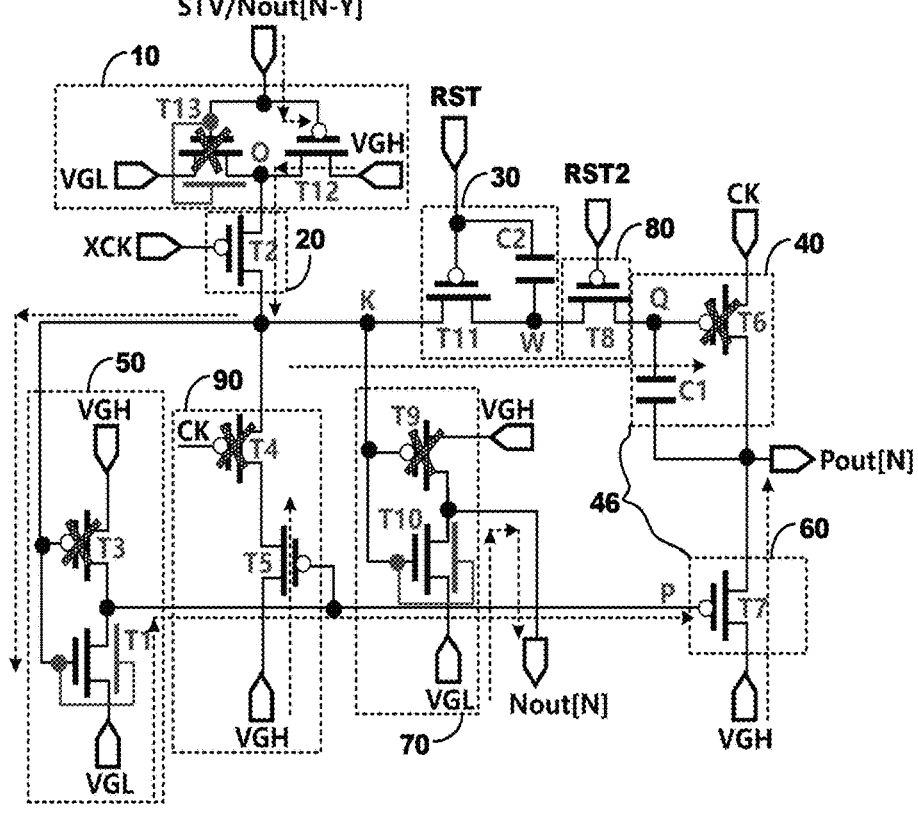
FIG. 6 illustrates the gate driving circuit shown in FIG. 3 at a second state shown in FIG. 4.

The second stage S2: As shown in FIG. 4 and FIG. 6, the starting control signal STV, the reset signal RST, the first clock signal XCK, and the (N−2)th positive pulse gate driving signal Nout [N−2] are all at a low voltage level. The second clock signal CK is at a high voltage level. The first node O/O[N], the second node K, the intermediate node W and the third node Q are all at a high voltage level. The fourth node P is at a low voltage level. The Nth positive pulse gate driving signal Nout[N] is at a low voltage level. The Nth negative pulse gate driving signal Pout[N] is at a high voltage level.

Figure 7:
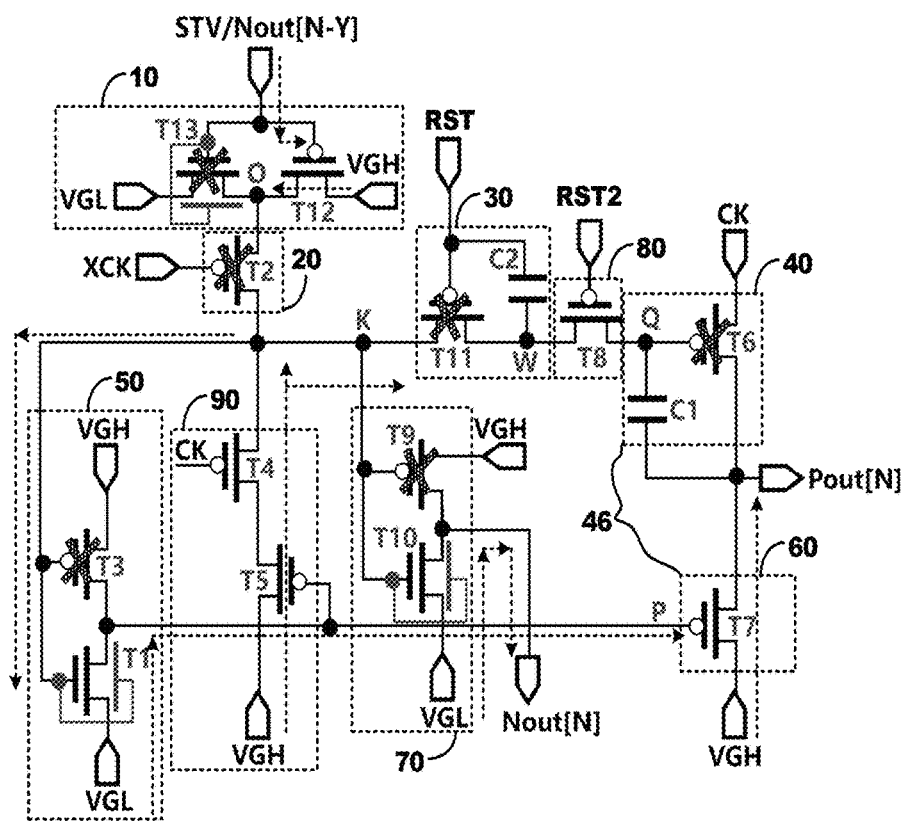
FIG. 7 illustrates the gate driving circuit shown in FIG. 3 at a third state shown in FIG. 4.

The third stage S3: As shown in FIG. 4 and FIG. 7, the starting control signal STV, the second clock signal CK, and the (N−2)th positive pulse gate driving signal Nout [N−2] are all at a low voltage level. The reset signal RST, the first clock signal XCK are at a high voltage level. The first node O/O[N], the second node K, the intermediate node W and the third node Q are all at a high voltage level. The fourth node P is at a low voltage level, and the Nth positive pulse gate driving signal Nout[N] is at a low voltage level. The Nth negative pulse gate driving signal Pout[N] is at a high voltage level.

Figure 8:
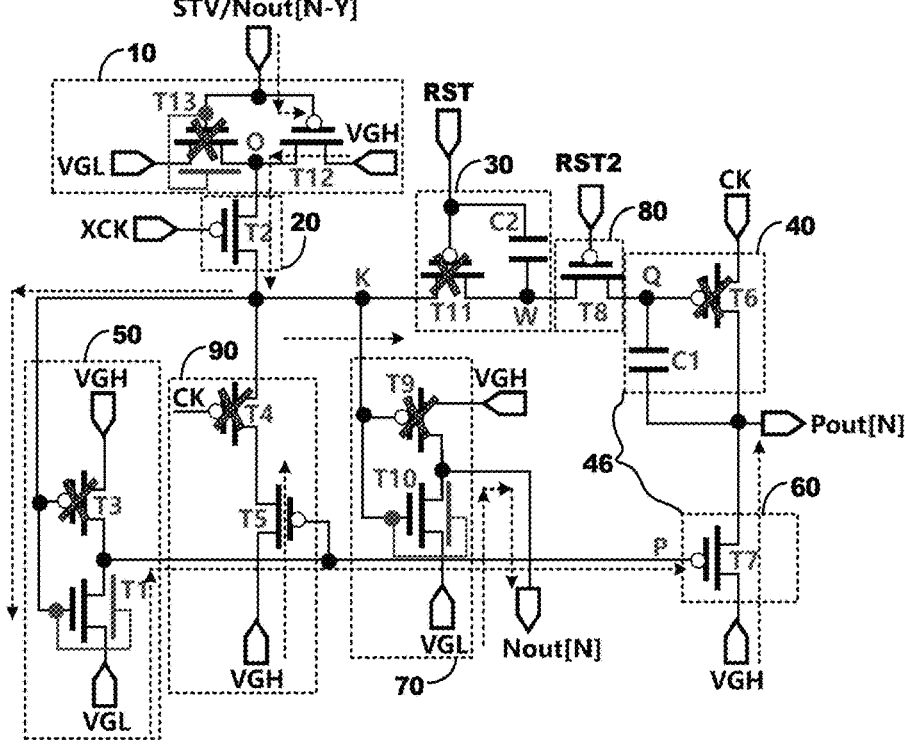
FIG. 8 illustrates the gate driving circuit shown in FIG. 3 at a fourth state shown in FIG. 4.

The fourth stage S4: As shown in FIG. 4 and FIG. 8, the starting control signal STV, the first clock signal XCK, and the (N−2)th positive pulse gate driving signal Nout [N−2] are all at a low voltage level. The reset signal RST, the second clock signal CK are at a high voltage level. The first node O/O[N], the second node K, the intermediate node W and the third node Q are all at a high voltage level. The fourth node P is at a low voltage level. The Nth positive pulse gate driving signal Nout[N] is at a low voltage level. The Nth negative pulse gate driving signal Pout[N] is at a high voltage level.

Figure 9:
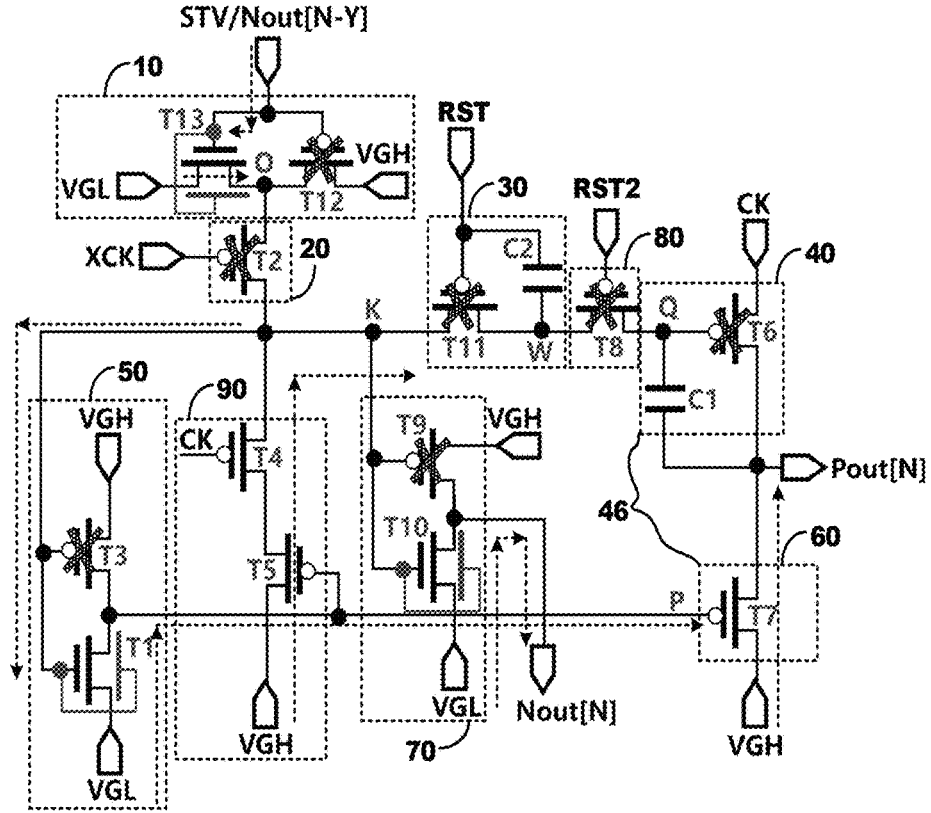
FIG. 9 illustrates the gate driving circuit shown in FIG. 3 at a fifth state shown in FIG. 4.

The fifth stage S5: As shown in FIG. 4 and FIG. 9, the second clock signal CK is at a low voltage level. The starting control signal STV, the reset signal RST, the first clock signal XCK, and the (N−2)th positive pulse gate driving signal Nout [N−2] are at a high voltage level. The second node K, the intermediate node W and the third node Q are all at a high voltage level. The first node O/O[N] and the fourth node P are at a low voltage level. The Nth positive pulse gate driving signal Nout[N] is at a low voltage level. The Nth negative pulse gate driving signal Pout[N] is at a high voltage level.

Figure 10:
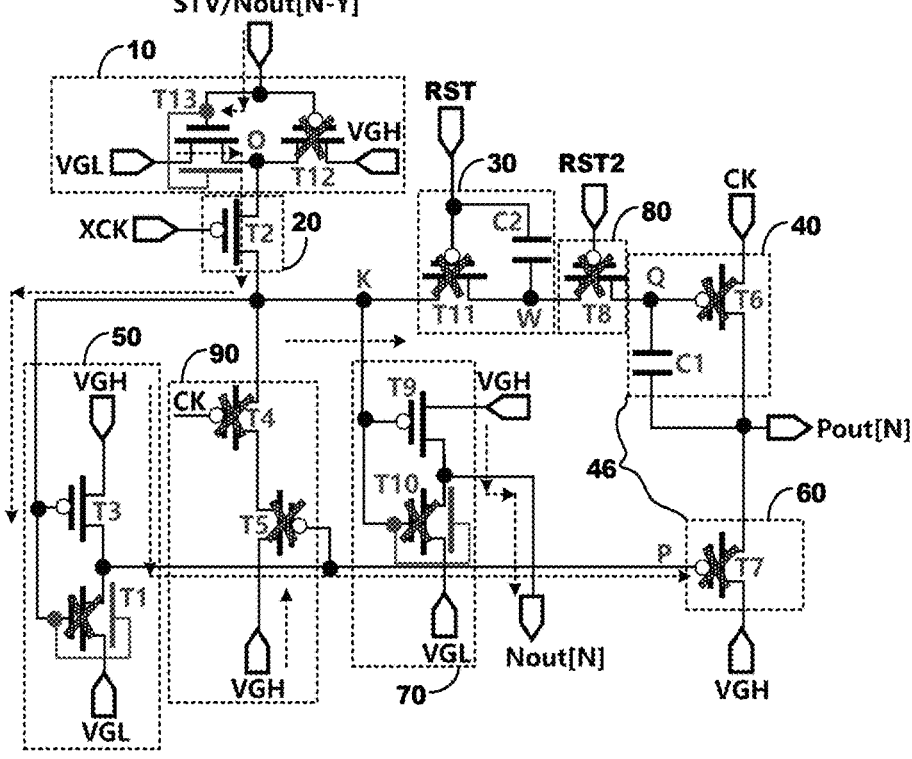
FIG. 10 illustrates the gate driving circuit shown in FIG. 3 at a sixth state shown in FIG. 4.

The sixth stage S6: As shown in FIG. 4 and FIG. 10, the first clock signal XCK is at a low voltage level. The starting control signal STV, the reset signal RST, the second clock signal CK, and the (N−2)th positive pulse gate driving signal Nout [N−2] are at a high voltage level. The intermediate node W, the fourth node P and the third node Q are all at a high voltage level. The second node K and the first node O/O[N] are at a low voltage level. The Nth positive pulse gate driving signal Nout [N] is at a high voltage level. The Nth negative pulse gate driving signal Pout[N] is at a high voltage level.

Figure 11:
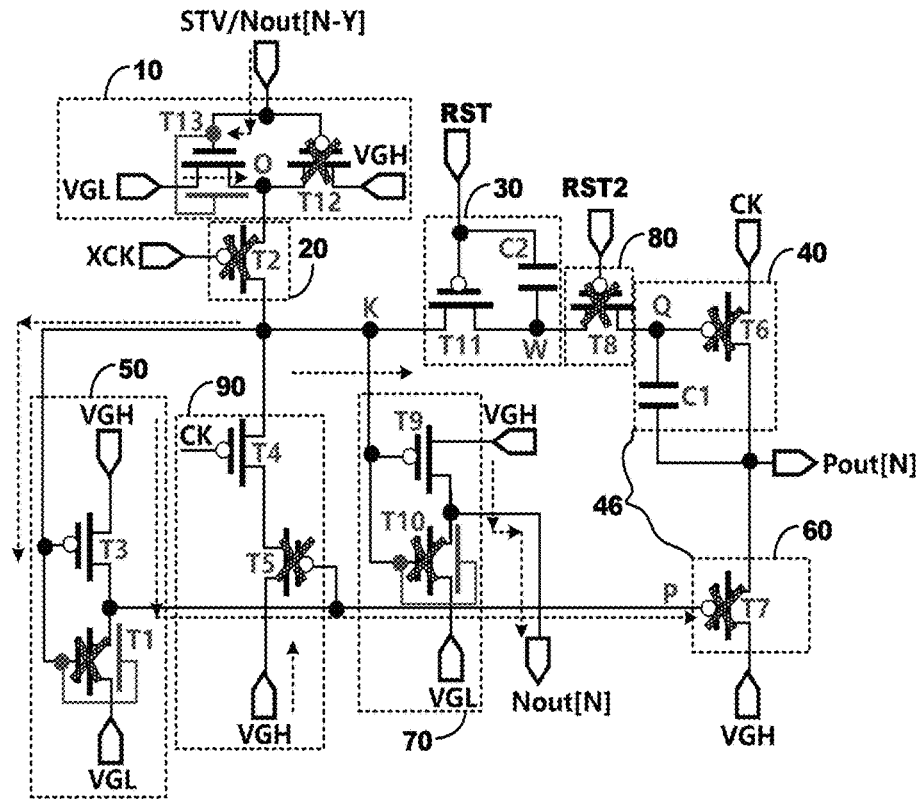
FIG. 11 illustrates the gate driving circuit shown in FIG. 3 at a seventh state shown in FIG. 4.

The seventh stage S7: As shown in FIG. 4 and FIG. 11, the reset signal RST and the second clock signal CK are at a low voltage level. The starting control signal STV, the first clock signal XCK, and the (N−2)th positive pulse gate driving signal Nout [N−2] are at a high voltage level. The fourth node P and the third node Q are at a high voltage level. The intermediate node W, the second node K, the first node O/O[N] are at a low voltage level. The Nth stage positive pulse gate driving signal Nout [N] is at a high voltage level. The Nth negative pulse gate driving signal Pout[N] is at a high voltage level.

Figure 12:
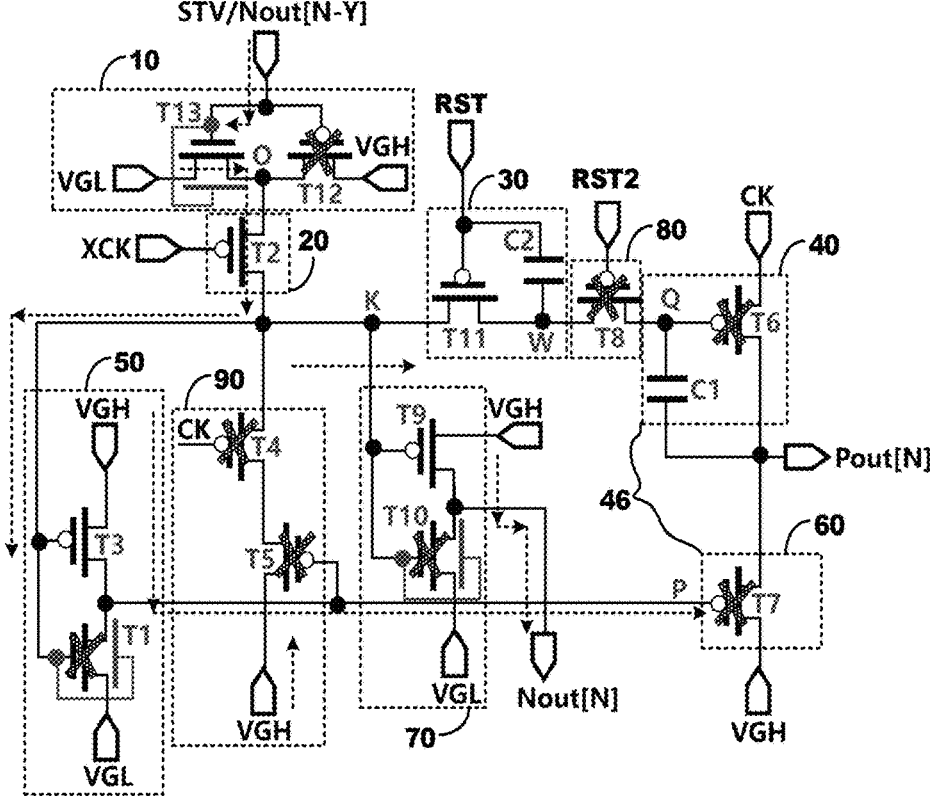
FIG. 12 illustrates the gate driving circuit shown in FIG. 3 at an eighth state shown in FIG. 4.

The eighth stage S8: As shown in FIG. 4 and FIG. 12, the reset signal RST and the second clock signal CK are at a low voltage level. The starting control signal STV, the first clock signal XCK, and the (N−2)th positive pulse gate driving signal Nout [N−2] are at a high voltage level. The fourth node P and the third node Q are at a high voltage level. The intermediate node W, the second node K, the first node O/O[N] are at a low voltage level. The Nth stage positive pulse gate driving signal Nout [N] is at a high voltage level. The Nth negative pulse gate driving signal Pout[N] is at a high voltage level.

Figure 13:
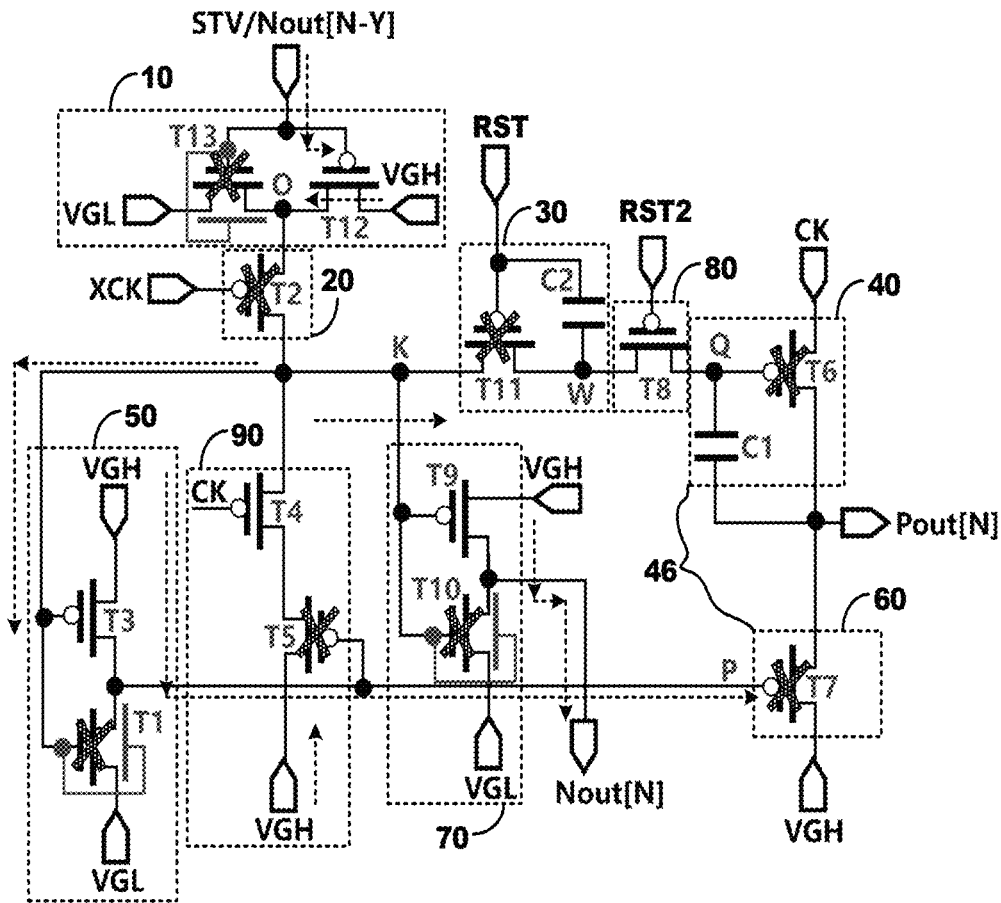
FIG. 13 illustrates the gate driving circuit shown in FIG. 3 at a ninth state shown in FIG. 4.

The ninth stage S9: As shown in FIG. 4 and FIG. 13, the second clock signal CK and the (N−2)th positive pulse gate driving signal Nout [N−2] are at a low voltage level. The reset signal RST, the starting control signal STV, and the first clock signal XCK are at a high voltage level. The intermediate node W, the first node O/O[N], the fourth node P and the third node Q are all at a high voltage level. The second node K is at a low voltage level. The Nth positive pulse gate driving signal Nout [N] is at a high voltage level. The Nth negative pulse gate driving signal Pout[N] is at a high voltage level.

Figure 14:
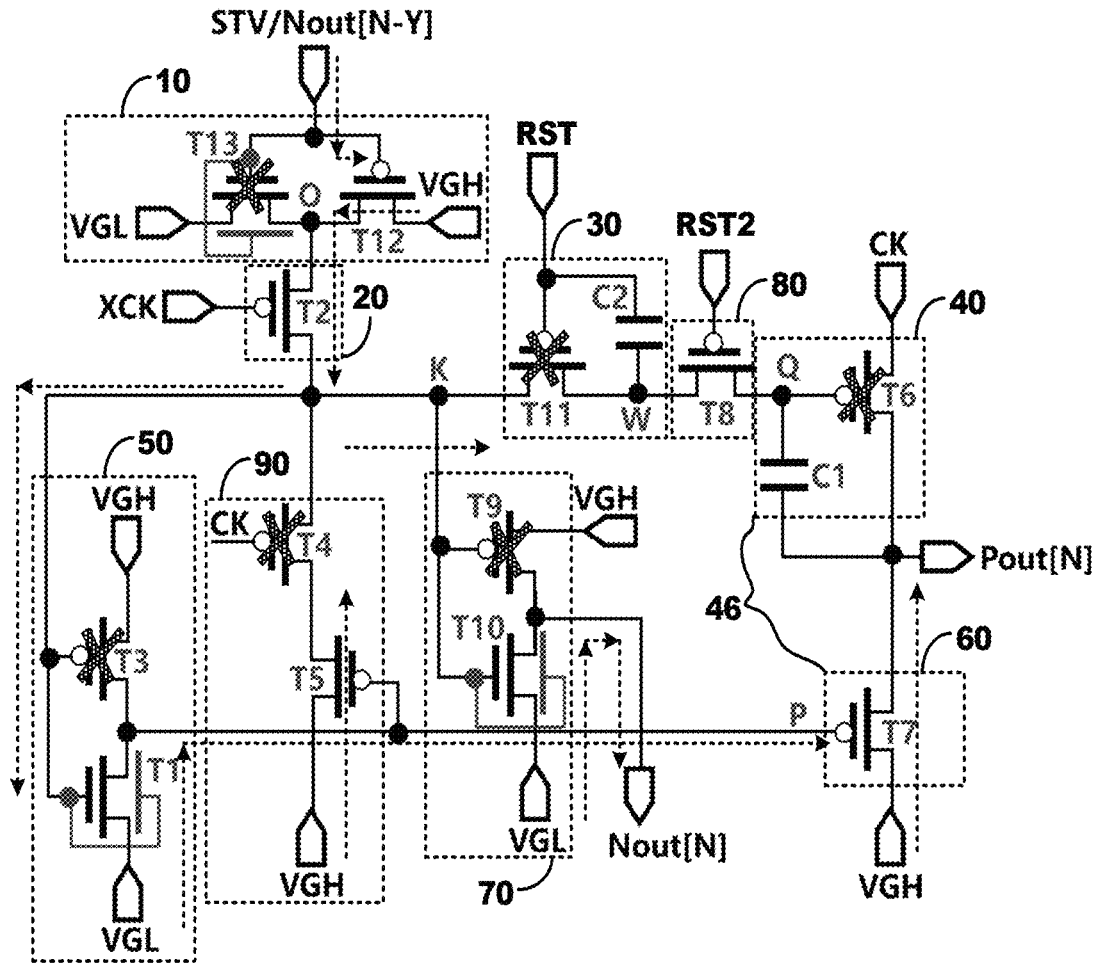
FIG. 14 illustrates the gate driving circuit shown in FIG. 3 at a tenth state shown in FIG. 4.

The tenth stage S10: As shown in FIG. 4 and FIG. 14, the starting control signal STV, the first clock signal XCK and the (N−2)th positive pulse gate driving signal Nout [N−2] are at a low voltage level. The reset signal RST and the second clock signal CK are at a high voltage level. The second node K, the intermediate node W, the first node O/O [N] and the third node Q are all at a high voltage level. The fourth node P is at a low voltage level. The Nth stage positive pulse gate driving signal Nout[N] is at a low voltage level. The Nth negative pulse gate driving signal Pout[N] is at a high voltage level.

Figure 15:
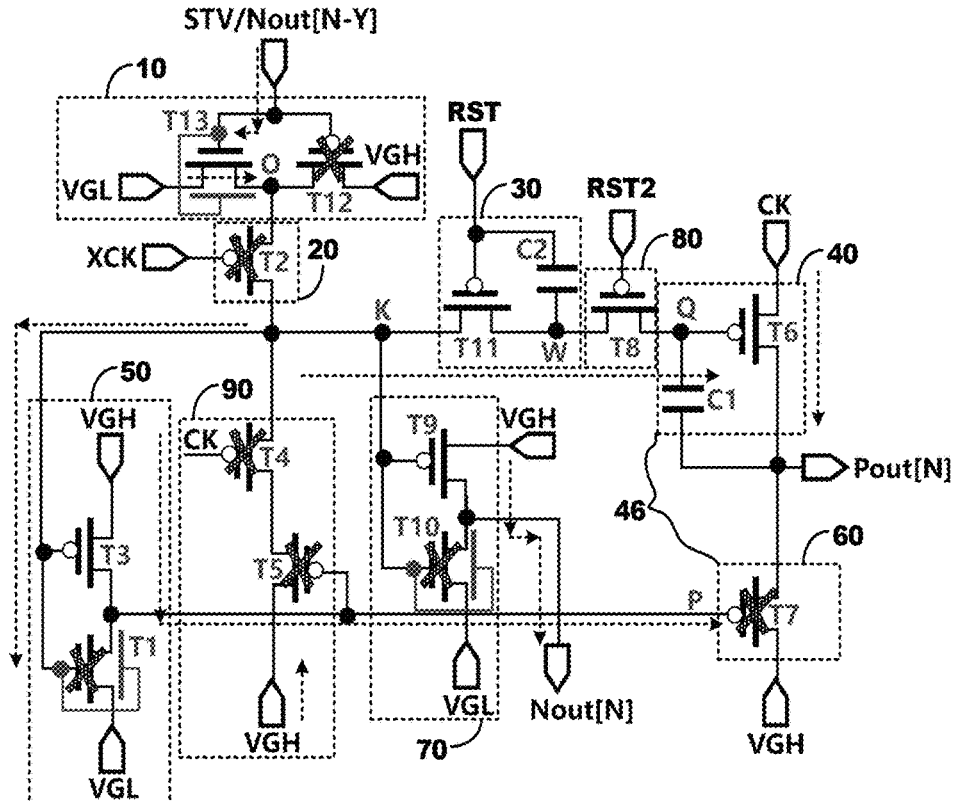
FIG. 15 illustrates the gate driving circuit shown in FIG. 3 at an eleventh state shown in FIG. 4.

The eleventh stage S11: As shown in FIG. 4 and FIG. 15, the reset signal RST and the (N−2)th positive pulse gate driving signal Nout [N−2] are at a low voltage level. The starting control signal STV, the first clock signal XCK and the second clock signal CK are at a high voltage level. The fourth node P and the third node Q are at a high voltage level. The second node K, the intermediate node W and the first node O/O [N] are at a low voltage level. The Nth positive pulse gate driving signal Nout [N] is at a high voltage level. The Nth negative pulse gate driving signal Pout[N] is at a high voltage level.

Figure 16:
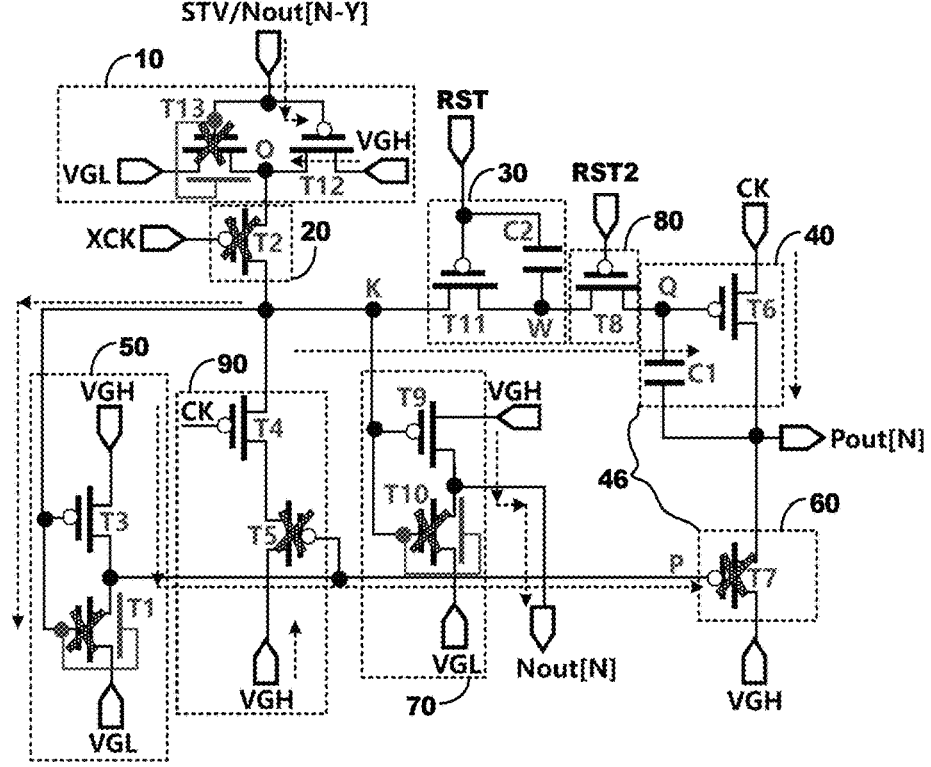
FIG. 16 illustrates the gate driving circuit shown in FIG. 3 at a twelfth state shown in FIG. 4.

The twelfth stage S12: As shown in FIG. 4 and FIG. 16, the second clock signal CK, the start control signal STV, the reset signal RST and the (N−2)th positive pulse gate driving signal Nout [N−2] are at a low voltage level. The first clock signal XCK is at a high voltage level. The fourth node P and the first node O/O [N] are at a high voltage level. The third node Q, the second node K, and the intermediate node W are at a low voltage level. The Nth positive pulse gate driving signal Nout [N] is at a high voltage level. The Nth negative pulse gate driving signal Pout[N] is at a low voltage level.

Figure 17:
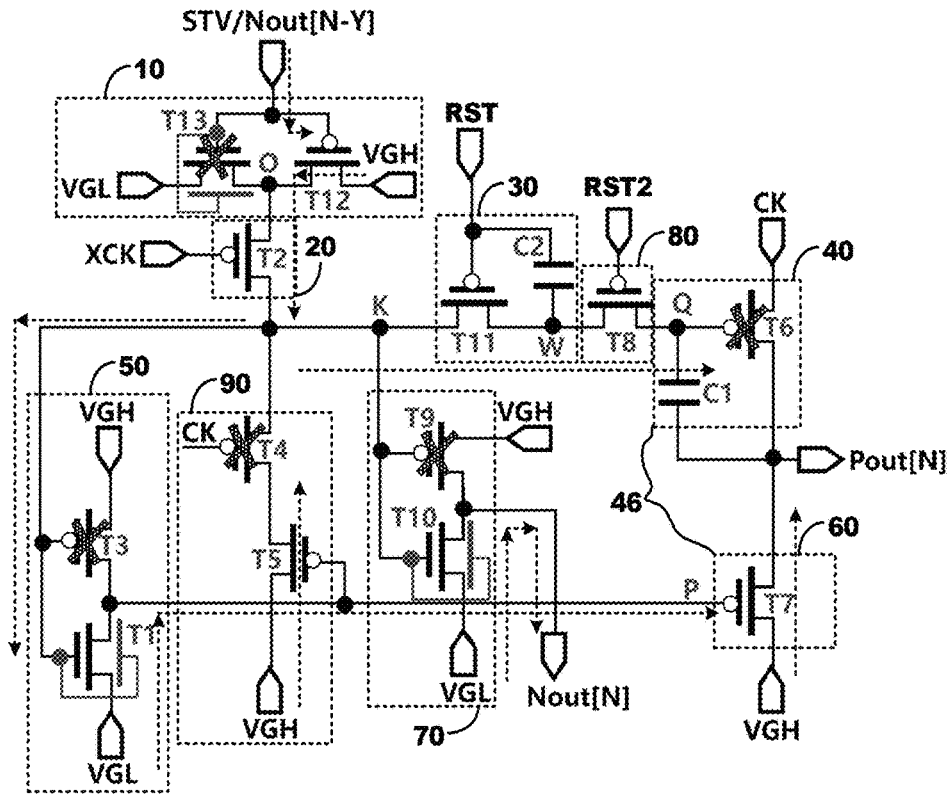
FIG. 17 illustrates the gate driving circuit shown in FIG. 3 at a thirteenth state shown in FIG. 4.

The thirteenth stage S13: As shown in FIG. 4 and FIG. 17, the first clock signal XCK, the starting control signal STV, the reset signal RST and the (N−2)th positive pulse gate driving signal Nout [N−2] are at a low voltage level. The second clock signal CK is at a high voltage level. The second node K, the intermediate node W, the third node Q and the first node O/O [N] are all at a high voltage level. The fourth node P is at a low voltage level. The Nth stage positive pulse gate driving signal Nout [N] is at a low voltage level. The Nth negative pulse gate driving signal Pout[N] is at a high voltage level.

Figure 18:
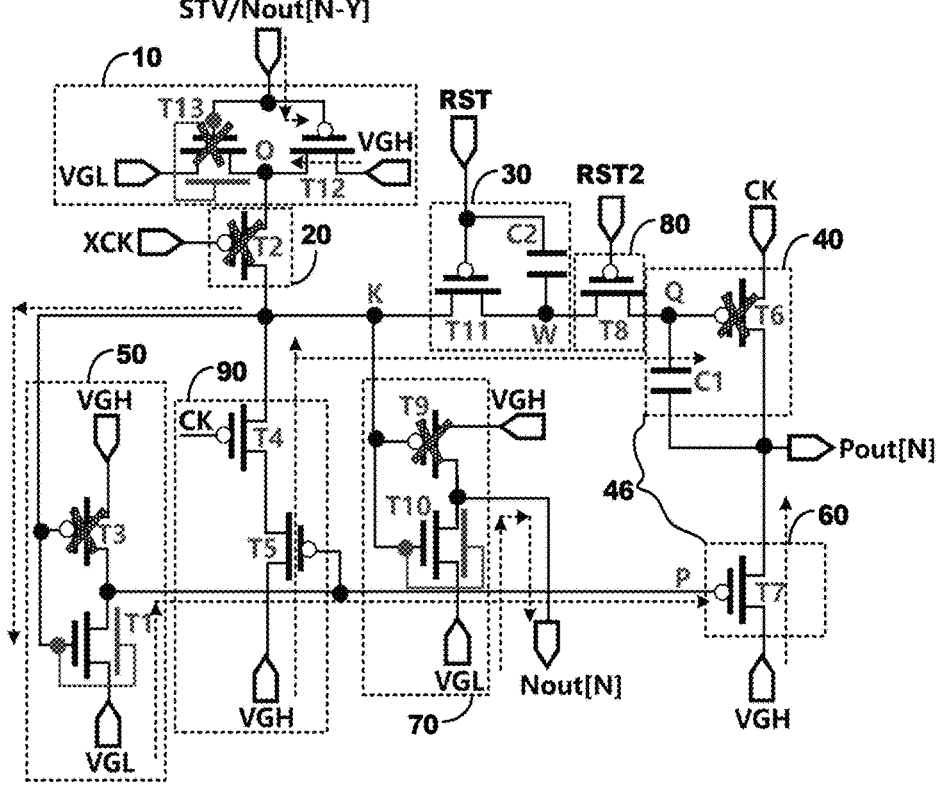
FIG. 18 illustrates the gate driving circuit shown in FIG. 3 at a fourteenth state shown in FIG. 4.

The fourteenth stage S14: As shown in FIG. 4 and FIG. 18, the second clock signal CK, the starting control signal STV, the reset signal RST and the (N−2)th positive pulse gate driving signal Nout [N−2] are at a low voltage level. The first clock signal XCK is at a high voltage level. The second node K, the intermediate node W, the third node Q and the first node O/O [N] are all at a high voltage level. The fourth node P is at a low voltage level. The Nth positive pulse gate driving signal Nout [N] is at a low voltage level. The Nth negative pulse gate driving signal Pout[N] is at a high voltage level.

Figure 19:
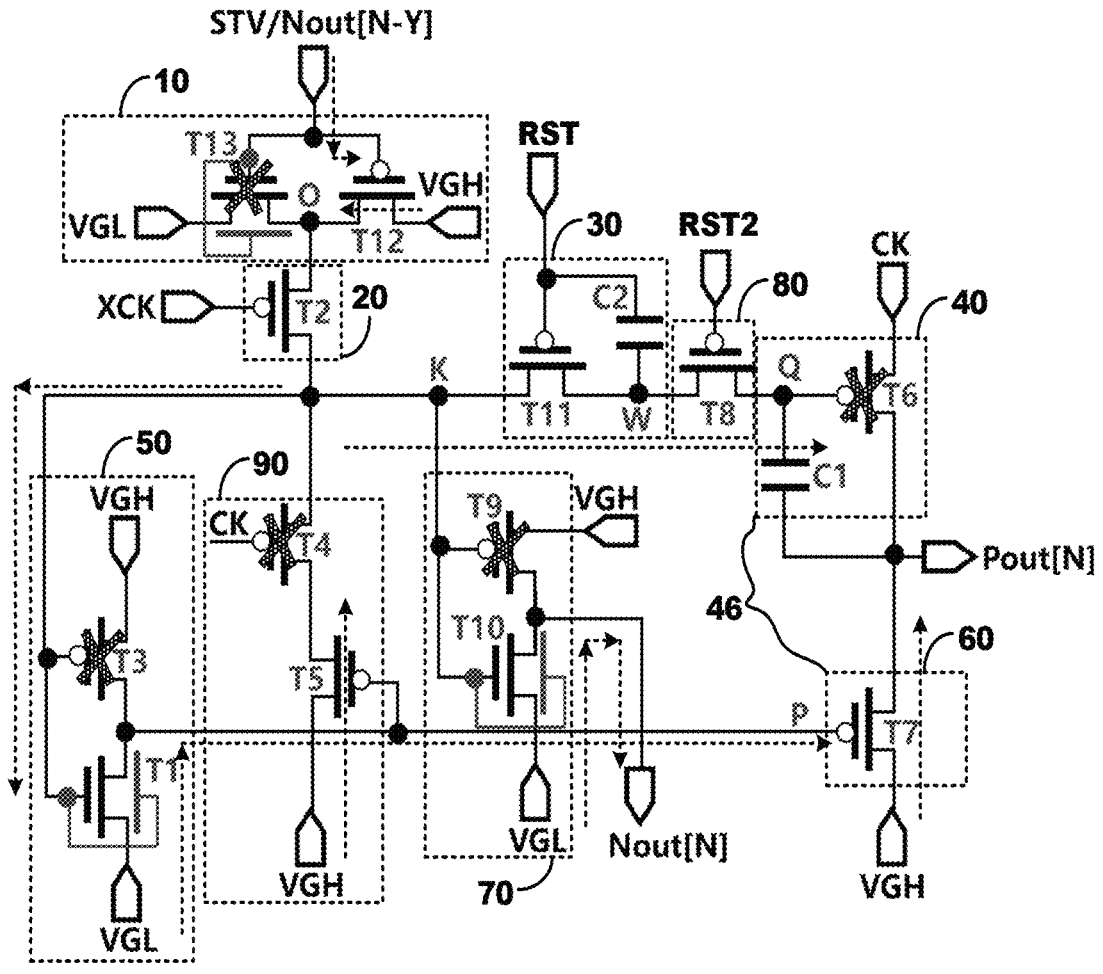
FIG. 19 illustrates the gate driving circuit shown in FIG. 3 at a fifteenth state shown in FIG. 4.

The fifteenth phase S15: As shown in FIG. 4 and FIG. 19, the first clock signal XCK, the starting control signal STV, the reset signal RST and the (N−2)th positive pulse gate driving signal Nout [N−2] are at a low voltage level. The second clock signal CK is at a high voltage level. The second node K, the intermediate node W, the third node Q and the first node O/O [N] are all at a high voltage level. The fourth node P is at a low voltage level. The Nth stage positive pulse gate driving signal Nout [N] is at a low voltage level. The Nth negative pulse gate driving signal Pout[N] is at a high voltage level.

The "cross" in FIGS. 5-19 indicates that the transistor covered by it is in the off state, and the transistor that is not covered by the "cross" is in the on state. The dotted arrows in FIGS. 5-19 indicate the direction of the current.

Figure 21:
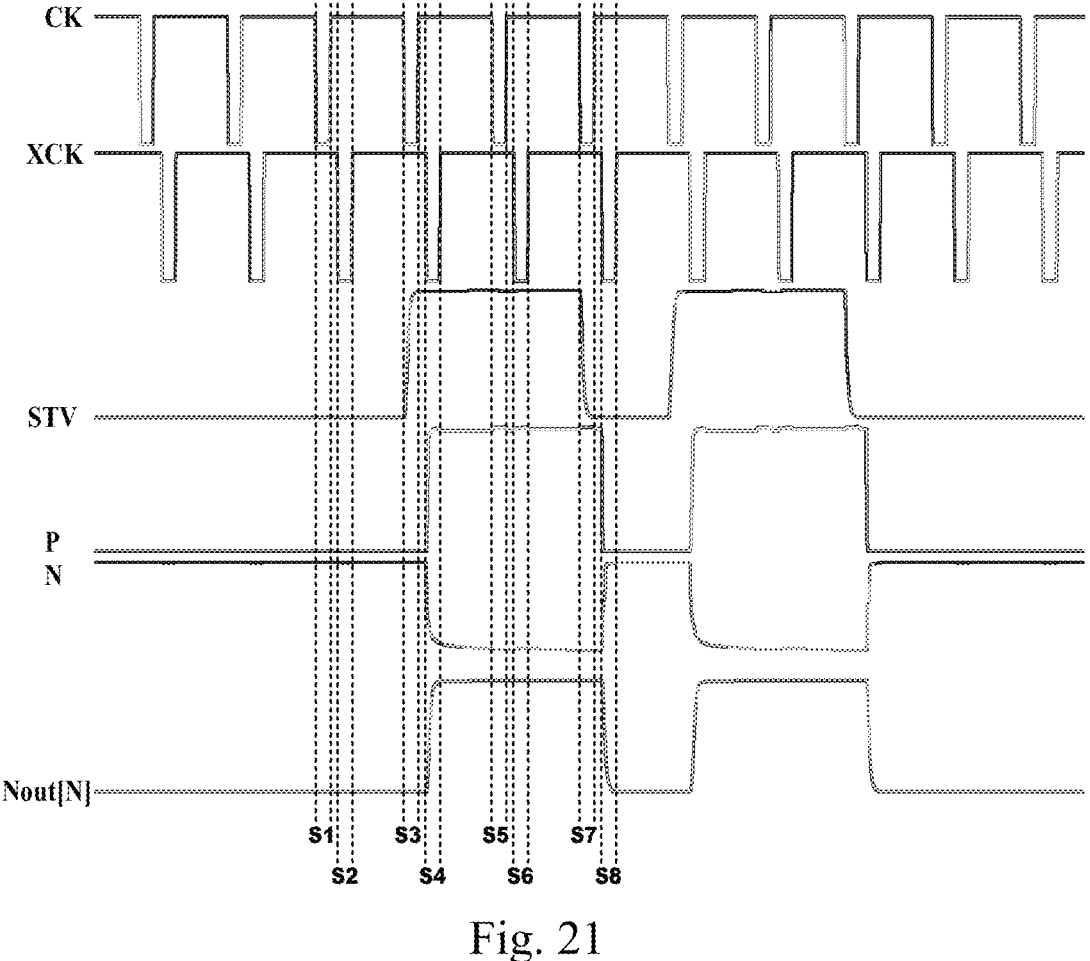
FIG. 21 is a timing diagram of the gate driving circuit shown in FIG. 20.
Figure 22:
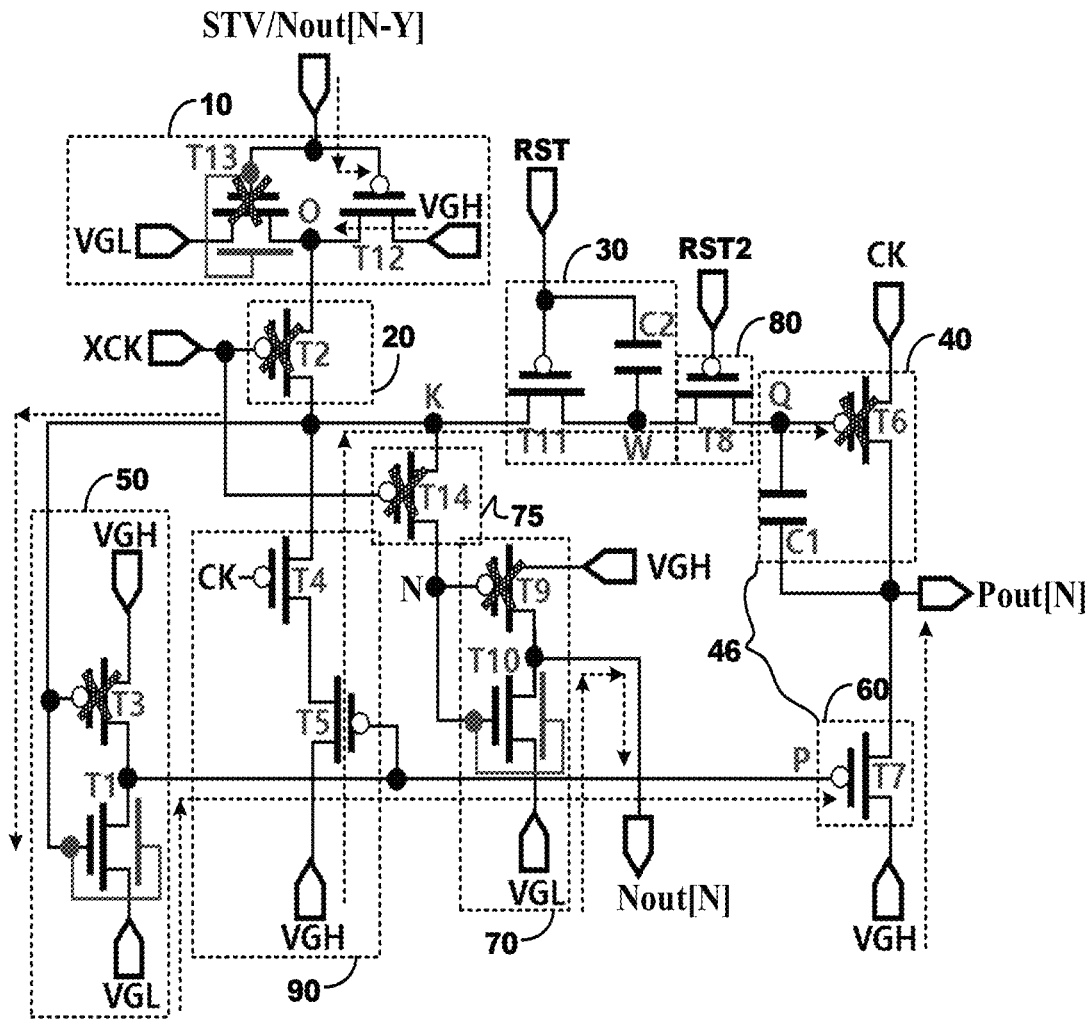
FIG. 22 illustrates the gate driving circuit shown in FIG. 20 at a first state shown in FIG. 21.

The operation of the shift register shown in FIG. 20 in a frame may include the following stages shown in FIG. 21:

The first stage S1: As shown in FIG. 21 and FIG. 22, the starting control signal STV and the second clock signal CK are both at a low voltage level. The first clock signal XCK is at a high voltage level. The node N is at a high voltage level. The fourth node P is at a low voltage level. The Nth positive pulse gate driving signal Nout [N] is at a low voltage level.

Figure 23:
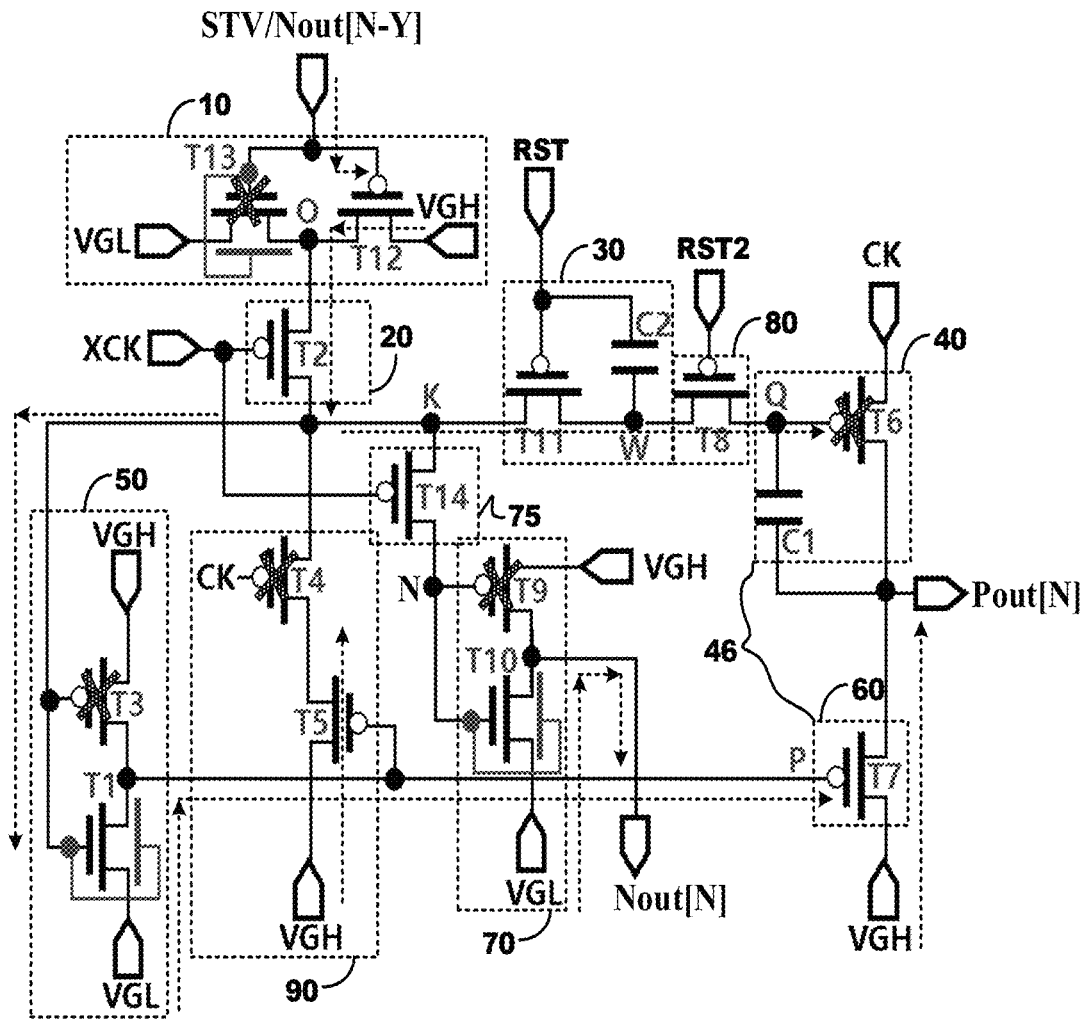
FIG. 23 illustrates the gate driving circuit shown in FIG. 20 at a second state shown in FIG. 21.

The second stage S2: As shown in FIG. 21 and FIG. 23, the starting control signal STV and the first clock signal XCK are at a low voltage level. The second clock signal CK is at a high voltage level. The node N is at a high voltage level. The fourth node P is at a low voltage level. The Nth positive pulse gate driving signal Nout [N] is at a low voltage level.

Figure 24:
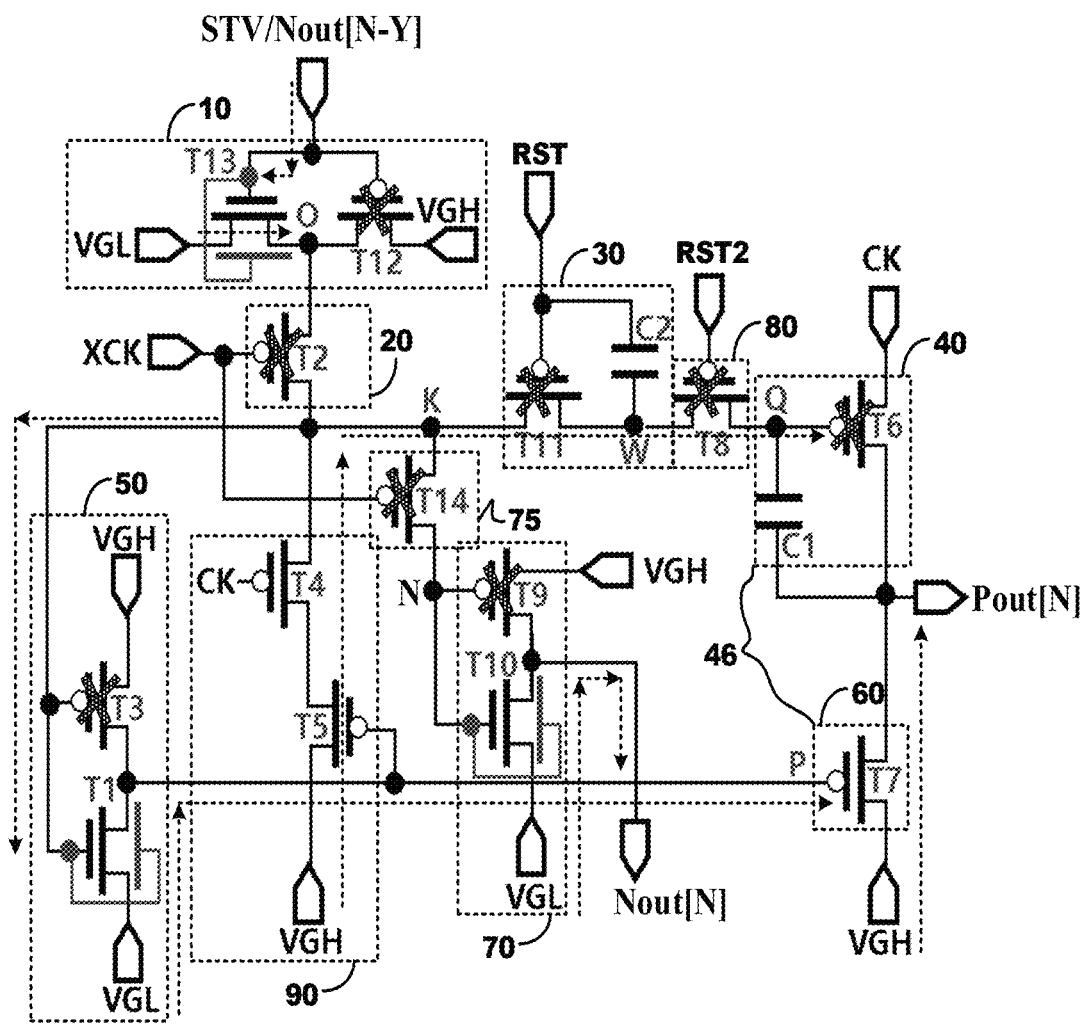
FIG. 24 illustrates the gate driving circuit shown in FIG. 20 at a third state shown in FIG. 21.

The third stage S3: As shown in FIG. 21 and FIG. 24, the second clock signal CK is at a low voltage level. The starting control signal STV and the first clock signal XCK are at a high voltage level. The node N is at a high voltage level. The fourth node P is at a low voltage level. The Nth positive pulse gate driving signal Nout [N] is at a low voltage level.

Figure 25:
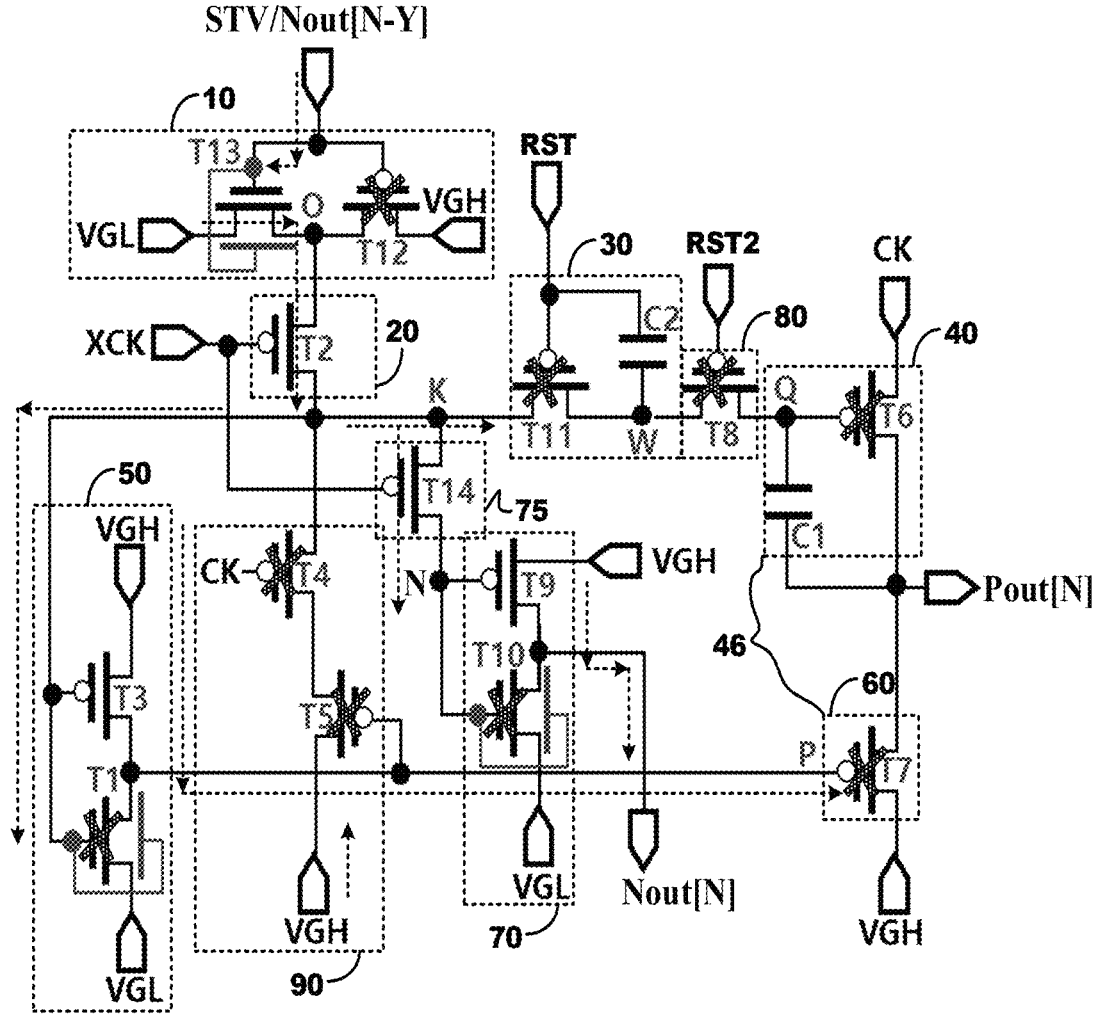
FIG. 25 illustrates the gate driving circuit shown in FIG. 20 at a fourth state shown in FIG. 21.

The fourth stage S4: As shown in FIG. 21 and FIG. 25, the first clock signal XCK is at a low voltage level. The starting control signal STV and the second clock signal CK are at a high voltage level. The fourth node P is at a high voltage level. The node N is at a low voltage level. The Nth positive pulse gate driving signal Nout [N] is at a high voltage level.

Figure 26:
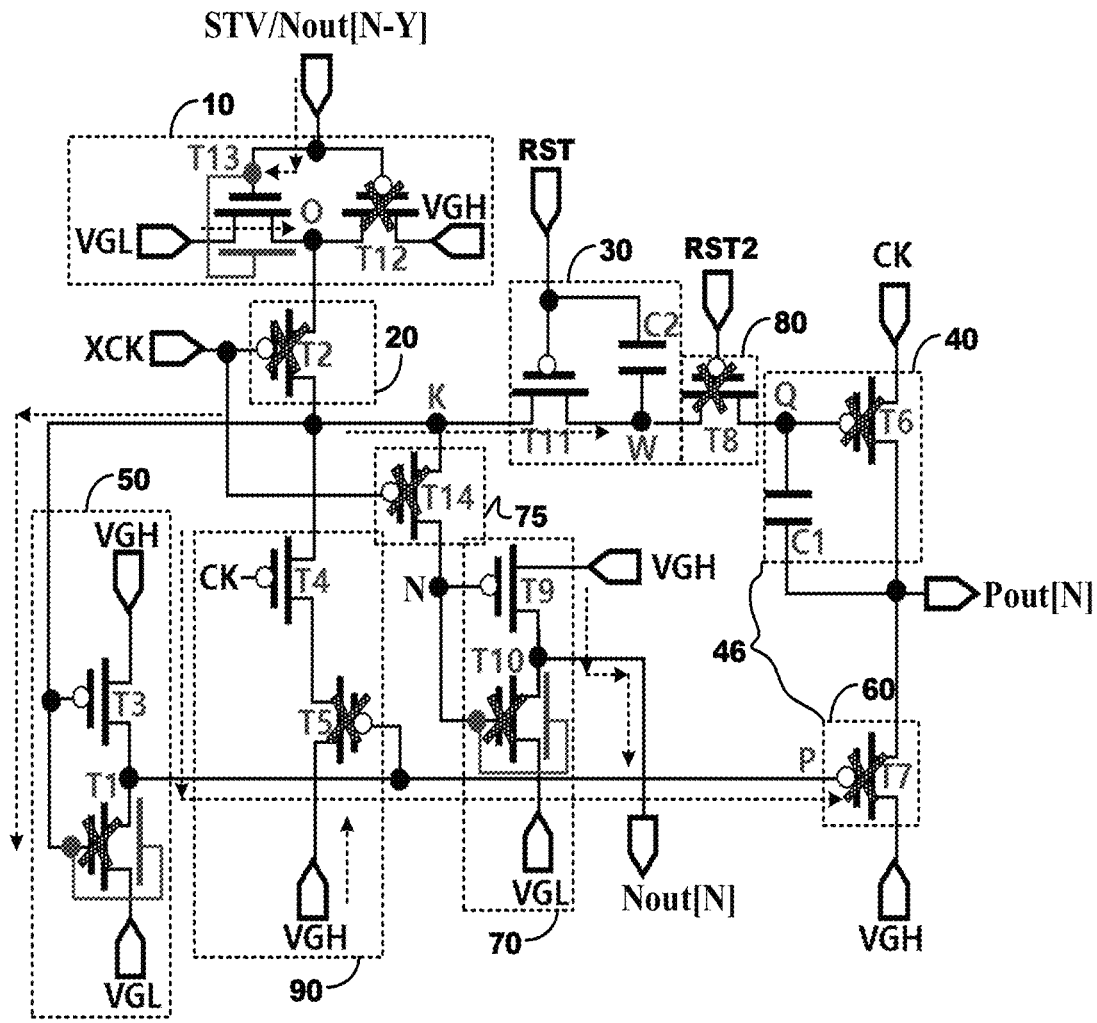
FIG. 26 illustrates the gate driving circuit shown in FIG. 20 at a fifth state shown in FIG. 21.

The fifth stage S5: As shown in FIG. 21 and FIG. 26, the second clock signal CK is at a low voltage level. The starting control signal STV and the first clock signal XCK are at a high voltage level, The fourth node P is at a high voltage level. The node N is at a low voltage level. The Nth positive pulse gate driving signal Nout [N] is at a high voltage level.

Figure 27:
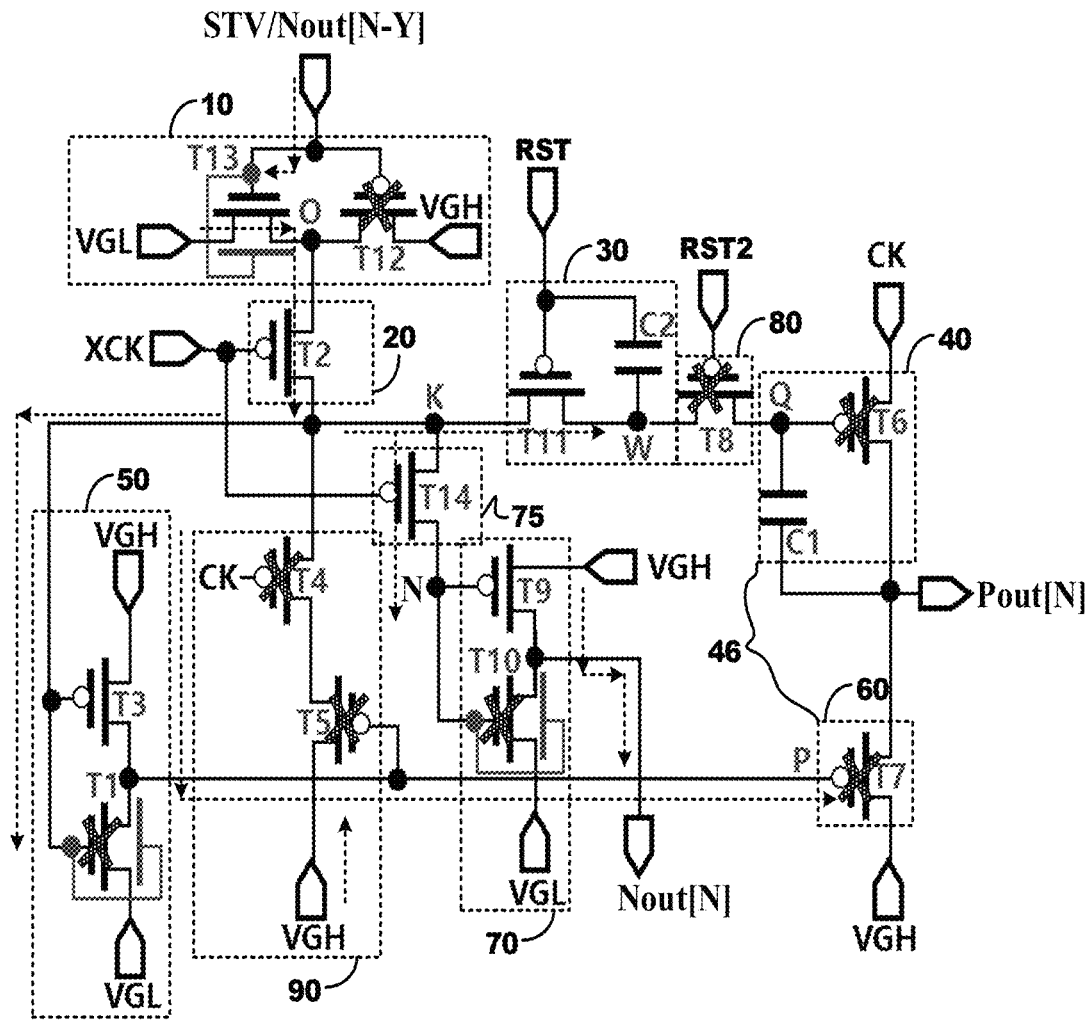
FIG. 27 illustrates the gate driving circuit shown in FIG. 20 at a sixth state shown in FIG. 21.

The sixth stage S6: As shown in FIG. 21 and FIG. 27, the first clock signal XCK is at a low voltage level. The starting control signal STV and the second clock signal CK are at a high voltage level. The fourth node P is at a high voltage level. The node N is at a low voltage level. The Nth positive pulse gate driving signal Nout [N] is at a high voltage level.

Figure 28:
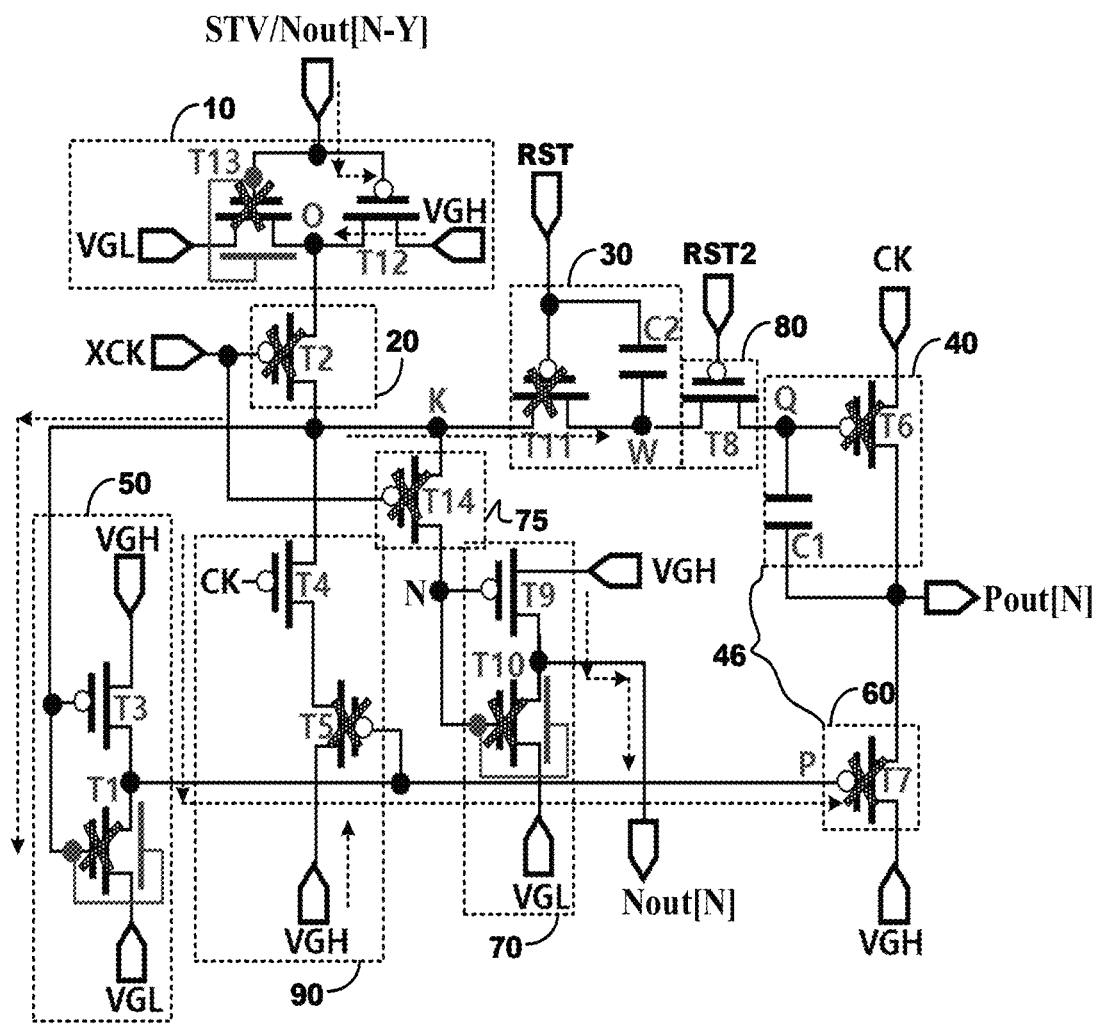
FIG. 28 illustrates the gate driving circuit shown in FIG. 20 at a seventh state shown in FIG. 21.

The seventh stage S7: As shown in FIG. 21 and FIG. 28, the starting control signal STV and the second clock signal CK are at a low voltage level. The first clock signal XCK is at a high voltage level. The fourth node P is at a high voltage level. The node N is at a low voltage level. The Nth positive pulse gate driving signal Nout [N] is at a high voltage level.

Figure 29:
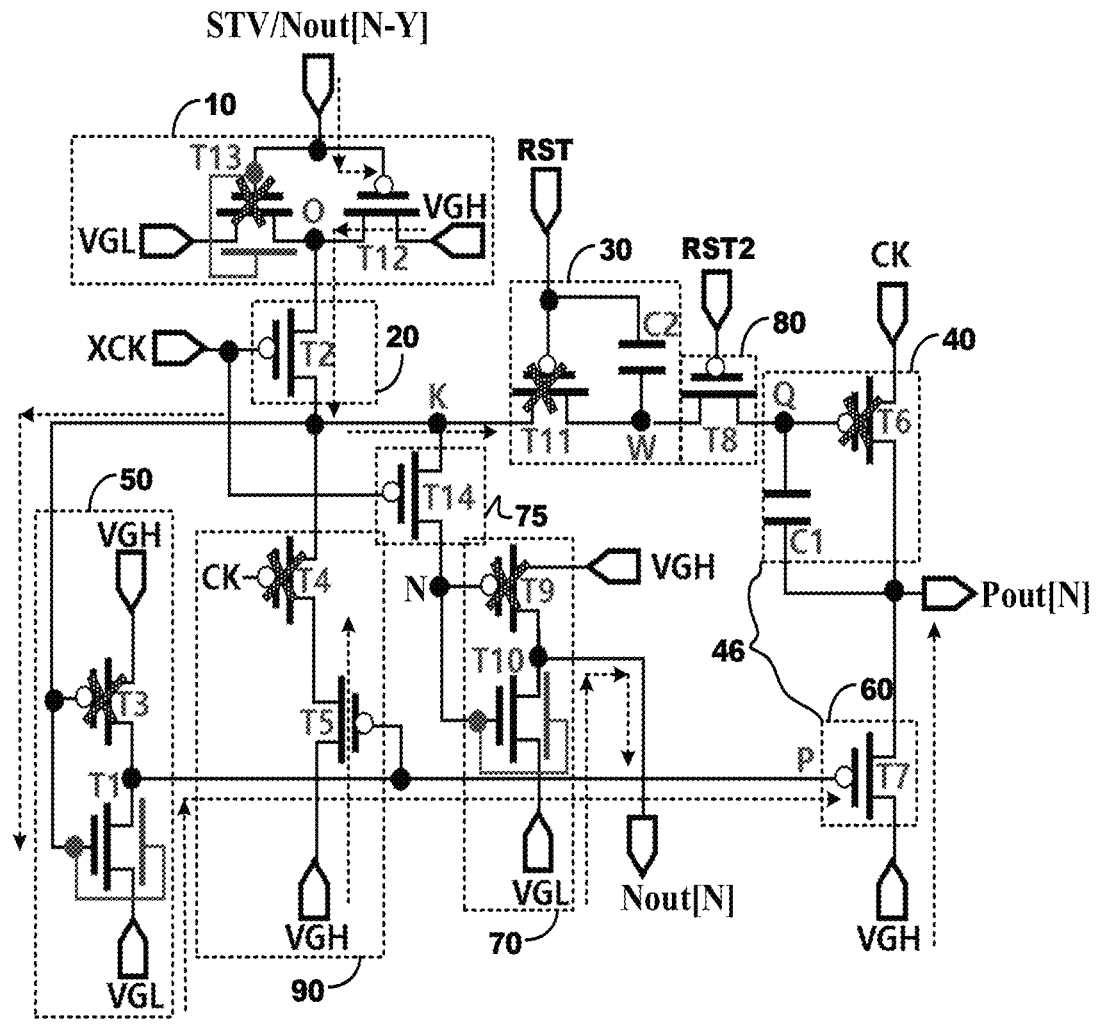
FIG. 29 illustrates the gate driving circuit shown in FIG. 20 at an eighth state shown in FIG. 21.

The eighth stage S8: As shown in FIG. 21 and FIG. 29, the starting control signal STV and the first clock signal XCK are at a low voltage level. The second clock signal CK is at a high voltage level. The node N is at a high voltage level. The fourth node P is at a low voltage level. The Nth positive pulse gate driving signal Nout [N] switches from a high voltage level to a low voltage level.

The "cross" in FIGS. 22-29 indicates that the transistor covered by it is in the off state, and the transistor that is not covered by the "cross" is in the on state. The dotted arrows in FIGS. 22-29 indicate the direction of the current.

Based on the above, FIG. 30 shows a generation process of the negative pulse of the Nth negative pulse gate driving signal Pout[N]. For clarity, the two pulses from right to left in the same signal are called the first pulse and the second pulse. The second node K transmits the first pulse and the second pulse successively in a frame. The (N−2)th positive pulse gate driving signal Nout [N−2] has two pulses. The high voltage portion of the front part of the two pulses controls the second filter module 80 to filter out the latter part of the first pulse and the latter part of the second pulse outputted by the second node K. The high voltage portion of the first pulse of the reset signal RST controls the first filter module 30 to filter out the front part of the second pulse outputted by the second node K. Accordingly, the width of the second pulse of the intermediate node W is also narrowed. The second pulse outputted by the second node K is completely filtered out. Only the front part of the first pulse outputted by the second node K is left to form a negative pulse at the third node Q. The negative pulse of the third node Q turns on the pull-up module 40 to form a negative pulse with a fixed width of the Nth negative pulse gate driving signal Pout [N].

Figure 31:
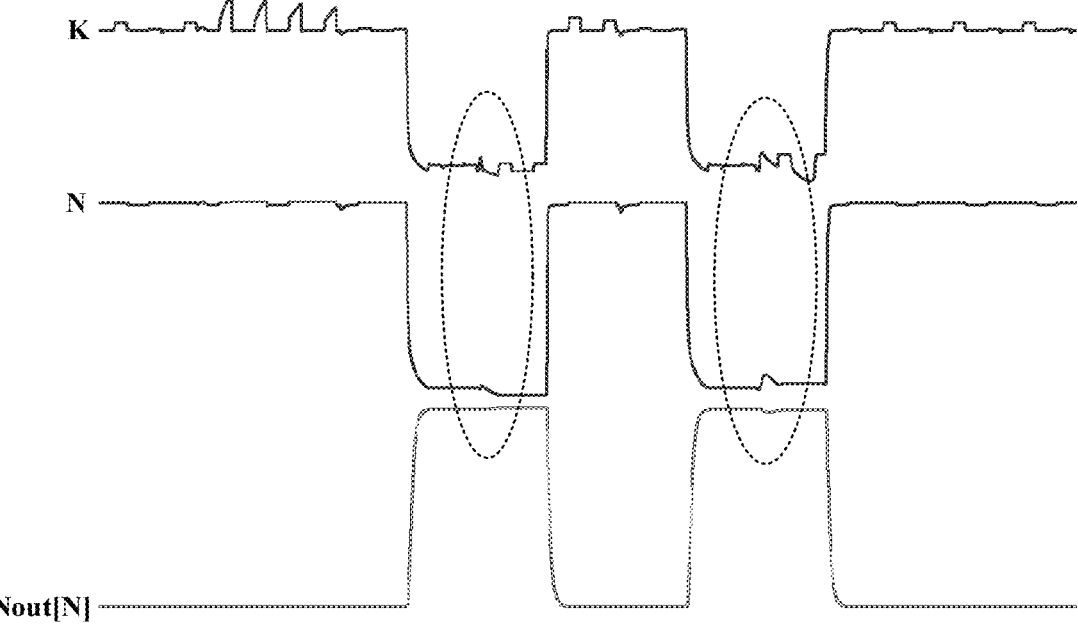
FIG. 31 is a timing diagram of some nodes in the gate driving circuit shown in FIG. 3 or FIG. 20.

Please refer to FIG. 31. The second node K of the gate driving circuit shown in FIG. 31 is affected by the voltage transition of the first clock signal XCK and/or the second clock signal CK. In addition, the voltage level of the second node K and the voltage level of the fifth node N are related, so the voltage level of the second node K and the voltage level of the fifth node N will significantly fluctuate in the high and low voltage levels (such as glitches or spikes shown in FIG. 31).

As shown in FIG. 31, the voltage level of the fifth node N will be significantly affected by the bootstrap coupling of the first gate driving signal when the voltage level of the fifth node N is low. This results in the apparent concave phenomenon of the second gate driving signal, which is the Nth positive pulse gate driving signal Nout [N], when the second gate driving signal is at a high voltage level (as shown in the dotted box in FIG. 31). This not only reduces the voltage level stability of the second gate driving signal but also causes the consistency among the second gate driving signals transmitted in the display panel, which in turn affects the uniformity of the display.

Figure 32:
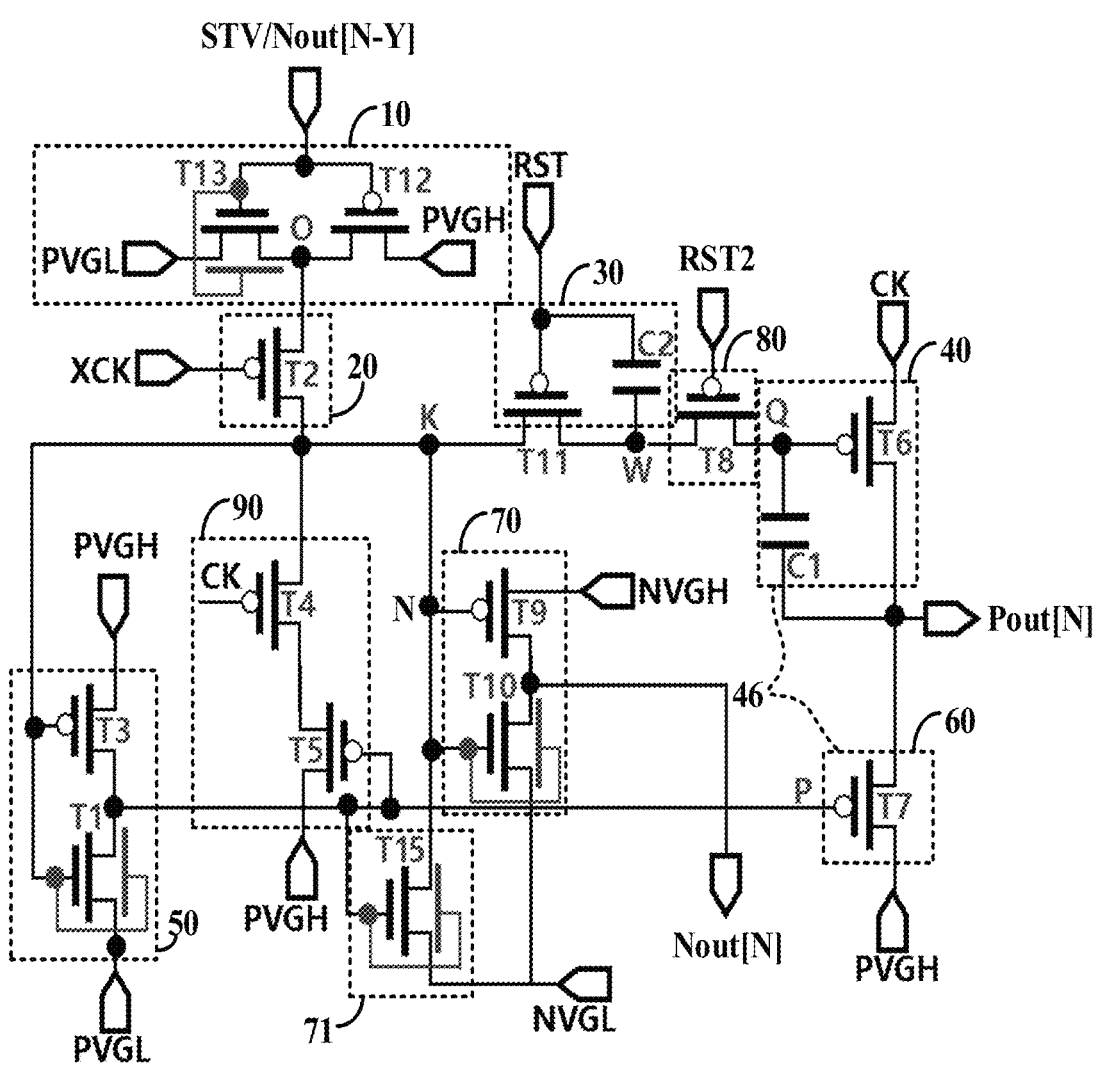
FIG. 32 is a diagram of a gate driving circuit according to a first embodiment of the present disclosure.
Figure 33:
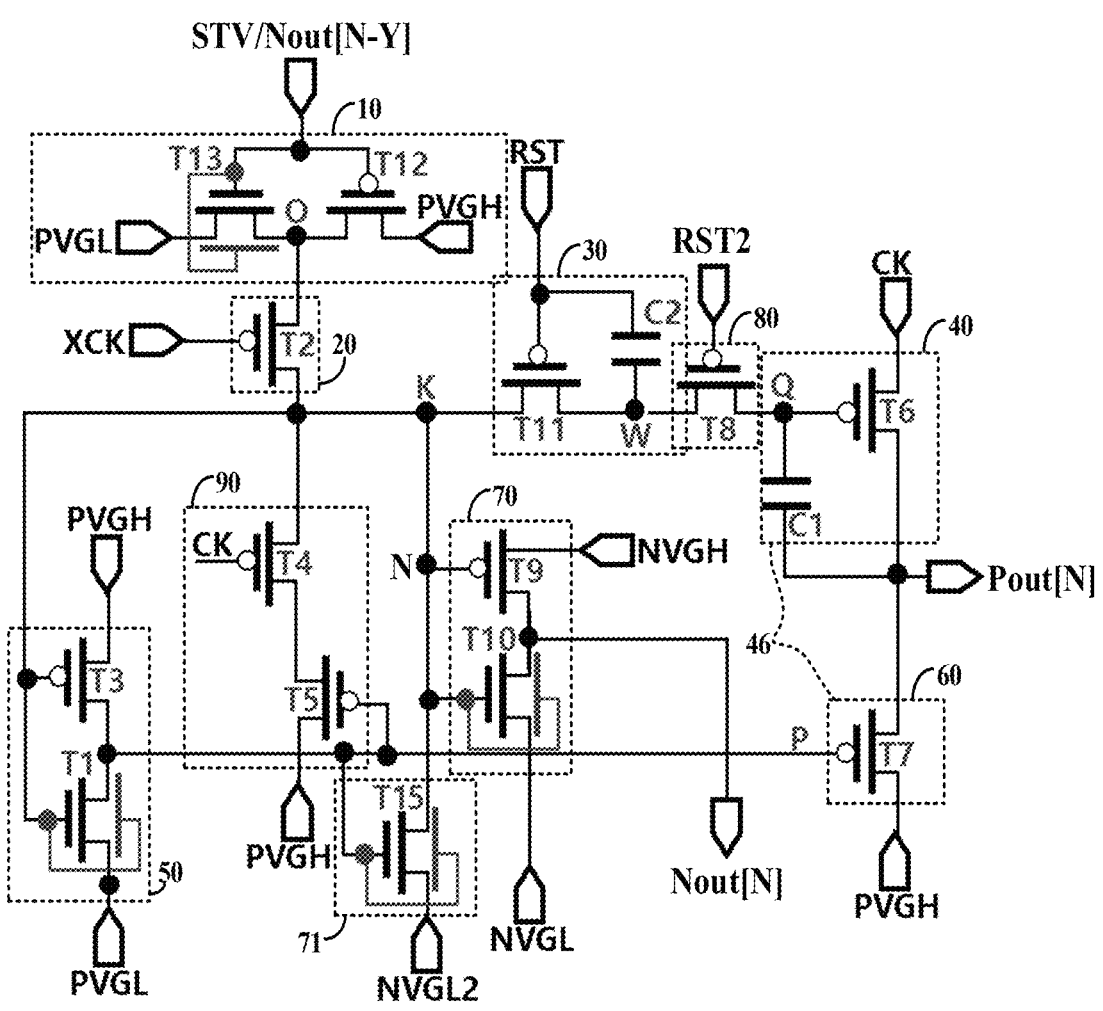
FIG. 33 is a diagram of a gate driving circuit according to a second embodiment of the present disclosure.
Figure 49:
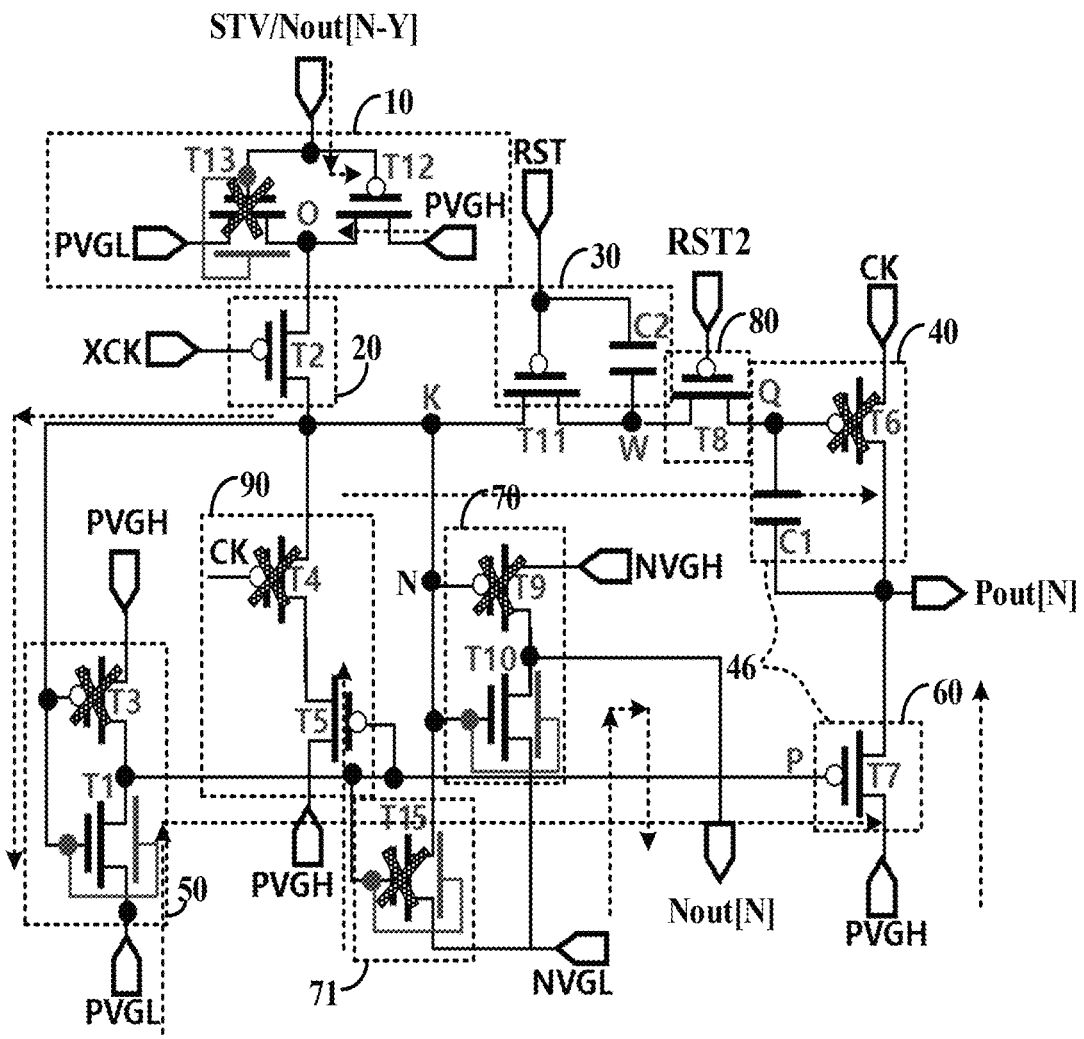
FIG. 49 illustrates the gate driving circuit shown in FIG. 32 at a fifteenth state shown in FIG. 34.
Figure 50:
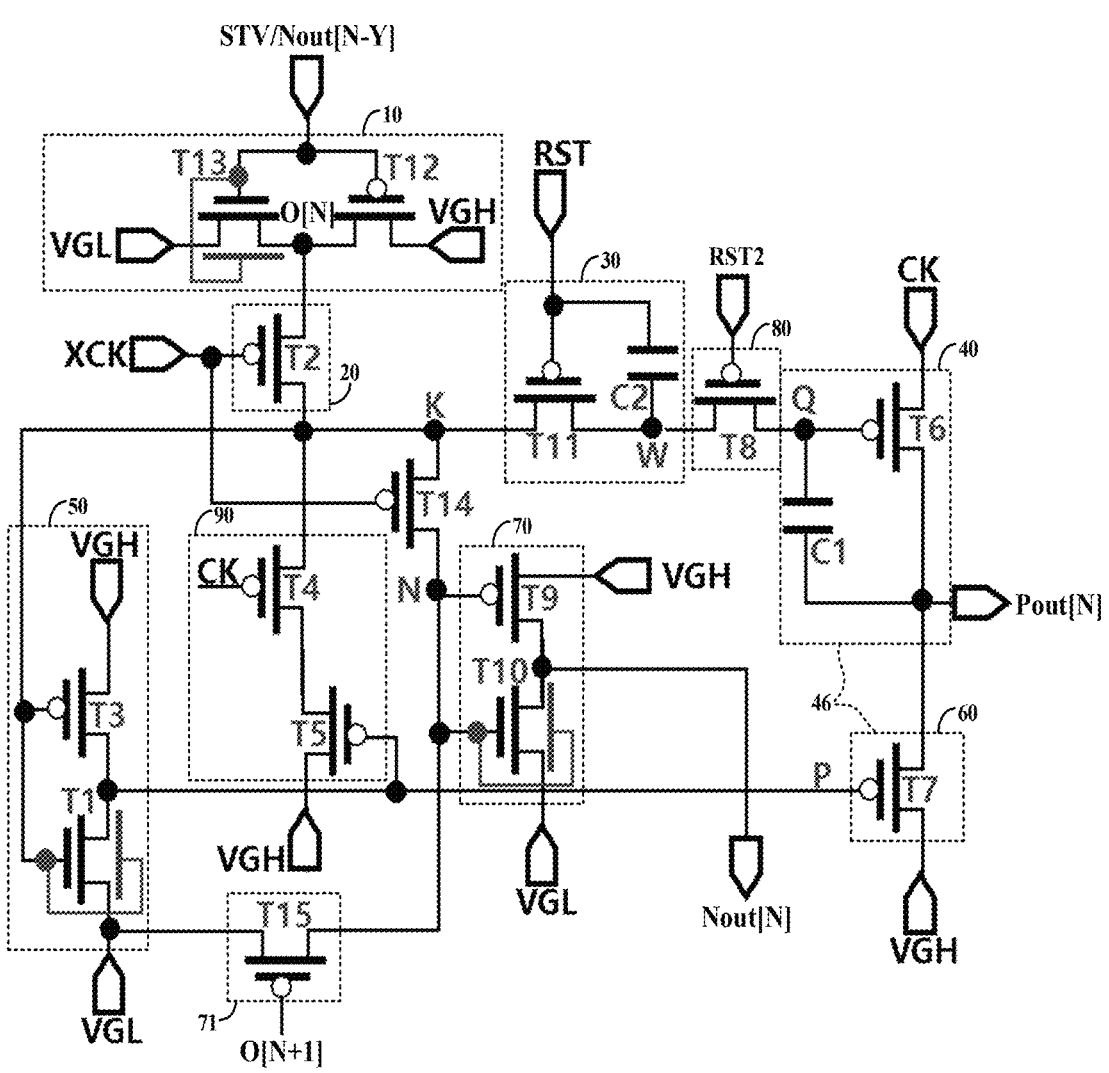
FIG. 50 is a diagram of a gate driving circuit according to a third embodiment of the present disclosure.

According to an embodiment, a gate driving circuit is disclosed. Please refer to FIGS. 32-59. As shown in FIGS. 32, 33 and 50, the gate driving circuit comprises a plurality of shift registers. Each of the shift registers includes at least one of the a cascade signal selection module 10, a pull-up control module 20, a first filter module 30, a second filter module 80, a first inverting module 50, a first output module 46, a second output module 70, and a voltage regulating module 71.

The cascade signal selection module 10 is electrically connected between the first line and the first node O/O[N].

The pull-up control module 20 controls the voltage level of the second node K according to the voltage level of the first node O/O[N] and the voltage level of the first clock signal XCK.

The first filter module 30 is electrically connected between the second node K and the third node Q. The control end of the first filter module 30 receives the reset signal RST.

The second filter module 80 is electrically connected between the first filter module 30 and the third node Q. The control end of the second filter module 80 receives the filter control signal RST2.

The first inverting module 50 is connected between the second node K and the fourth node P.

The first output module 46 outputs the first gate driving signal according to the voltage level of the third node Q and the voltage level of the fourth node P.

The second output module 70 comprises a P-type first transistor T9 and an N-type second transistor T10. The first electrode of the first transistor T9 is electrically connected to the first high voltage line. The second electrode of the first transistor T9 is electrically connected with the first electrode of the second transistor T10 to output the second gate driving signal. The second electrode of the second transistor T10 is connected to the first low voltage signal. The second node K is electrically connected to the gate of the first transistor T9 and the gate of the second transistor T10.

One end of the voltage regulating module 71 receives a low voltage signal, and the other end of the voltage regulating module 71 is connected to the gate of the second transistor T10. The control end of the voltage regulating module 71 is electrically connected to one of the fourth node P, the output of the second output module 70, and the first node O[n+1] of the shift register of the next stage.

In this embodiment, the gate driving circuit utilizes one of the fourth node P, the output end of the second output module 70 and the first node O[n+1] of the shift register of the next stage to control the voltage regulating module 71 such that the voltage regulating module 71 may stabilize or reduce the gate voltage of the second transistor T10 by a low voltage signal. In this way, the second transistor T10 could be stable or better in the off state to reduce the leakage current. This could further maintain the voltage level of the second gate driving signal at a high voltage level or its pulse amplitude and thus improves the stability of the gate driving signal.

The filter control signal RST2 can be the (N−2)th positive pulse gate driving signal Nout [N−2]. Or, the filer control signal RST2 could be selected from other stages of positive gate driving signals according to the filtering needs.

In one embodiment, the voltage regulating module 71 is used to stabilize or reduce the low voltage level of the second node K. Alternatively, in another embodiment, the voltage regulating module 71 is also used to stabilize or reduce the gate voltage of the second transistor T10 during the positive pulse duration of the second gate driving signal.

The voltage regulating module 71 comprises a third transistor T15. The first electrode of the third transistor T15 is connected to a low voltage signal. The second electrode of the third transistor T15 is electrically connected to the gate of the second transistor T10. The gate of the third transistor T15 is electrically connected to one of the fourth node P, the output end of the second output module 70 and the first node O[n+1] of the shift register of the next stage.

The third transistor T15 can stabilize or reduce the gate voltage of the second transistor T10 during the positive pulse duration of the second gate driving signal, so that the second transistor T10 is stable or better in the off state to reduce the leakage current. This could further maintain the voltage level of the second gate driving signal at a high voltage level or its pulse amplitude, thereby improving the stability of the gate driving signal.

As shown in FIG. 32, the gate of the third transistor T15 is electrically connected to one of the fourth node P and the output end of the second output module 70. The low voltage signal is a first low voltage signal. The channel type of the third transistor T15 is the same as the channel type of the second transistor T10.

In this embodiment, the low voltage signal and the first low voltage signal are both the signal NVGL.

Since the low voltage signal is the first low voltage signal, the second transistor T10 and the third transistor T15 may share the same low voltage line, which can save the number of traces required for the gate driving circuit. The channel type of the third transistor T15 is the same as the channel type of the second transistor T10. The third transistor T15 can be turned on when the second transistor T10 in the off state to further reduce the gate voltage of the second transistor T10.

As shown in FIG. 33, the gate of the third transistor T15 is electrically connected to one of the fourth node P and the output end of the second output module 70. The channel type of the third transistor T15 is the same as the channel type of the second transistor T10. The voltage level of the low voltage signal is lower than the voltage level of the first low voltage signal.

In this embodiment, the first low voltage signal is the signal NVGL, and the low voltage signal is the signal NVGL2.

The channel type of the third transistor T15 is the same as the channel type of the second transistor T10. The signal NVGL2 can be transmitted to the gate of the second transistor T10 through the third transistor T15 when the second transistor T10 is in the off state. This could further reduce the gate voltage of the second transistor T10 compared to the signal NVGL, thereby reducing the leakage current of the second transistor T10. In this way, the stability of the low voltage level of the second node K and the low voltage level of the intermediate node W can be improved.

The difference between the voltage level of the signal NVGL and the voltage level of the signal NVGL2 is greater than or equal to 2V.

In this embodiment, not only the leakage current of the second transistor T10 is reduced, but also the threshold voltage of the second transistor T10 is adjusted to have a forward shift. This increases the range of the threshold voltage of the second transistor T10.

Figure 35:
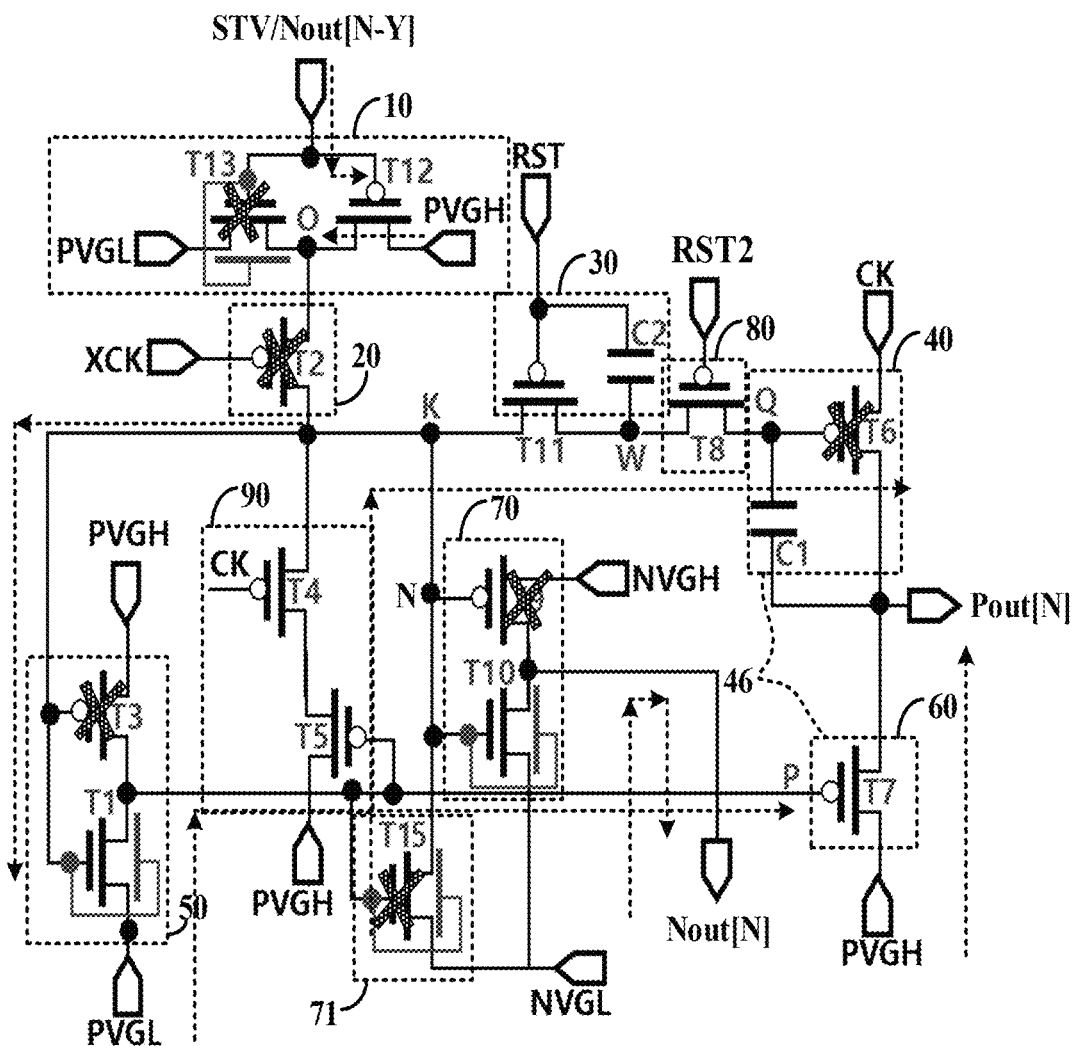
FIG. 35 illustrates the gate driving circuit shown in FIG. 32 at a first state shown in FIG. 34.

As shown in FIG. 35, the first inverting module 50 comprises a P-type fourth transistor T3 and an N-type fifth transistor T1. The first electrode of the fourth transistor T3 is electrically connected to the second high voltage line. The second electrode of the fourth transistor T3 is electrically connected to the fourth node P. The gate of the fourth transistor T3 is electrically connected to the second node K. The first electrode of the fifth transistor T1 is electrically connected to the fourth node P. The second electrode of the fifth transistor T1 receives the second low voltage signal. The gate of the fifth transistor T1 is electrically connected to the second node K. The voltage level of the second low voltage signal is lower than the voltage level of the low voltage signal.

In this embodiment, the second low voltage signal is the signal PVGL, and the low voltage signal is the signal NVGL.

In the case that the fifth transistor T1 is turned on, the gate-to-source voltage difference of the third transistor T15 can be less than zero. This can effectively ensure the stability of the third transistor T15.

In one embodiment, the second transistor T10 is a double-gate transistor. The first gate of the second transistor T10 is electrically connected to the second node K and the second gate of the second transistor T10. The third transistor T15 is a double-gate transistor. The first gate of the third transistor T15 is electrically connected to the fourth node P and the second gate of the third transistor T15.

The second transistor T10 and the third transistor T15 are dual-gate transistors. This arrangement could not only reduce the drift of the threshold voltage but also improve the accuracy of control.

In one embodiment, as shown in FIG. 50, the gate of the third transistor T15 is electrically connected to the first node O[n+1] of the shift register of the next stage. The low voltage signal is the first low voltage signal, and the channel type of the third transistor T15 is different from the channel type of the second transistor T10. The shift register also includes the sixth transistor T14. The first electrode of the sixth transistor T14 is electrically connected to the second node K. The second electrode of the sixth transistor T14 is electrically connected to the gate of the first transistor T9. The gate of the sixth transistor T14 is connected to the first clock signal XCK, and the channel type of the sixth transistor T14 is the same as the channel type of the first transistor T9.

In this embodiment, the low voltage signal and the first low voltage signal are both the signal VGL.

In this embodiment, the first node O[n+1] of the shift register of the next stage is used as the signal source of the gate of the third transistor T15. The voltage level of the first node O[n+1] and the voltage level of the fourth node P have opposite phases. The waveform of O[n+1] is generally the same as the waveform of the fifth node N, so the use of the node O[n+1] to control the P-type third transistor T15 can continue to fully pull down the voltage level of the fifth node N. in this way, the voltage level of the fifth node N reaches the target voltage level of VGL–Vth. This could further reduce the leakage current of the second transistor T10 and improve the stability of the high voltage level provided by the second output module 70.

VGL is the voltage level of the low voltage signal. Vth is the threshold voltage of the second transistor T10.

Other structural parts and operating principles of the gate driving circuits shown in FIG. 32, FIG. 33 and FIG. 50 can also be referred to the description of the aforementioned gate driving circuit.

Figure 34:
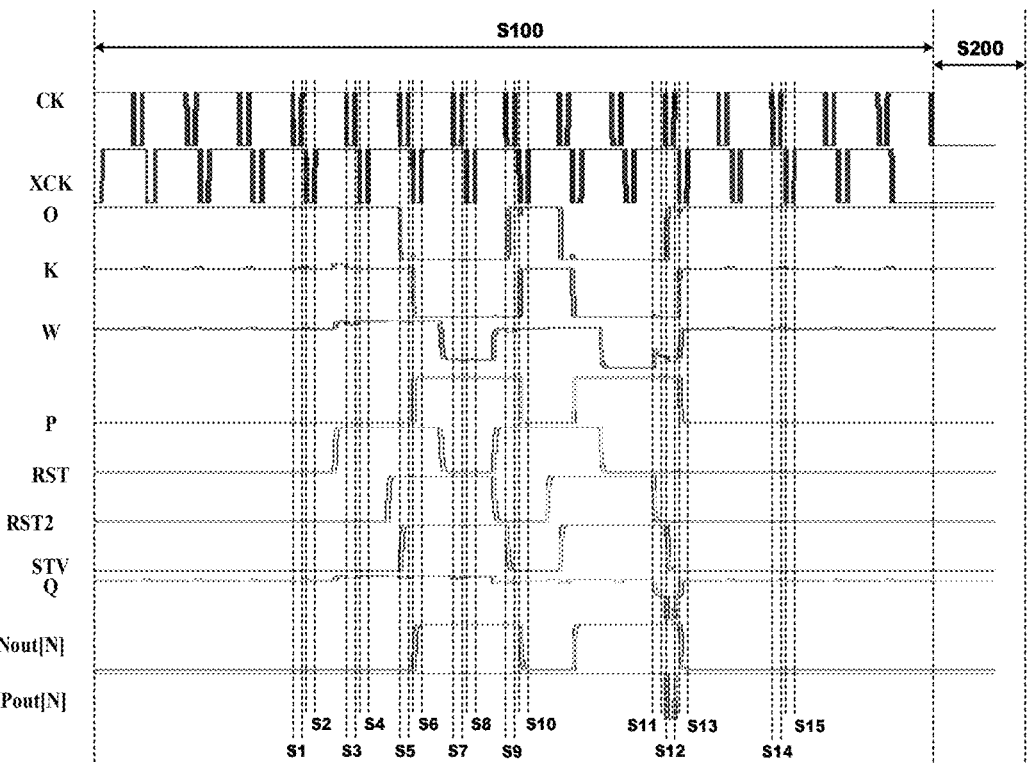
FIG. 34 is a timing diagram of the gate driving circuits shown in FIG. 32 and FIG. 33.

FIG. 34 is a timing diagram of the gate driving circuit shown in FIGS. 32 and 33.

The operation of the shift register shown in FIGS. 32 and 33 in a frame may include the following stages shown in FIG. 34:

The first stage S1: As shown in FIG. 34 and FIG. 35, the starting control signal STV, the reset signal RST, the second clock signal CK, and the (N−2)th positive pulse gate driving signal Nout [N−2] are all at a low voltage level. The first clock signal XCK is at a high voltage level. The first node O/O[N], the second node K, the intermediate node W and the third node Q are all at a high voltage level. The fourth node P is at a low voltage level. The Nth positive pulse gate driving signal Nout[N] is at a low voltage level. The Nth negative pulse gate driving signal Pout[N] is at a high voltage level.

Figure 36:
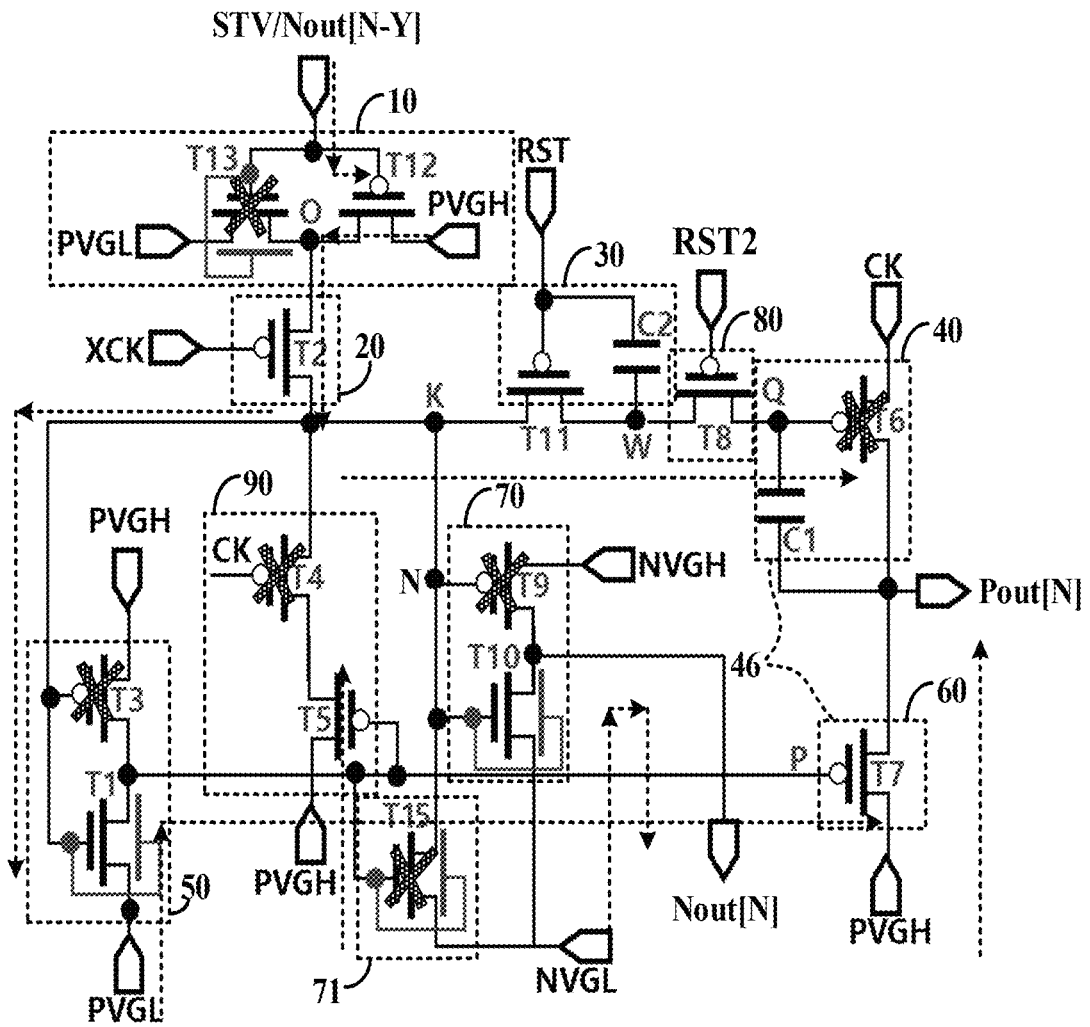
FIG. 36 illustrates the gate driving circuit shown in FIG. 32 at a second state shown in FIG. 34.

The second stage S2: As shown in FIG. 34 and FIG. 36, the starting control signal STV, the reset signal RST, the first clock signal XCK, and the (N−2)th positive pulse gate driving signal Nout [N−2] are all at a low voltage level. The second clock signal CK is at a high voltage level. The first node O/O[N], the second node K, the intermediate node W and the third node Q are all at a high voltage level. The fourth node P is at a low voltage level. The Nth positive pulse gate driving signal Nout[N] is at a low voltage level. The Nth negative pulse gate driving signal Pout[N] is at a high voltage level.

Figure 37:
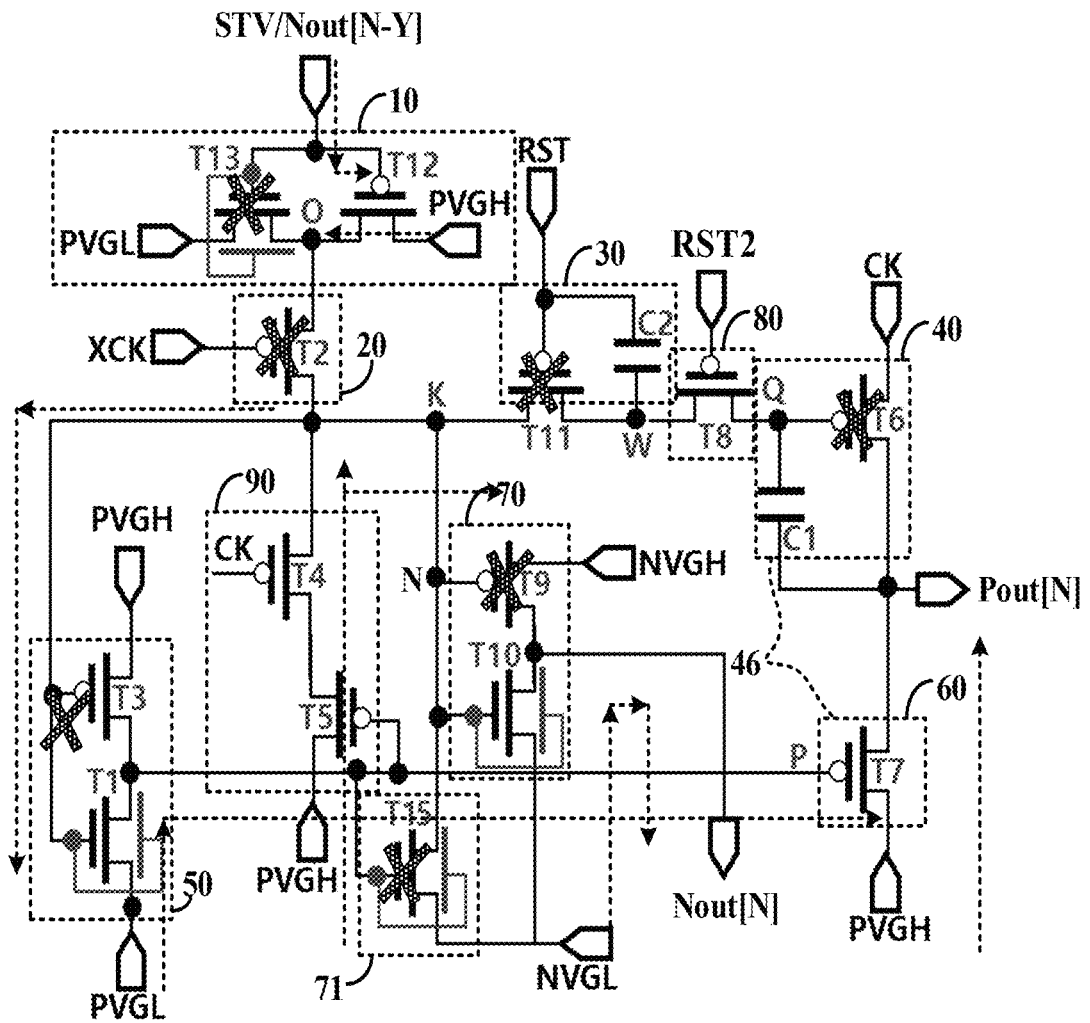
FIG. 37 illustrates the gate driving circuit shown in FIG. 32 at a third state shown in FIG. 34.

The third stage S3: As shown in FIG. 34 and FIG. 37, the starting control signal STV, the second clock signal CK, and the (N−2)th positive pulse gate driving signal Nout [N−2] are all at a low voltage level. The reset signal RST and the first clock signal XCK are at a high voltage level. The first node O/O[N], the second node K, the intermediate node W and the third node Q are all at a high voltage level. The fourth node P is at a low voltage level. The Nth positive pulse gate driving signal Nout[N] is at a low voltage level. The Nth negative pulse gate driving signal Pout[N] is at a high voltage level.

Figure 38:
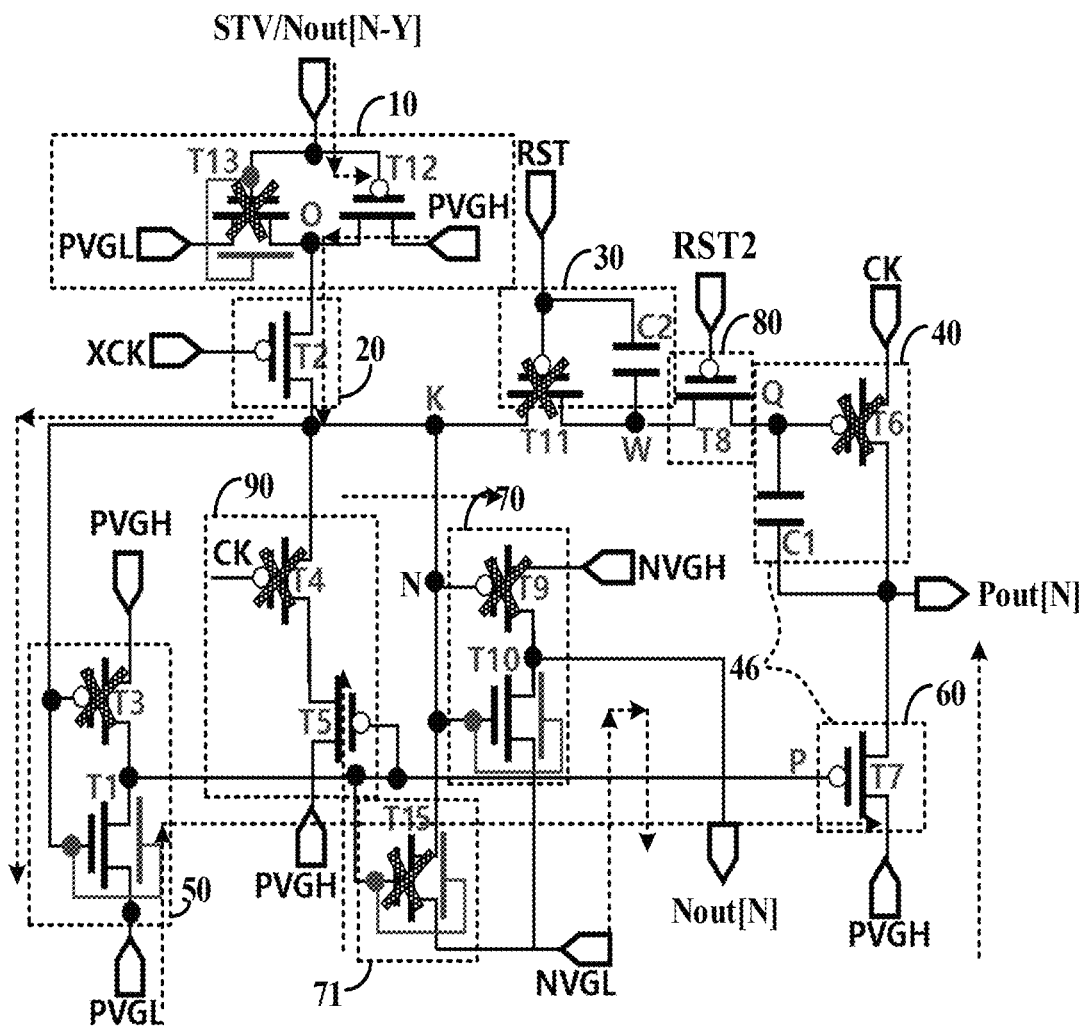
FIG. 38 illustrates the gate driving circuit shown in FIG. 32 at a fourth state shown in FIG. 34.

The fourth stage S4: As shown in FIG. 34 and FIG. 38, the starting control signal STV, the first clock signal XCK, and the (N−2)th positive pulse gate driving signal Nout [N−2] are all at a low voltage level. The reset signal RST and the second clock signal CK are at a high voltage level. The first node O/O[N], the second node K, the intermediate node W and the third node Q are all at a high voltage level. The fourth node P is at a low voltage level. The Nth positive pulse gate driving signal Nout[N] is at a low voltage level. The Nth negative pulse gate driving signal Pout[N] is at a high voltage level.

Figure 39:
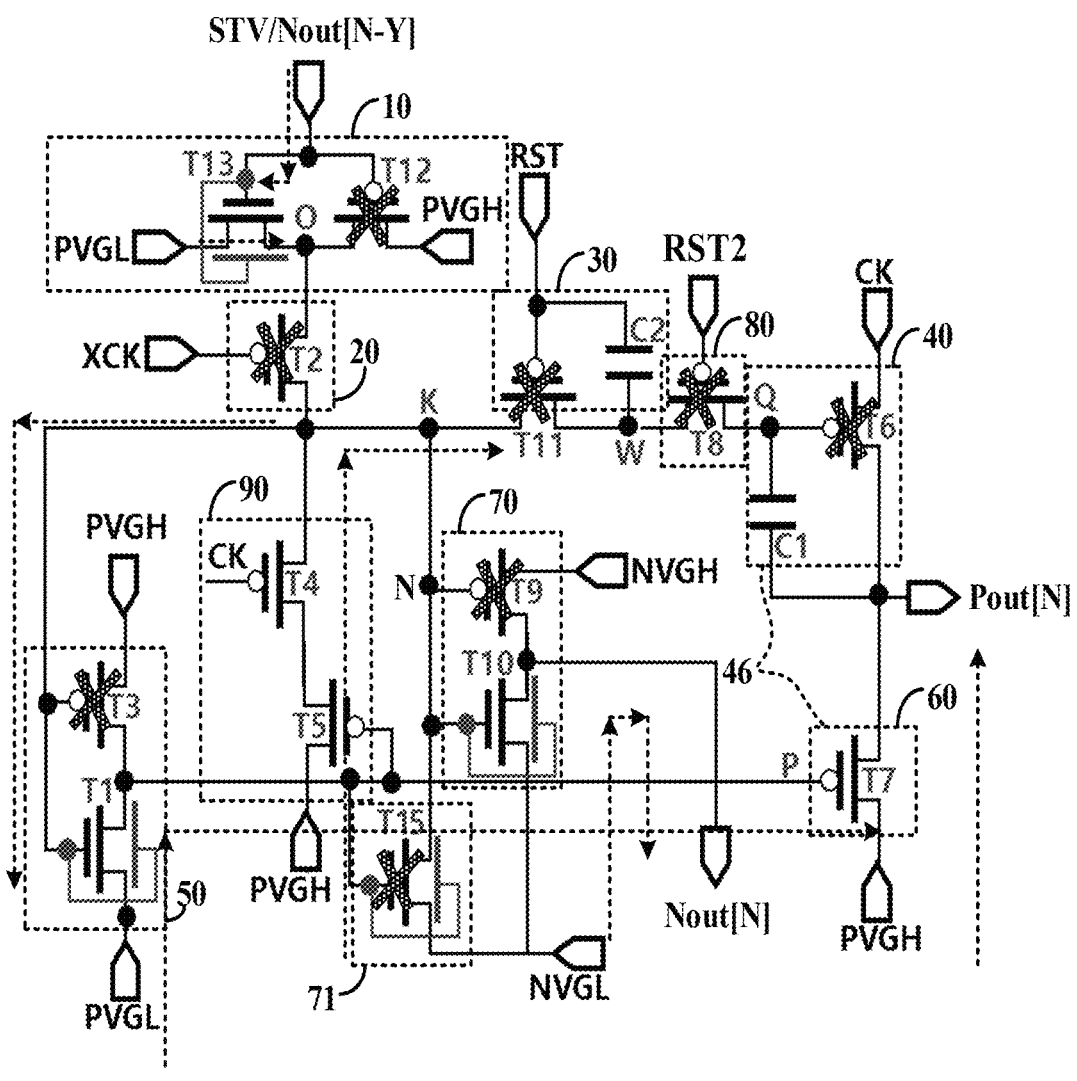
FIG. 39 illustrates the gate driving circuit shown in FIG. 32 at a fifth state shown in FIG. 34.

The fifth stage S5: As shown in FIG. 34 and FIG. 39, the second clock signal CK is at a low voltage level. The starting control signal STV, the reset signal RST, the first clock signal XCK and the (N−2)th positive pulse gate driving signal Nout [N−2] are at a high voltage level. The second node K, the intermediate node W and the third node Q are all at a high voltage level. The first node O/O[N] and the fourth node P is at a low voltage level. The Nth positive pulse gate driving signal Nout[N] is at a low voltage level. The Nth negative pulse gate driving signal Pout[N] is at a high voltage level.

Figure 40:
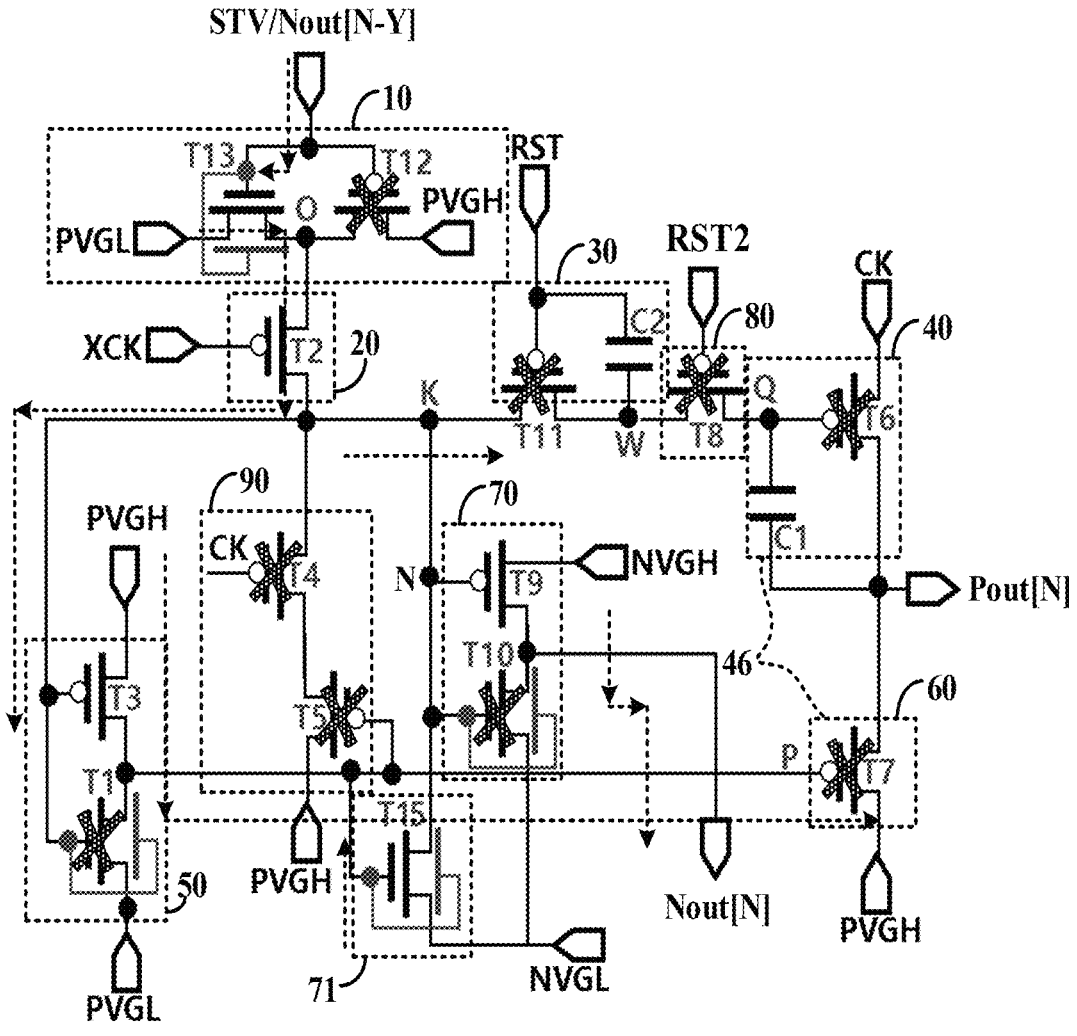
FIG. 40 illustrates the gate driving circuit shown in FIG. 32 at a sixth state shown in FIG. 34.

The sixth stage S6: As shown in FIG. 34 and FIG. 40, the first clock signal XCK is at a low voltage level, the starting control signal STV, the reset signal RST, the second clock signal CK and the N−2 positive pulse gate driving signal Nout [N−2] are at a high voltage level. The intermediate node W, the fourth node P and the third node Q are all at a high voltage level. The second node K and the first node O/O[N] are at a low voltage level. The Nth positive pulse gate driving signal Nout [N] is at a high voltage level. The Nth negative pulse gate driving signal Pout[N] is at a high voltage level.

Figure 41:
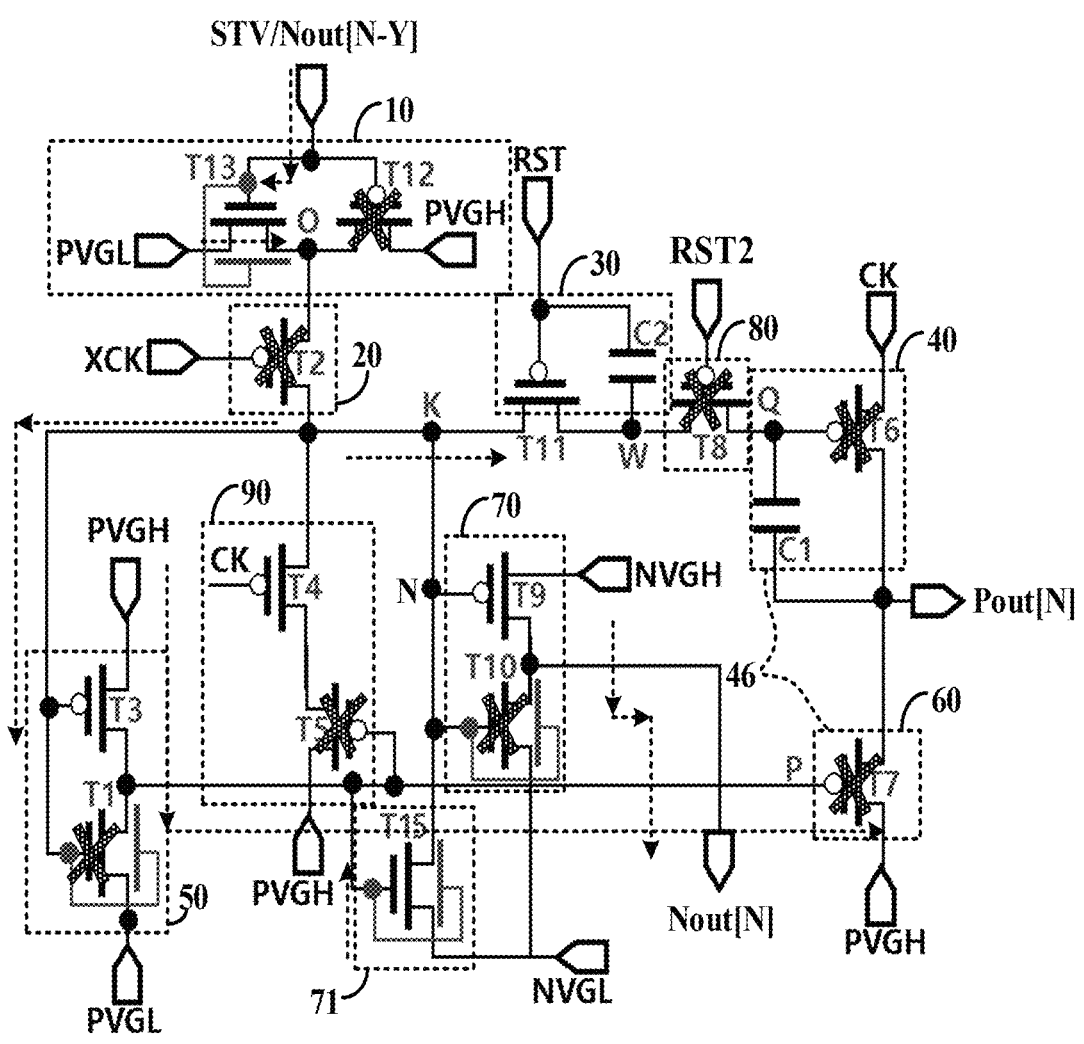
FIG. 41 illustrates the gate driving circuit shown in FIG. 32 at a seventh state shown in FIG. 34.

The seventh stage S7: As shown in FIG. 34 and FIG. 41, the reset signal RST and the second clock signal CK are at a low voltage level. The starting control signal STV, the first clock signal XCK, and the (N−2)th positive pulse gate driving signal Nout [N−2] are at a high voltage level. The fourth node P and the third node Q are all at a high voltage level. The intermediate node W, the second node K, the first node O/O[N] are at a low voltage level. The Nth stage positive pulse gate driving signal Nout[N] is at a high voltage level. The Nth negative pulse gate driving signal Pout[N] is at a high voltage level.

Figure 42:
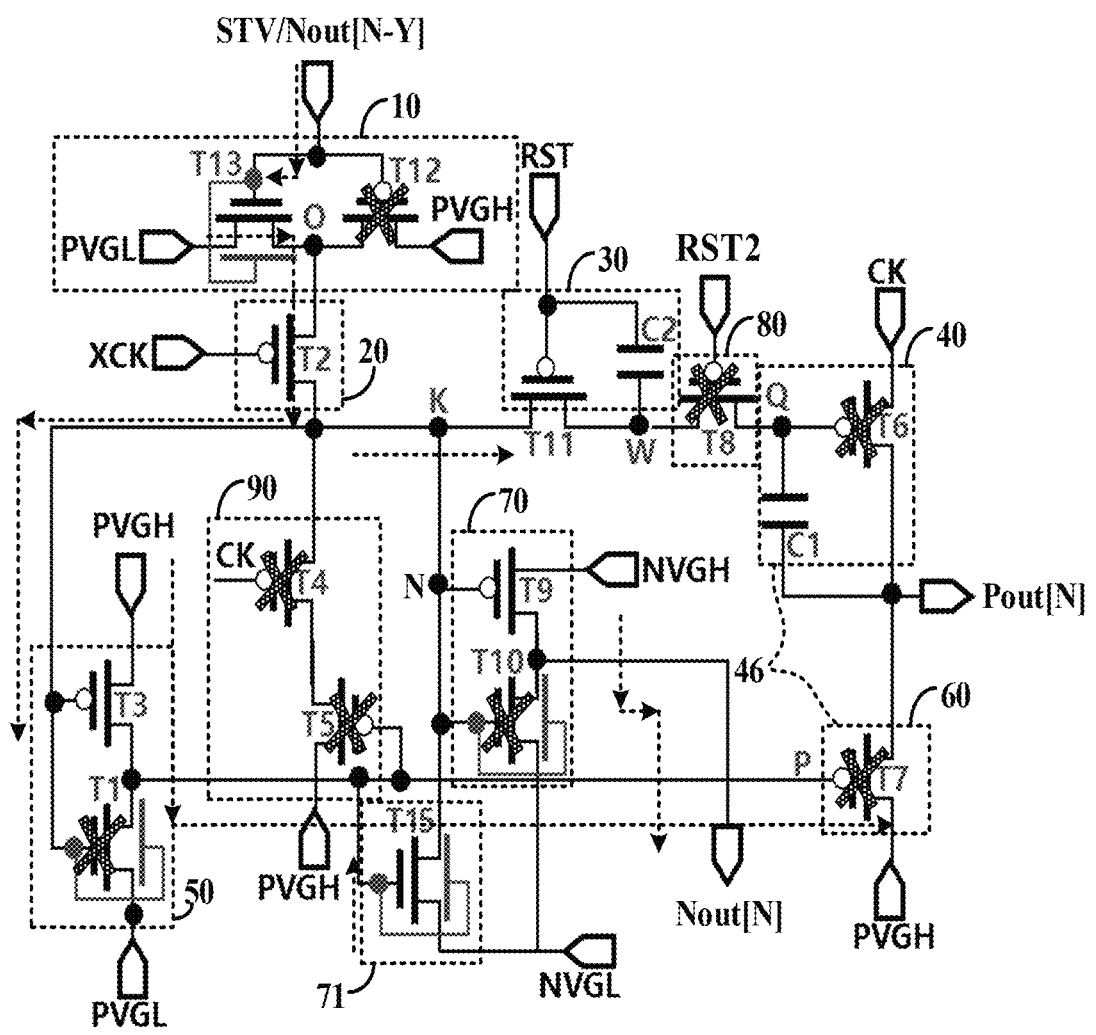
FIG. 42 illustrates the gate driving circuit shown in FIG. 32 at an eighth state shown in FIG. 34.

The eighth stage S8: As shown in FIG. 34 and FIG. 42, the reset signal RST and the first clock signal XCK is at a low voltage level. The starting control signal STV, the second clock signal CK, and the (N−2)th positive pulse gate driving signal Nout [N−2] are at a high voltage level. The fourth node P and the third node Q are all at a high voltage level. The intermediate node W, the second node K, the first node O/O[N] are at a low voltage level. The Nth stage positive pulse gate driving signal Nout[N] is at a high voltage level. The Nth negative pulse gate driving signal Pout[N] is at a high voltage level.

Figure 43:
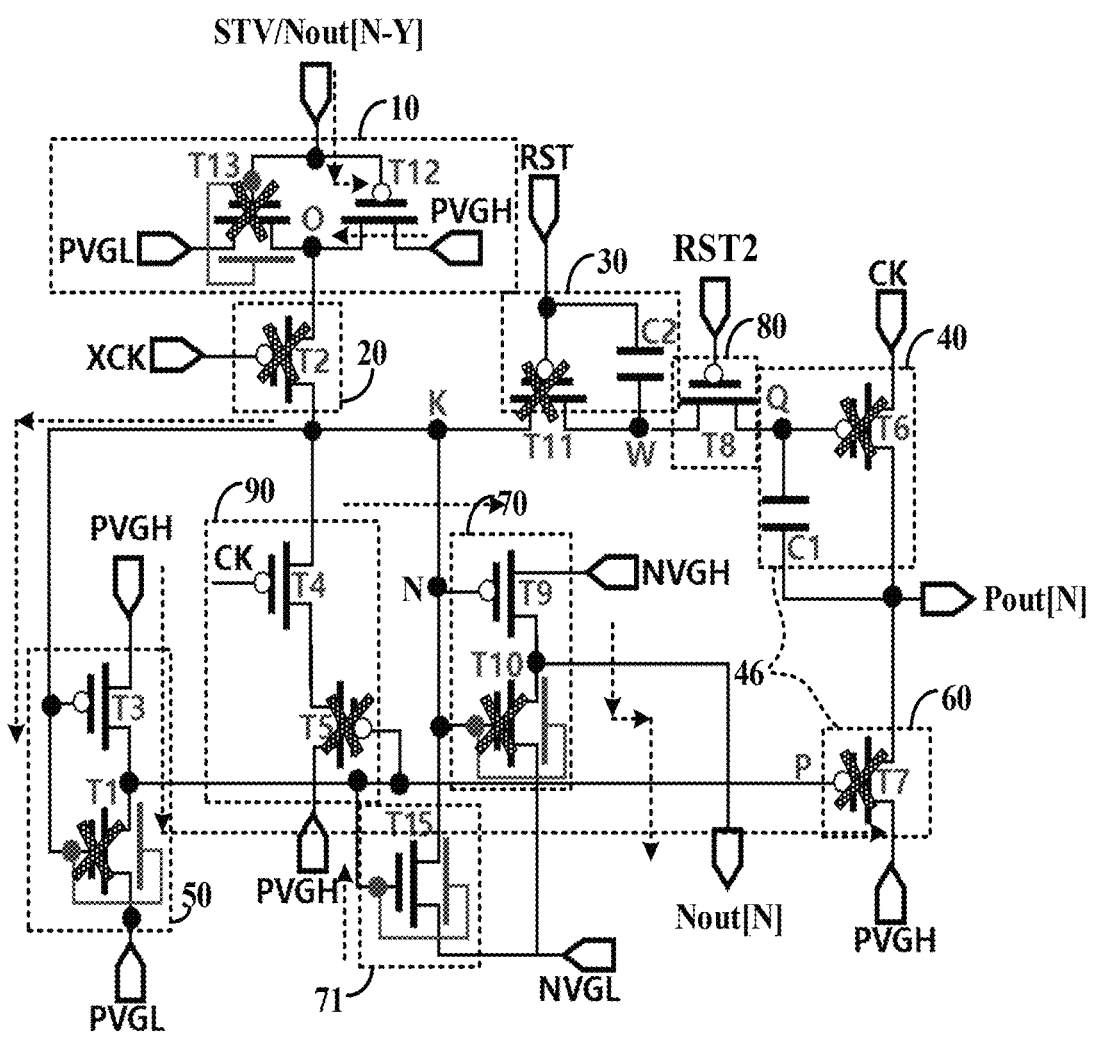
FIG. 43 illustrates the gate driving circuit shown in FIG. 32 at a ninth state shown in FIG. 34.

The ninth stage S9: As shown in FIG. 34 and FIG. 43, the second clock signal CK and the (N−2)th positive pulse gate driving signal Nout [N−2] are at a low voltage level, the reset signal RST, the start control signal STV and the first clock signal XCK are at a high voltage level. The intermediate node W, the first node O/O[N], the fourth node P and the third node Q are all at a high voltage level. The second node K is at a low voltage level. The Nth positive pulse gate driving signal Nout[N] is at a high voltage level. The Nth negative pulse gate driving signal Pout[N] is at a high voltage level.

Figure 44:
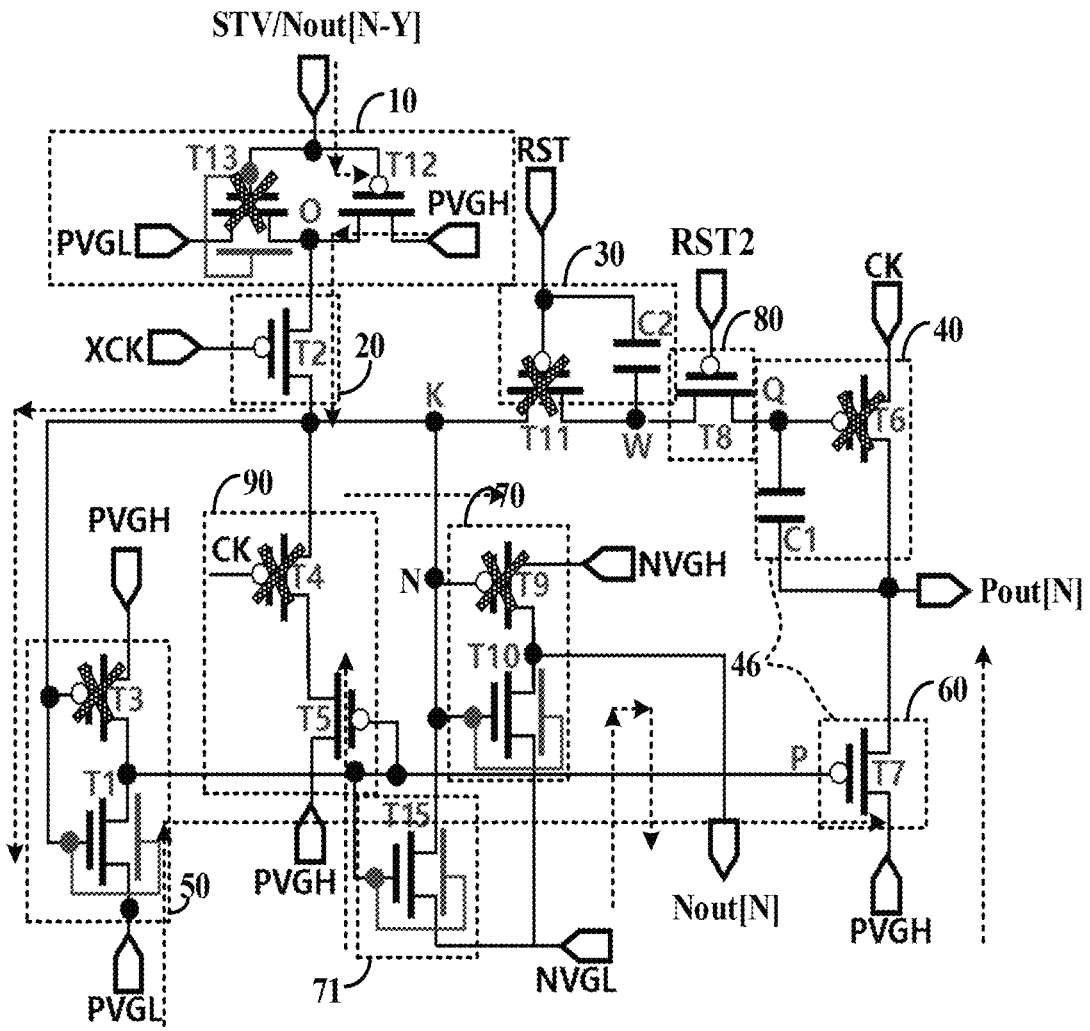
FIG. 44 illustrates the gate driving circuit shown in FIG. 32 at a tenth state shown in FIG. 34.

The tenth stage S10: As shown in FIG. 34 and FIG. 44, the starting control signal STV, the first clock signal XCK, and the (N−2)th positive pulse gate driving signal Nout [N−2] are at a low voltage level. The reset signal RST, the second clock signal CK are at a high voltage level. The second node K, the intermediate node W, the first node O/O[N] and the third node Q are all at a high voltage level. The fourth node P is at a low voltage level. The Nth positive pulse gate driving signal Nout[N] is at a low voltage level. The Nth negative pulse gate driving signal Pout[N] is at a high voltage level.

Figure 45:
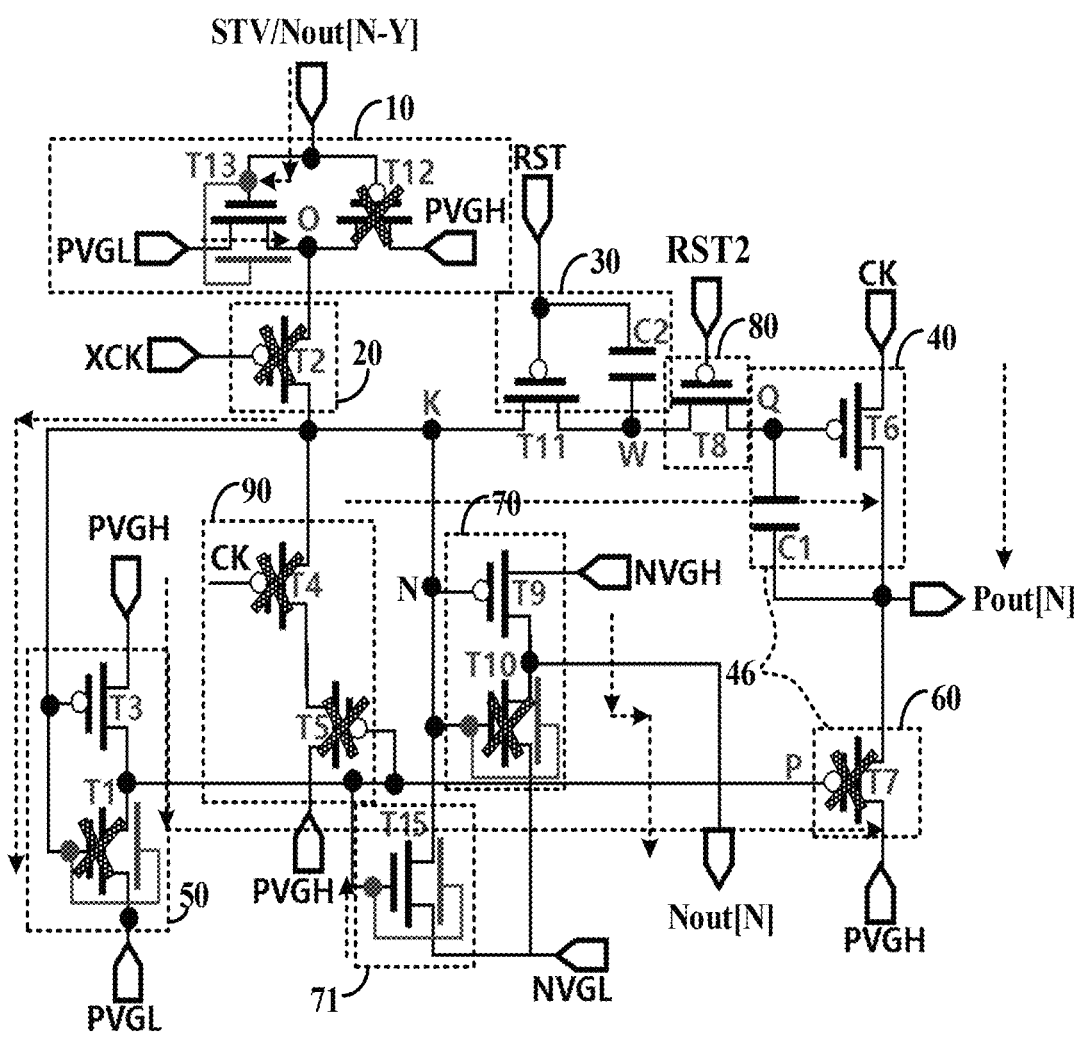
FIG. 45 illustrates the gate driving circuit shown in FIG. 32 at an eleventh state shown in FIG. 34.

The eleventh stage S11: As shown in FIG. 34 and FIG. 45, the reset signal RST and the (N−2)th positive pulse gate driving signal Nout [N−2] are at a low voltage level. The starting control signal STV, the first clock signal XCK and the second clock signal CK are at a high voltage level. The fourth node P and the third node Q are all at a high voltage level. The second node K, the intermediate node W and the first node O/O [N] are at a low voltage level. The Nth positive pulse gate driving signal Nout[N] is at a high voltage level. The Nth negative pulse gate driving signal Pout[N] is at a high voltage level.

Figure 46:
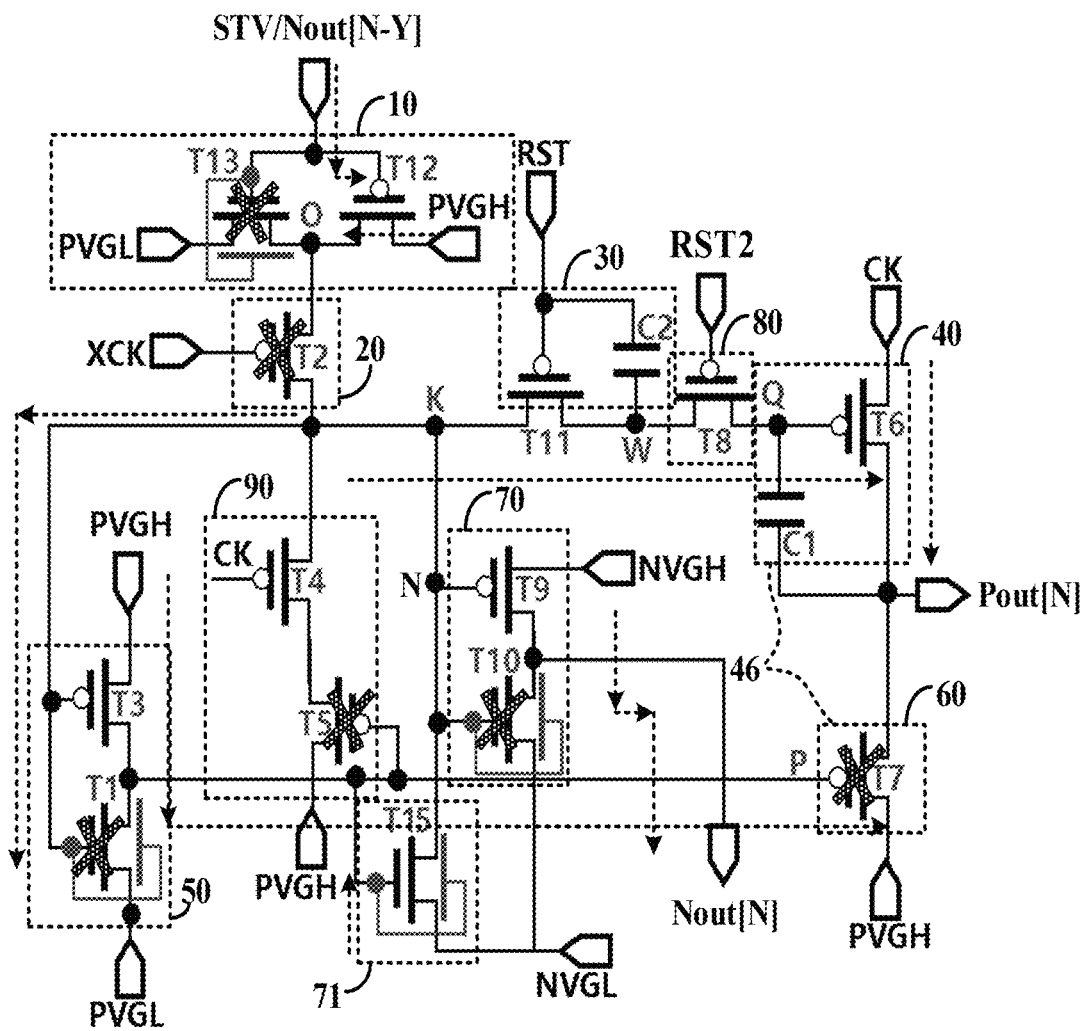
FIG. 46 illustrates the gate driving circuit shown in FIG. 32 at a twelfth state shown in FIG. 34.

The twelfth stage S12: As shown in FIG. 34 and FIG. 46, the second clock signal CK, the start control signal STV, the reset signal RST and the (N−2)th positive pulse gate driving signal Nout [N−2] are at a low voltage level. The first clock signal XCK is at a high voltage level. The fourth node P and the first node O/O[N] are all at a high voltage level. The third node Q, the second node K and the intermediate node W are at a low voltage level. The Nth positive pulse gate driving signal Nout [N] is at a high voltage level. The Nth negative pulse gate driving signal Pout[N] is at a low voltage level.

Figure 47:
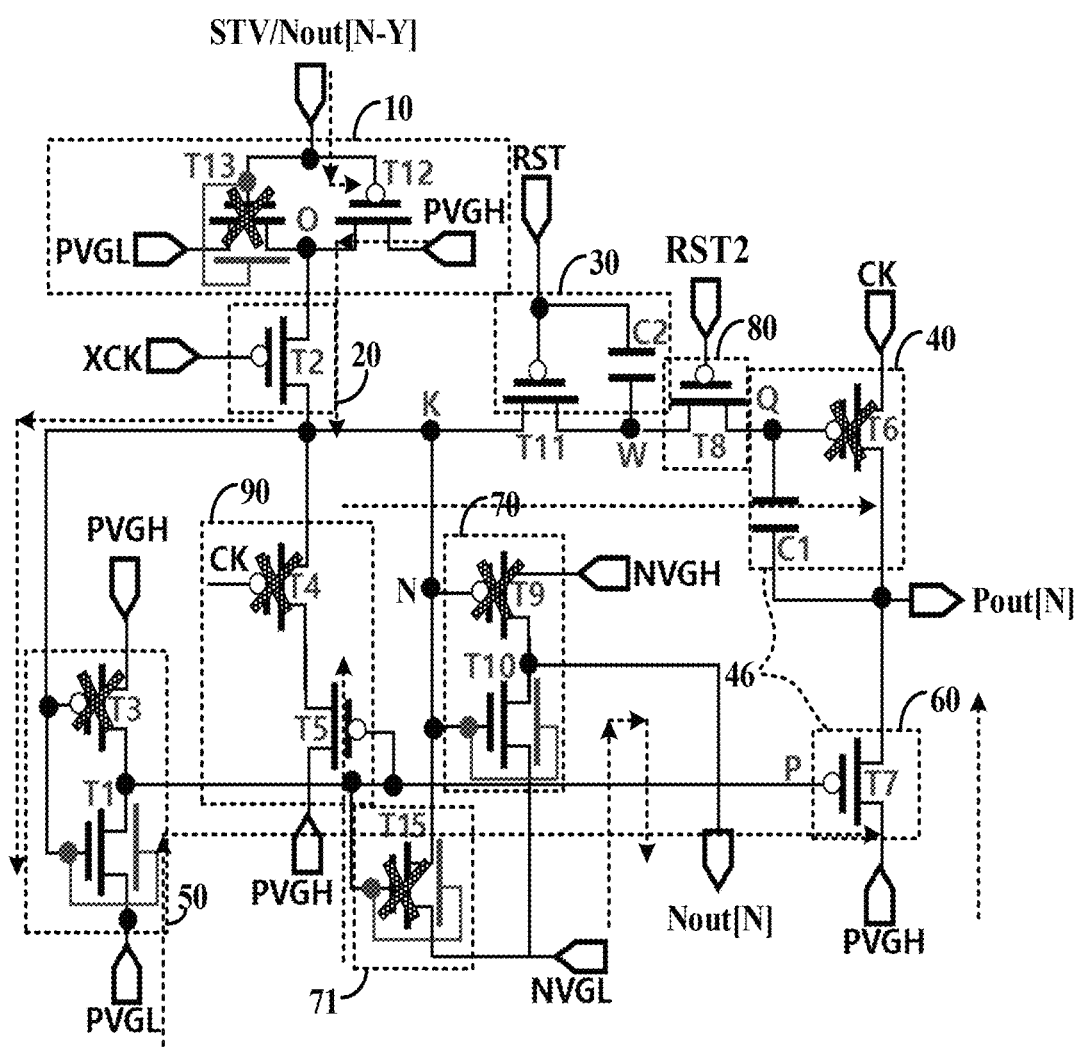
FIG. 47 illustrates the gate driving circuit shown in FIG. 32 at a thirteenth state shown in FIG. 34.

The thirteenth stage S13: As shown in FIG. 34 and FIG. 47, the first clock signal XCK, the start control signal STV, the reset signal RST and the (N−2)th positive pulse gate driving signal Nout [N−2] are at a low voltage level. The second clock signal CK is at a high voltage level. The second node K, the intermediate node W, the third node Q and the first node O/O [N] are all at a high voltage level. The fourth node P is at a low voltage level. The Nth stage positive pulse gate driving signal Nout [N] is at a low voltage level. The Nth negative pulse gate driving signal Pout[N] is at a high voltage level.

Figure 48:
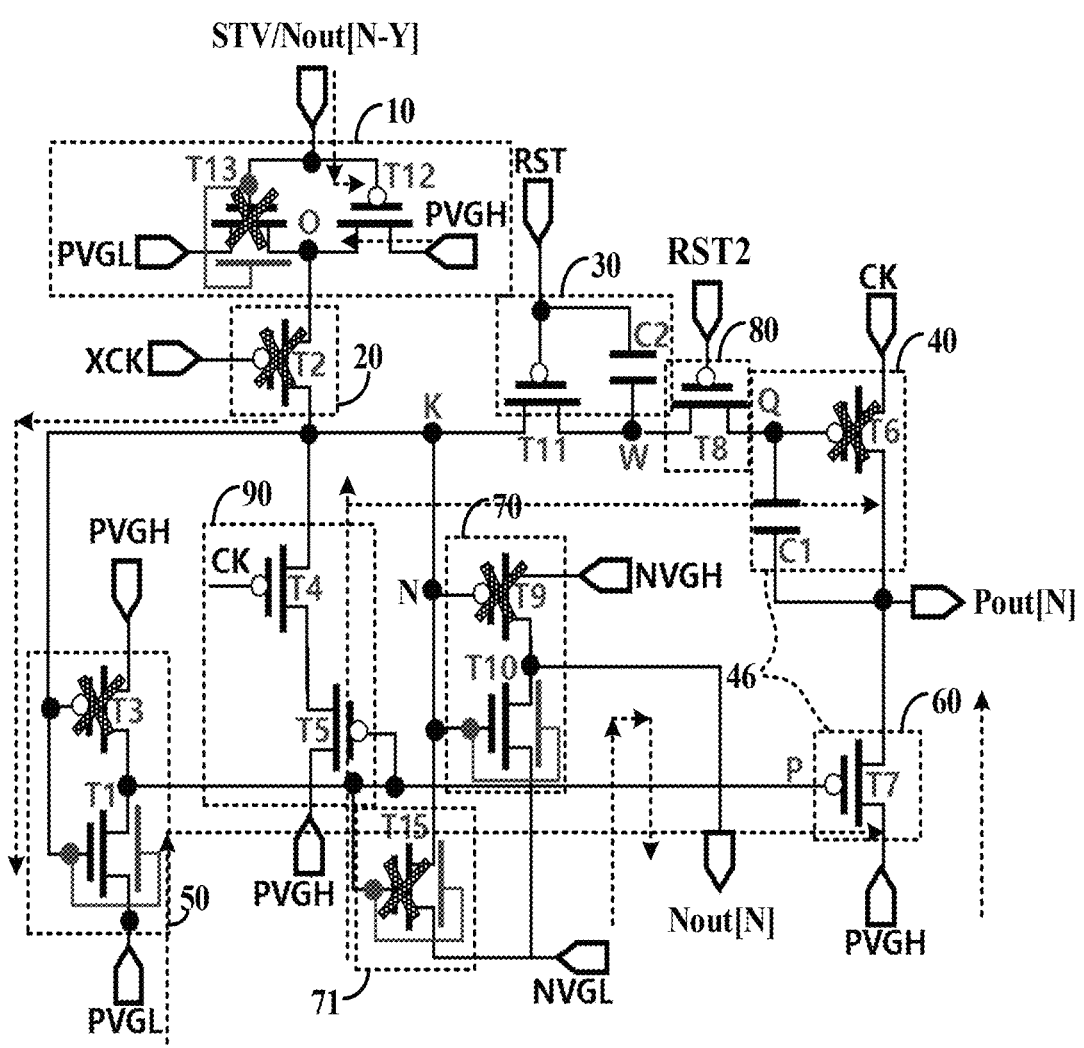
FIG. 48 illustrates the gate driving circuit shown in FIG. 32 at a fourteenth state shown in FIG. 34.

The fourteenth stage S14: As shown in FIG. 34 and FIG. 48, the second clock signal CK, the start control signal STV, the reset signal RST and the (N−2)th positive pulse gate driving signal Nout [N−2] are at a low voltage level. The first clock signal XCK is at a high voltage level. The second node K, the intermediate node W, the third node Q and the first node O/O[N] are all at a high voltage level. The fourth node P is at a low voltage level. The Nth positive pulse gate driving signal Nout [N] is at a low voltage level. The Nth negative pulse gate driving signal Pout[N] is at a high voltage level.

The fifteenth stage S15: As shown in FIG. 34 and FIG. 49, the first clock signal XCK, the start control signal STV, the reset signal RST and the (N−2)th positive pulse gate driving signal Nout [N−2] are at a low voltage level. The second clock signal CK is at a high voltage level. The second node K, the intermediate node W, the third node Q and the first node O/O[N] are all at a high voltage level. The fourth node P is at a low voltage level. The Nth stage positive pulse gate driving signal Nout [N] is at a low voltage level. The Nth negative pulse gate driving signal Pout[N] is at a high voltage level.

The "cross" in FIGS. 35-49 indicates that the transistor covered by it is in the off state, and the transistor that is not covered by the "cross" is in the on state. The dotted arrows in FIGS. 35-49 indicate the direction of the current.

In a frame, the gate driving circuit has a stage S100 and a stage S200. The above first stage S1 to the fifteenth stage S15 belong to stage S100. In stage S100, the pulses of each first gate driving signal and the pulses of each second gate driving signal are completely outputted. In stage S200, the pulses of each first gate driving signal and the pulses of each second gate driving signal are not required. Therefore, at least one of the first clock signal XCK and the second clock signal CK is maintained at a low voltage level. This could reduce the voltage transition frequency of at least one of the first clock signal XCK and the second clock signal CK, thereby reducing power consumption.

Figure 51:
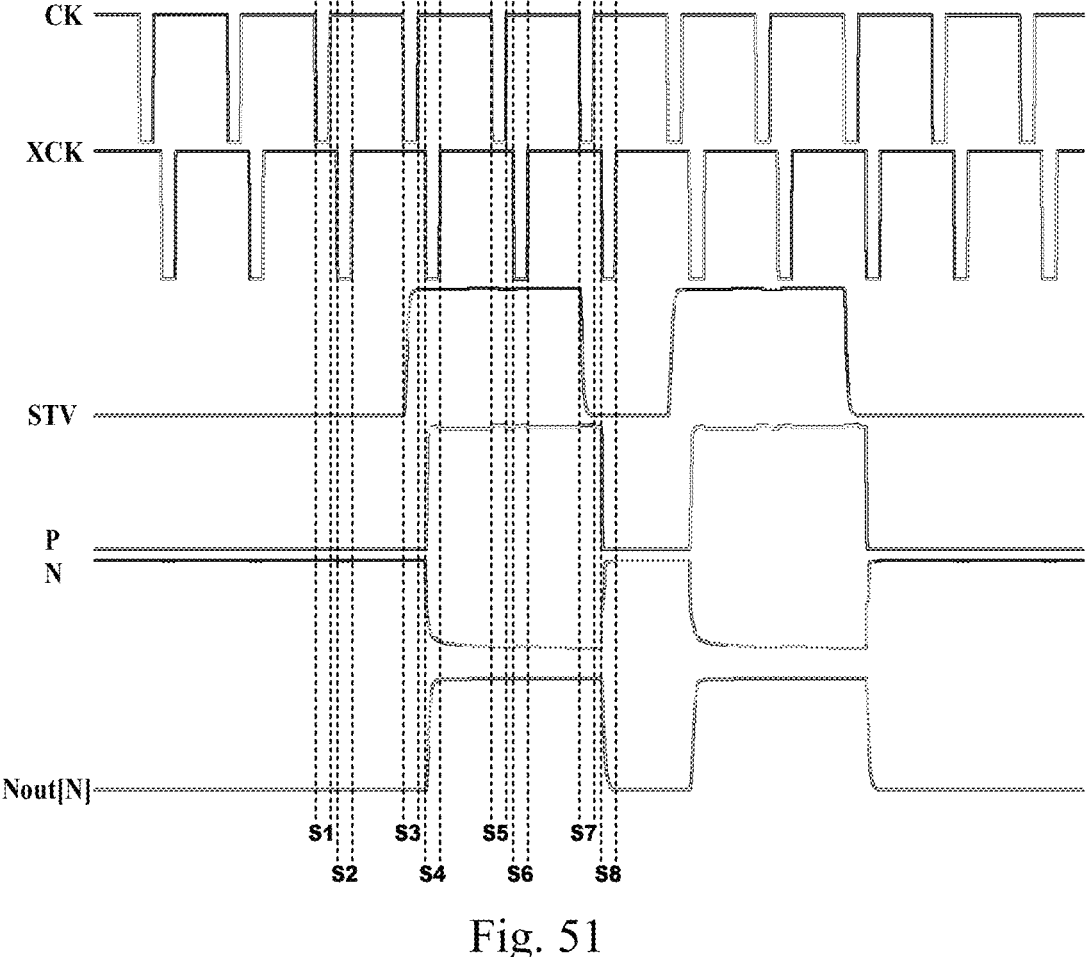
FIG. 51 is a timing diagram of the gate driving circuits shown in FIG. 50.

The operation of the shift register shown in FIG. 50 in a frame may include the following stages shown in FIG. 51.

Figure 52:
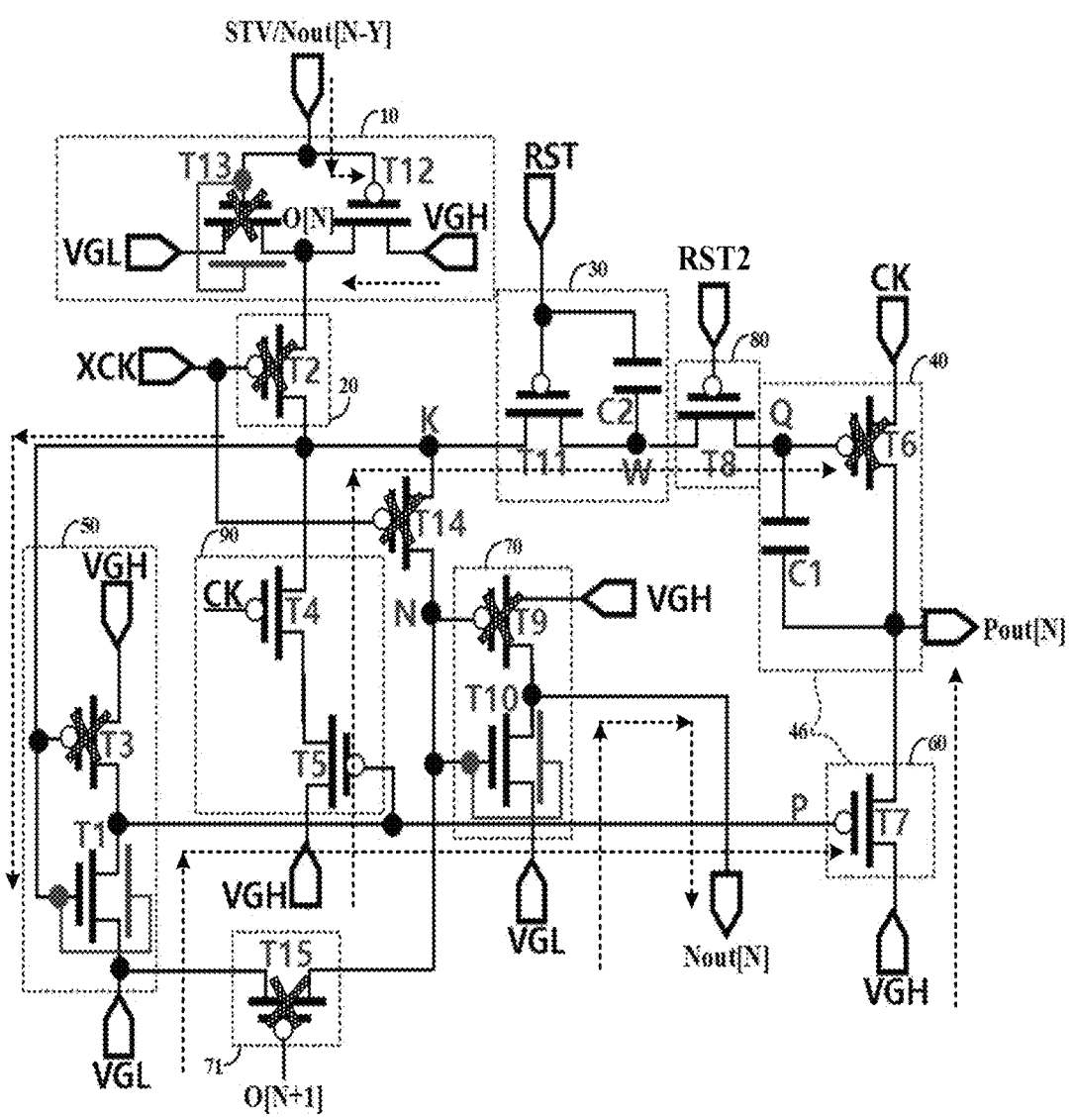
FIG. 52 illustrates the gate driving circuit shown in FIG. 50 at a first state shown in FIG. 51.

The first stage S1: As shown in FIG. 51 and FIG. 52, the starting control signal STV and the second clock signal CK are both at a low voltage level. The first clock signal XCK is at a high voltage level. The node N is at a high voltage level. The fourth node P is at a low voltage level. The Nth positive pulse gate driving signal Nout[N] is at a low voltage level.

Figure 53:
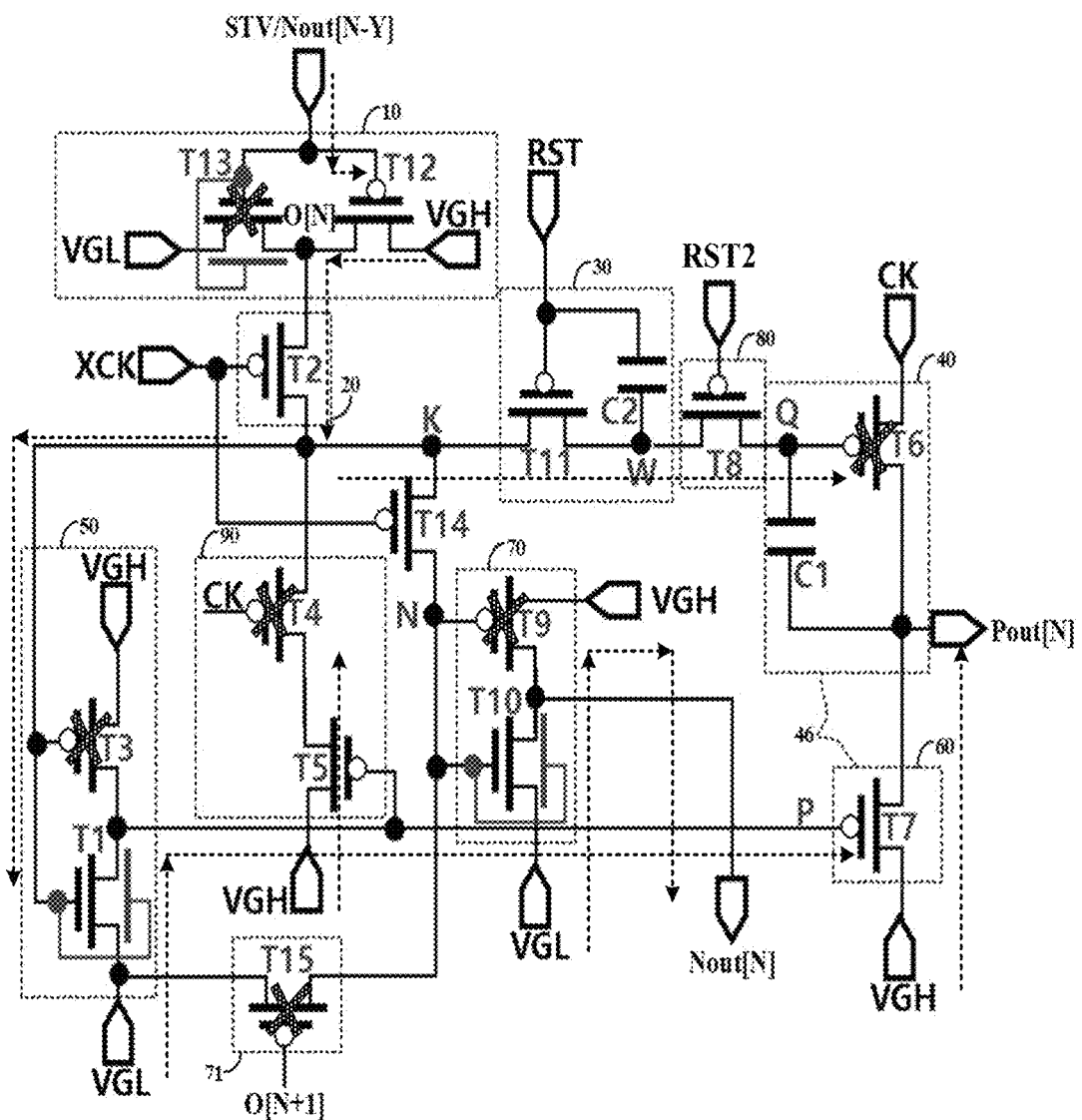
FIG. 53 illustrates the gate driving circuit shown in FIG. 50 at a second state shown in FIG. 51.

The second stage S2: As shown in FIG. 51 and FIG. 53, the starting control signal STV and the first clock signal XCK are at a low voltage level. The second clock signal CK is at a high voltage level. The node N is at a high voltage level. The fourth node P is at a low voltage level. The Nth positive pulse gate driving signal Nout[N] is at a low voltage level.

Figure 54:
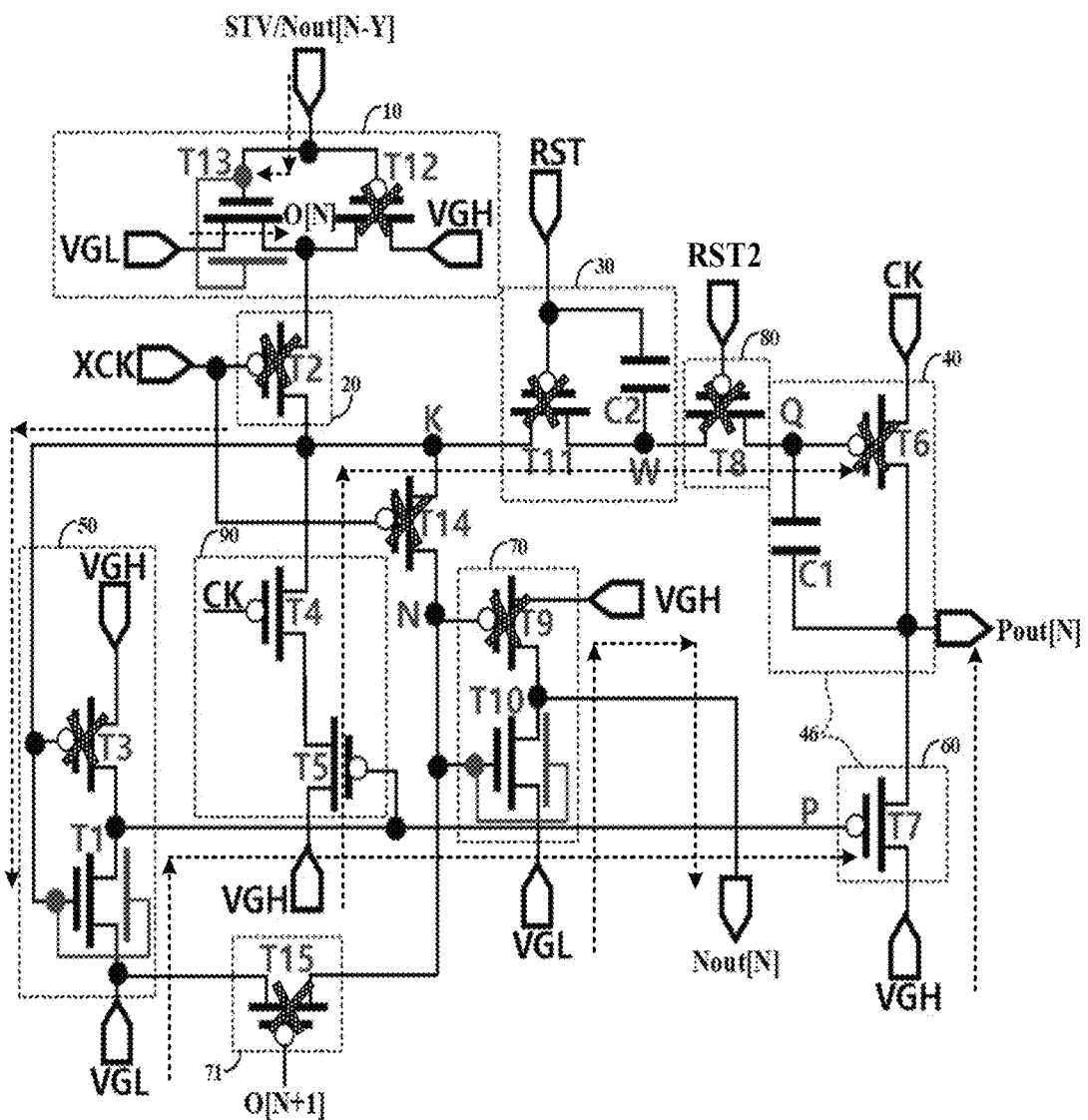
FIG. 54 illustrates the gate driving circuit shown in FIG. 50 at a third state shown in FIG. 51.

The third stage S3: As shown in FIG. 51 and FIG. 54, the second clock signal CK is at a low voltage level. The starting control signal STV and the first clock signal XCK are at a high voltage level. The node N is at a high voltage level. The fourth node P is at a low voltage level. The Nth positive pulse gate driving signal Nout[N] is at a low voltage level.

Figure 55:
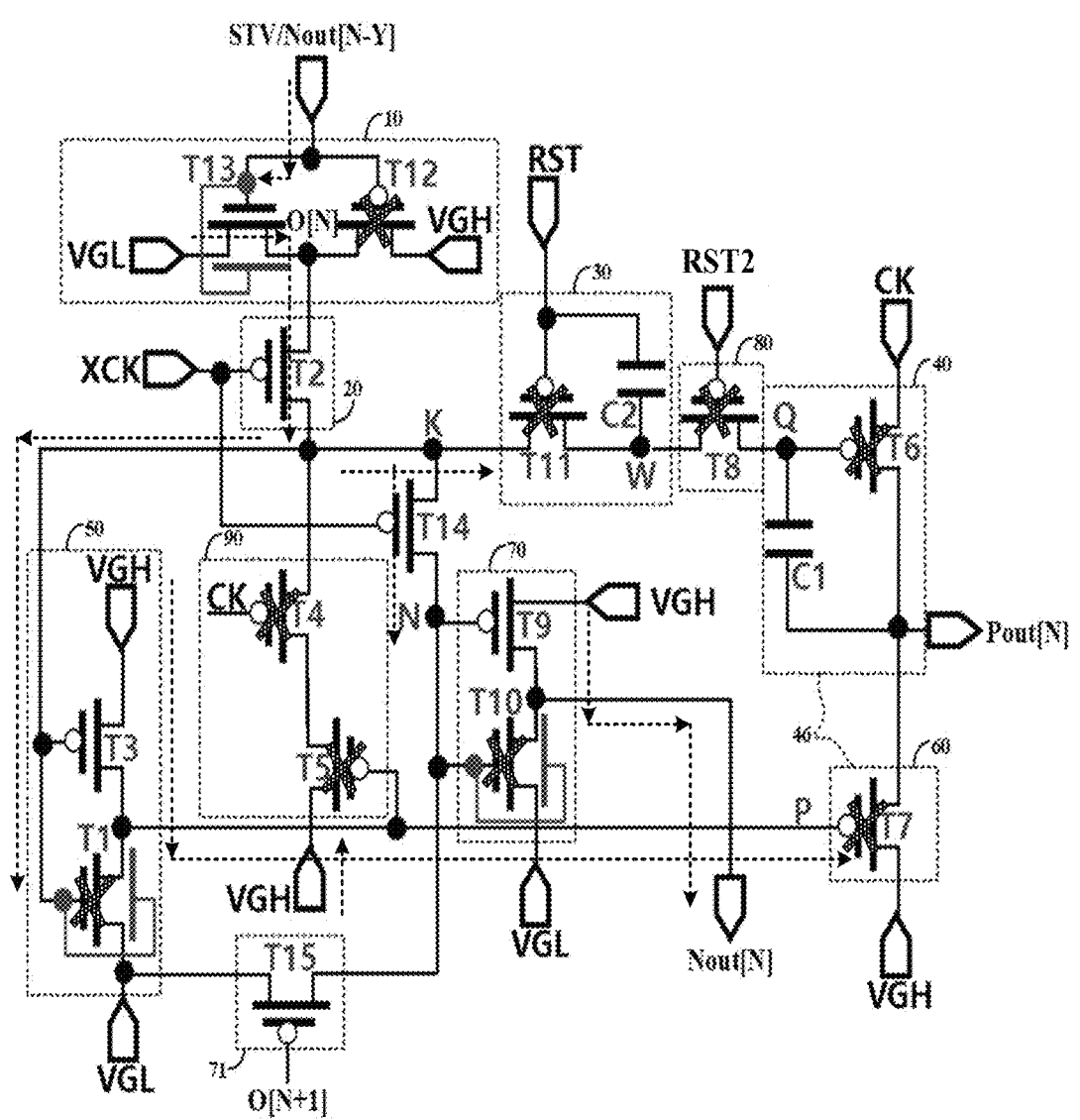
FIG. 55 illustrates the gate driving circuit shown in FIG. 50 at a fourth state shown in FIG. 51.

The fourth stage S4: As shown in FIG. 51 and FIG. 55, the first clock signal XCK is at a low voltage level. The starting control signal STV, the second clock signal CK are at a high voltage level. The fourth node P is at a high voltage level. The node N is at a low voltage level. The Nth positive pulse gate driving signal Nout[N] is at a high voltage level.

Figure 56:
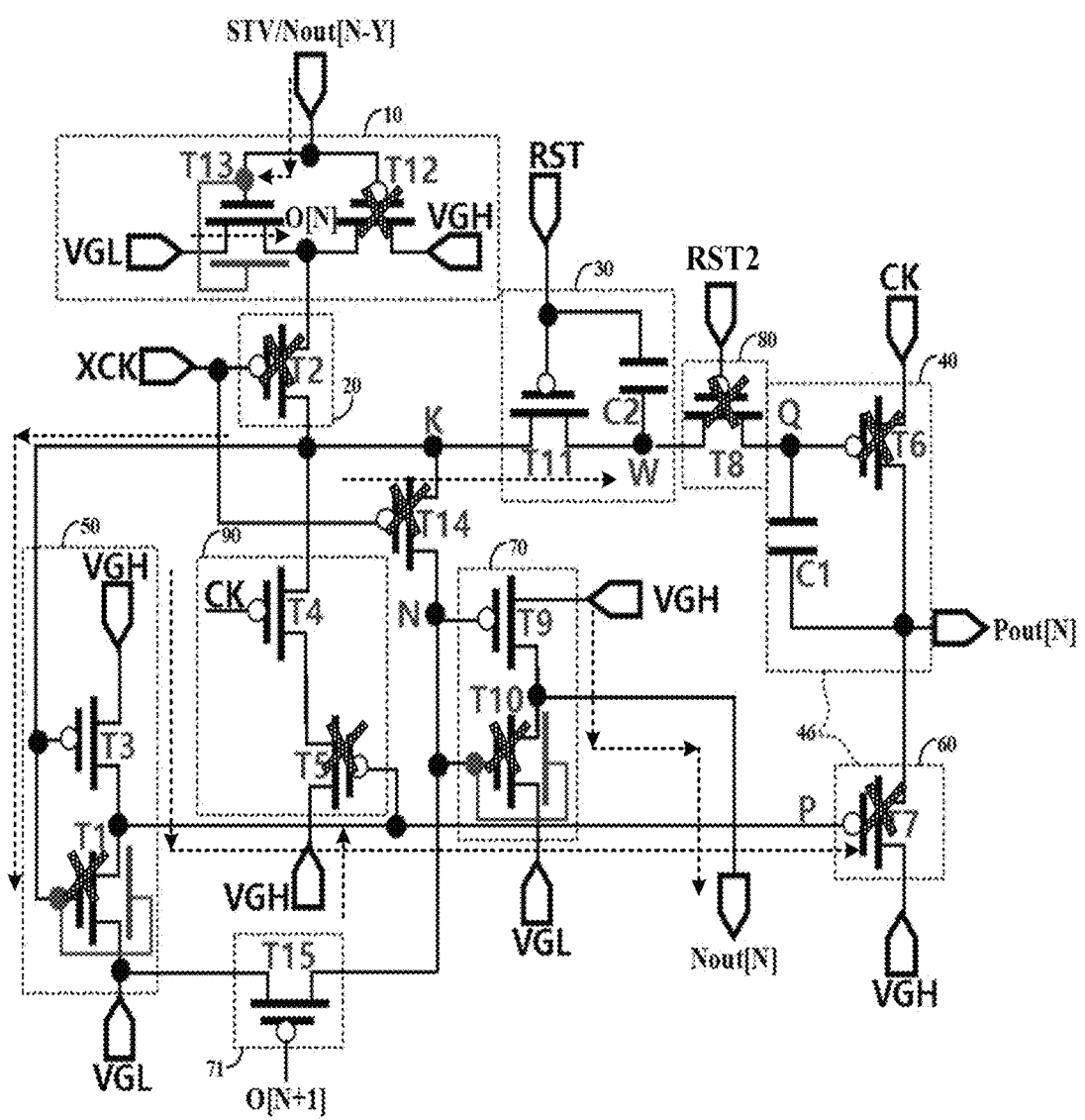
FIG. 56 illustrates the gate driving circuit shown in FIG. 50 at a fifth state shown in FIG. 51.

The fifth stage S5: As shown in FIG. 51 and FIG. 56, the second clock signal CK is at a low voltage level. The starting control signal STV and the first clock signal XCK are at a high voltage level. The fourth node P is at a high voltage level. The node N is at a low voltage level. The Nth positive pulse gate driving signal Nout[N] is at a high voltage level.

Figure 57:
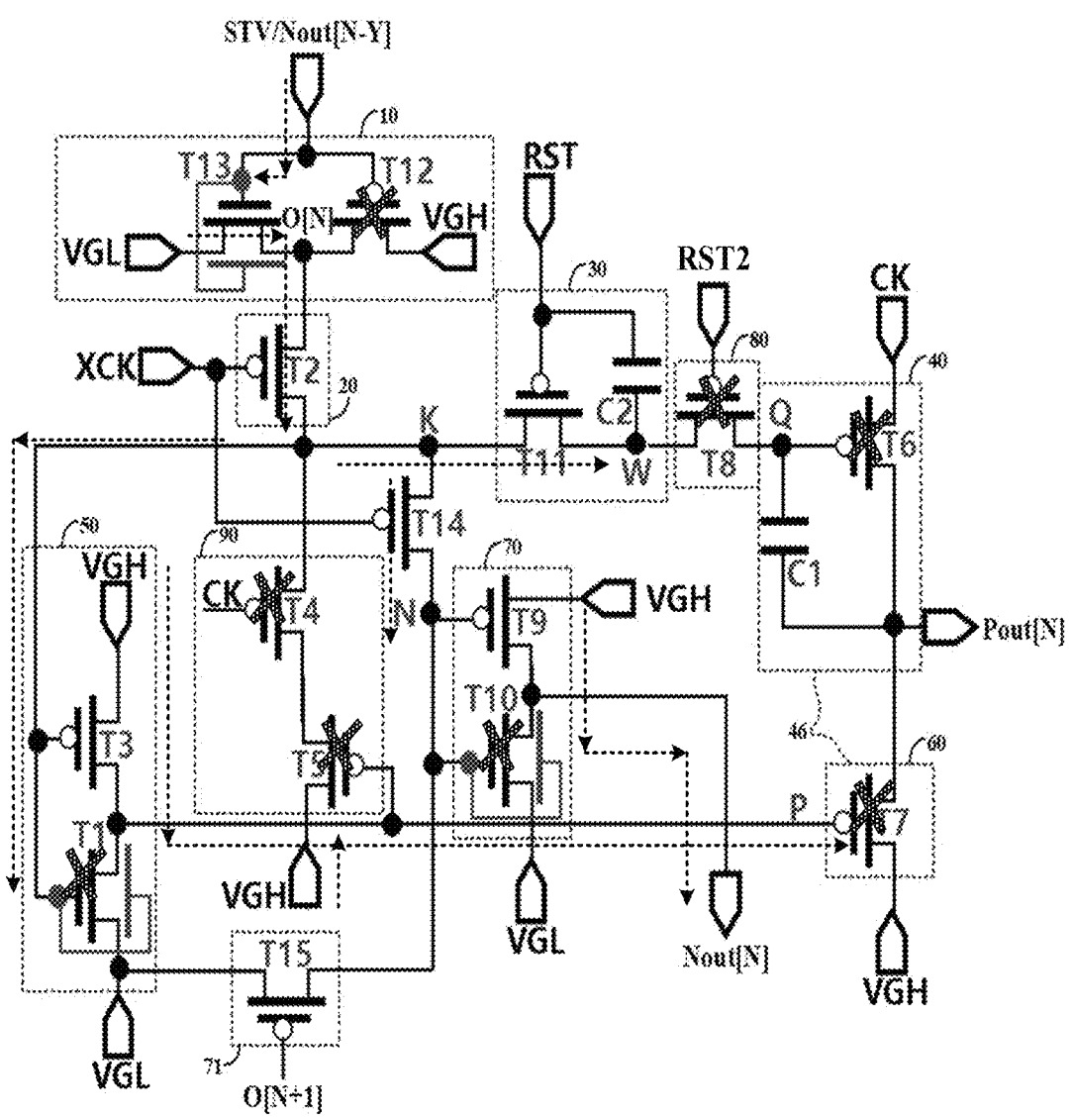
FIG. 57 illustrates the gate driving circuit shown in FIG. 50 at a sixth state shown in FIG. 51.

The sixth stage S6: As shown in FIG. 51 and FIG. 57, the first clock signal XCK is at a low voltage level. The starting control signal STV and the second clock signal CK are at a high voltage level. The fourth node P is at a high voltage level. The node N is at a low voltage level. The Nth positive pulse gate driving signal Nout [N] is at a high voltage level.

Figure 58:
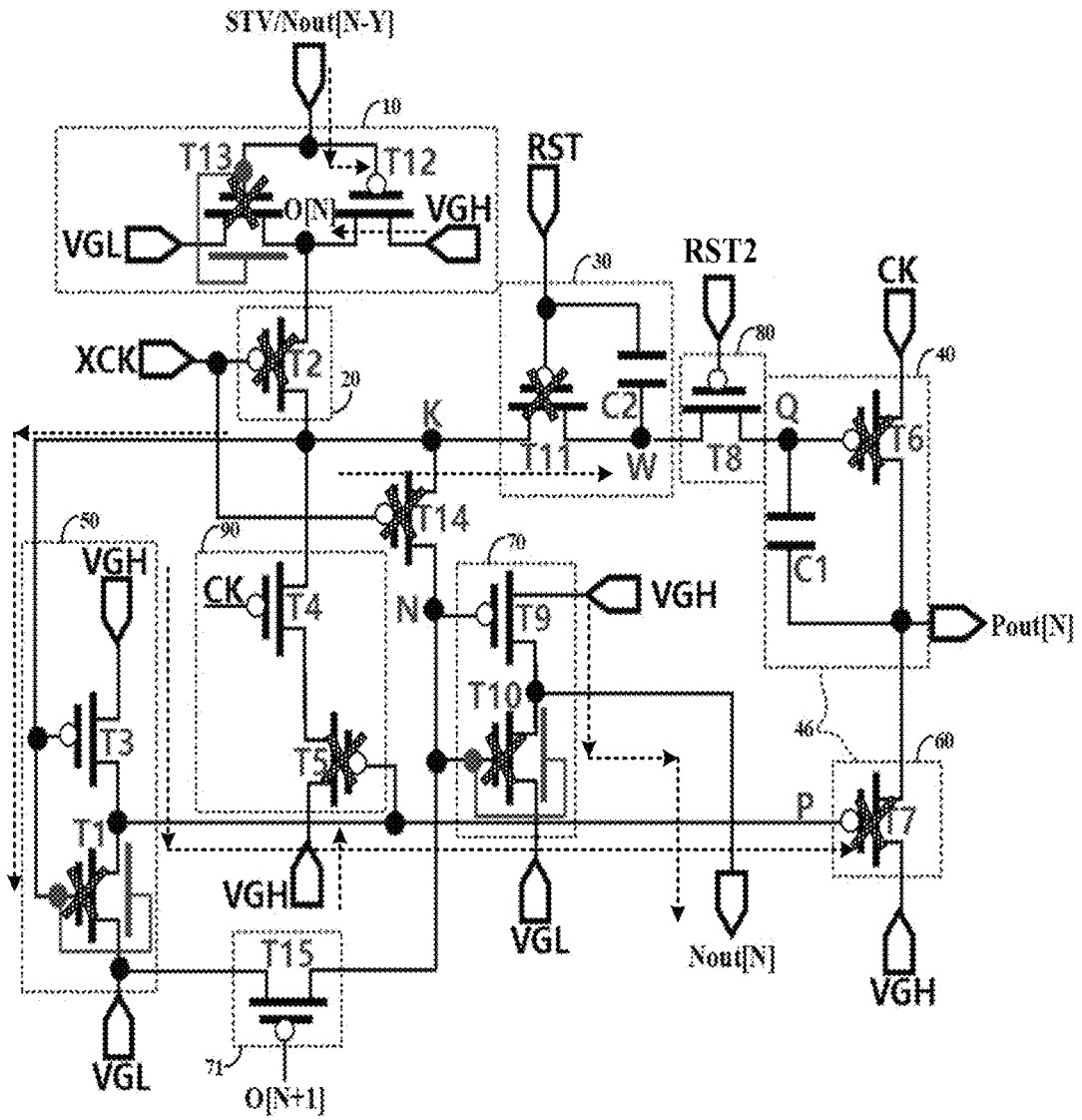
FIG. 58 illustrates the gate driving circuit shown in FIG. 50 at a seventh state shown in FIG. 51.

The seventh stage S7: As shown in FIG. 51 and FIG. 58, the starting control signal STV and the second clock signal CK are at a low voltage level. The first clock signal XCK is at a high voltage level. The fourth node P is at a high voltage level. The node N is at a low voltage level. The Nth positive pulse gate driving signal Nout[N] is at a high voltage level.

Figure 59:
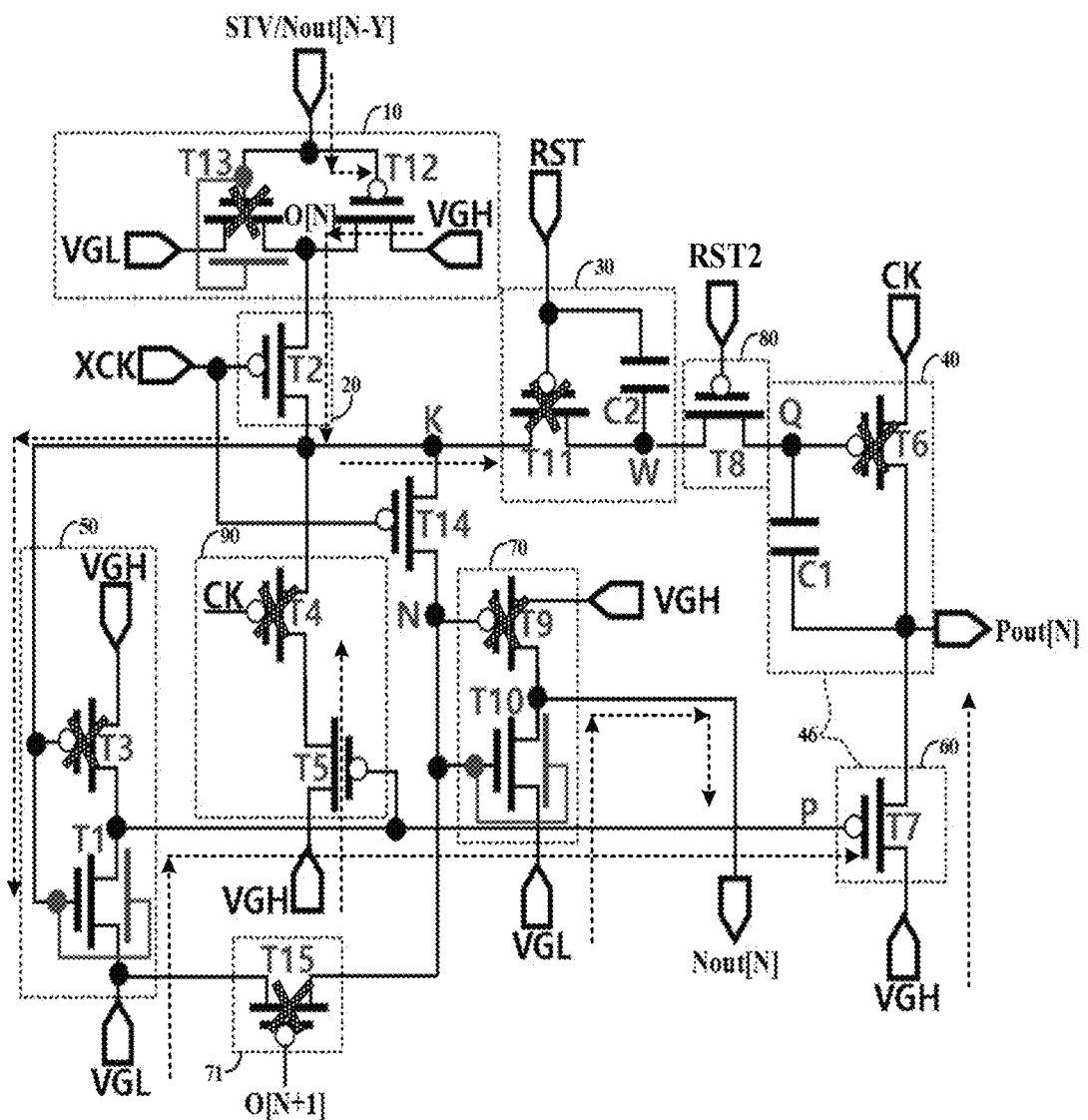
FIG. 59 illustrates the gate driving circuit shown in FIG. 50 at an eighth state shown in FIG. 51.

The eighth stage S8: As shown in FIG. 51 and FIG. 59, the starting control signal STV and the first clock signal XCK are at a low voltage level. The second clock signal CK is at a high voltage level. The node N is at a high voltage level. The fourth node P is at a low voltage level. The Nth positive pulse gate driving signal Nout[N] switches from a high voltage level to a low voltage level.

The "cross" in FIGS. 52-59 indicates that the transistor covered by it is in the off state, and the transistor that is not covered by the "cross" is in the on state. The dotted arrows in FIGS. 52-59 indicate the direction of the current.

Figure 60:
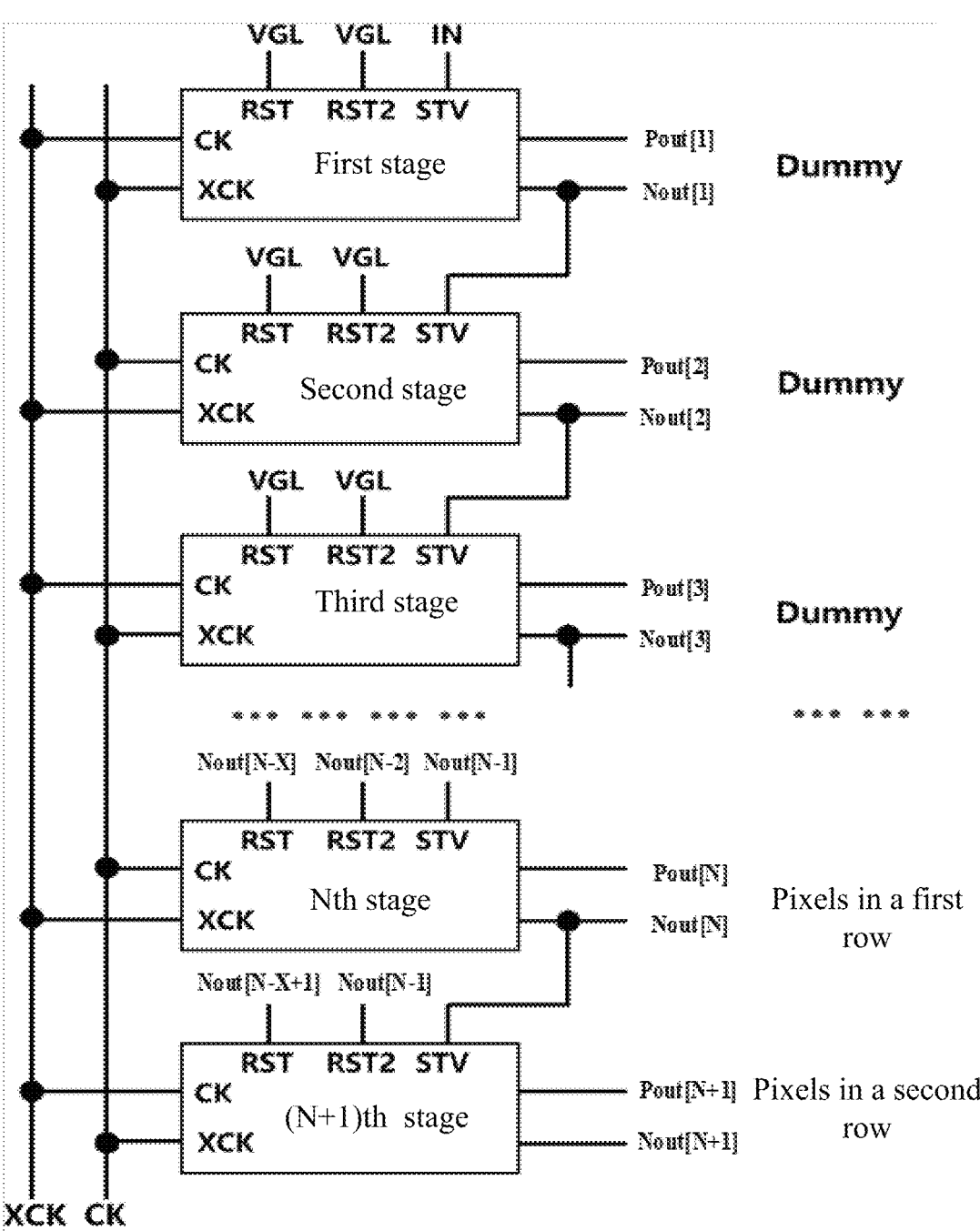
FIG. 60 is a diagram of the cascade structure between shift registers in the gate driving circuit shown in FIG. 3 or FIG. 20.

FIG. 60 is a diagram of the cascade structure between shift registers in the gate driving circuit shown in FIG. 3, FIG. 20, FIG. 32, FIG. 33 or FIG. 50. Here, from top to bottom, there are a first shift register, a second level shift registers, a third shift registers . . . a Nth shift register, and (N+1)th shift register . . . etc. Each shift register operates according to the first clock signal XCK and the second clock signal CK.

The control end of the first filter module 30 and the control end of the second filter module 80 in the first shift register receive the low voltage signal VGL. The input end (IN) of the first shift register connected to the starting control line receives the starting control signal STV. The first shift register outputs the first negative gate driving signal Pout [1] and the first positive gate driving signal Nout [1]. The first negative pulse gate driving signal Pout [1] and the first positive pulse gate driving signal Nout [1] are used to drive the dummy pixels (Dummy) or floating.

The control end of the first filter module 30 and the control end of the second filter module 80 in the second shift register receive the low voltage signal VGL. The starting control line connected to the second shift register receives the cascade signal, which is also the first positive pulse gate driving signal Nout [1]. The second shift register outputs the second negative pulse gate driving signal Pout [2] and the second stage positive pulse gate driving signal Nout [2]. The second negative pulse gate driving signal Pout [2] and the second positive pulse gate driving signal Nout [2] are used to drive dummy pixels (Dummy) or floating.

The control end of the first filter module 30 and the control end of the second filter module 80 in the third shift register receive the low voltage signal VGL. The starting control line connected to the third shift register receives the cascade signal, which is also the second stage positive pulse gate driving signal Nout [2]. The third shift register outputs the third negative gate driving signal Pout [3] and the third stage positive gate driving signal Nout [3]. The third negative pulse gate driving signal Pout [3] and the third positive pulse gate driving signal Nout [3] are used to drive dummy pixels (Dummy) or floating.

Subsequent shift registers could be arranged in a similar same way until the Nth shift register. The control end of the first filter module 30 and the control end of the second filter module 80 in the Nth shift register respectively receive the connected to the (N−X)th positive pulse gate driving signal Nout [N−X] and the (N−2)th positive pulse gate driving signal Nout [N−2]. The starting control line connected to the Nth shift register is connected to the cascade signal, which is also the (N−1)th positive pulse gate driving signal Nout [N−1]. The Nth shift register outputs the Nth negative pulse gate driving signal Pout[N] and the Nth positive pulse gate driving signal Nout[N]. The Nth negative pulse gate driving signal Pout[N] and the Nth positive pulse gate driving signal Nout[N] are used to drive the first line of pixel circuits (Pixel).

The control end of the first filter module 30 and control end of the second filter module 80 in the (N+1)th shift register respectively receive the (N−X+1)th positive pulse gate driving signal Nout [N−X+1] and the (N−1)th positive pulse gate driving signal Nout [N−1]. The starting control line connected to the (N+1)th shift register is connected to the cascaded signal, which is also the Nth positive pulse gate driving signal Nout [N]. The (N+1)th shift register outputs the (N+1)th negative pulse gate driving signal Pout[N+1] and the (N+1)th positive pulse gate driving signal Nout[N+1]. The (N+1)th negative pulse gate driving signal Pout [N+1] and the (N+1)th positive pulse gate driving signal Nout [N+1] are used to drive the second line of pixel circuits (Pixel).

Subsequent shift registers can be arranged in a similar way. Since the output ends of some shift registers are connected to the dummy pixels or floating, each output end of the Nth level shift register is not connected to the Nth row of pixel circuits. Instead, the number of the shift registers connected to the dummy pixels/floating shift registers needs to be determined first and then the actual row number of the nth shift register connected could be determined. For example, if the first shift register to the third shift register are connected to the dummy pixels, the (N−3)th line of pixel circuits are connected to each output end of the Nth stage shift register.

Subsequent shift registers can be can be arranged in a similar way.

Figure 61:
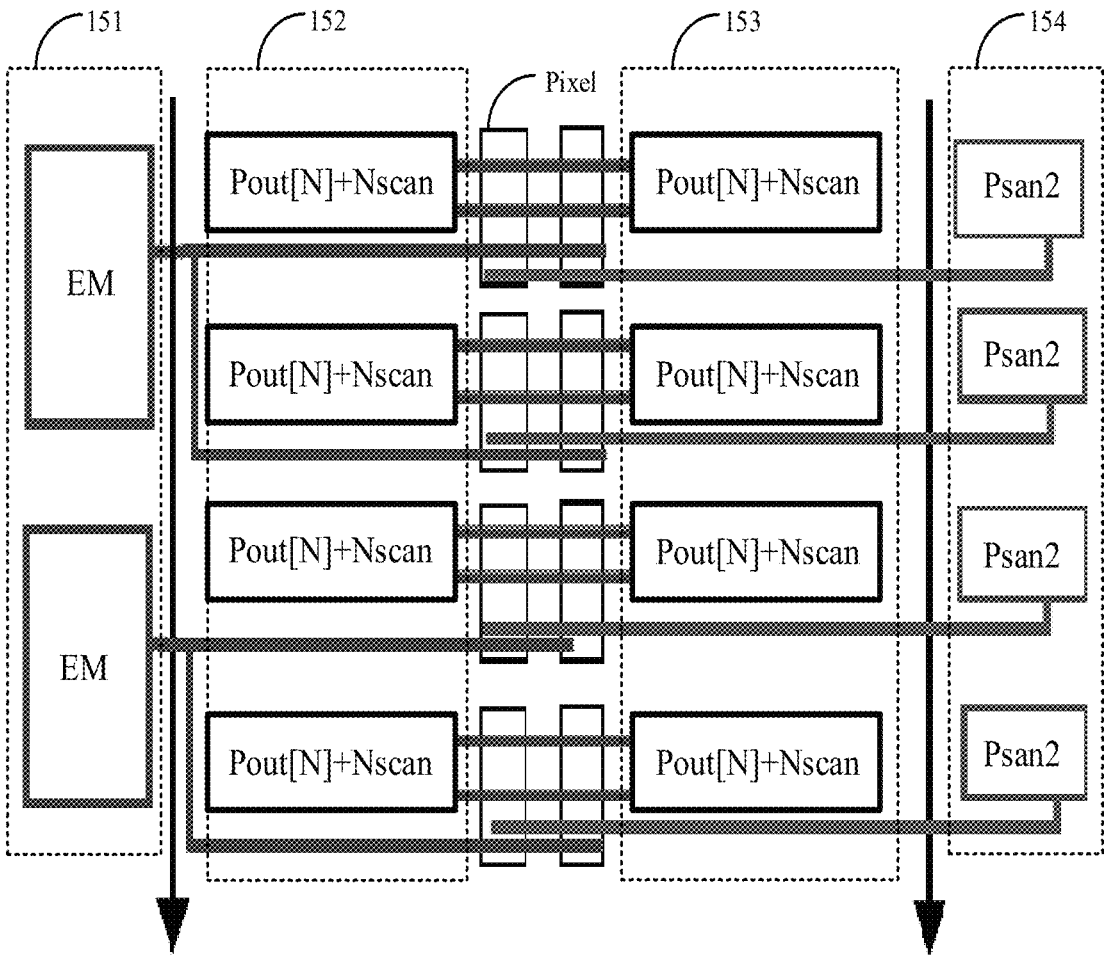
FIG. 61 is a diagram of a display panel according to an embodiment of the present disclosure.

The display panel shown in FIG. 61 comprises a pixel circuit (Pixel) arranged in an array in the display area, a first gate driving circuit 151 for providing a light emitting signal EM, a fourth gate driving circuit 154 for providing a gate driving signal Pscan2, a second gate driving circuit 152 for providing a Nth negative pulse gate driving signal Pout [N] and a gate driving signal Nscan, and a third gate driving circuit 153 for providing the Nth negative pulse gate driving signal Pout [N] and the gate driving signal Nscan.

The first gate driving circuit 151 may be located on the left side of the display area. The output end of each shift register in the first gate driving circuit 151 provides the luminous control signal EM through the corresponding light-emitting control line to the adjacent two lines of pixel circuits. This arrangement is single-sided drive.

The fourth gate driving circuit 154 may be located on the right side of the display area. The output end of each shift register in the fourth gate driving circuit 154 provides the gate driving signal Pscan2 through the corresponding gate driving line to a line of pixel circuit. This is also a single-sided drive.

The second gate driving circuit 152 is located between the first gate driving circuit 151 and the display area. The third gate driving circuit 153 is located between the fourth gate driving circuit 154 and the display area. A scan line for transmitting the Nth negative pulse gate driving signal Pout[N] is electrically connected to the output end of a shift register in the second gate driving circuit 152, the output end of a shift register in the third gate driving circuit 153 and a line of pixel circuits. A gate driving signal line for transmitting the gate driving signal Nscan is electrically connected to the output end of a shift register in the second gate driving circuit 152, the output end of a shift register in the third gate driving circuit 153 and a line of pixel circuit. This arrangement is a bilateral drive.

The second gate driving circuit 152 and/or the third gate driving circuit 153 may be implemented with the gate driving circuit shown in FIG. 3 or FIG. 20. The gate driving signal Nscan may include the Nth positive pulse gate driving signal Nout[N] and the (N−3)th positive pulse gate driving signal Nout [N−3].

Since the gate of the first initialization transistor T4P in the pixel circuit shown in FIG. 1 must receive the (N−1)th positive pulse gate driving signal Nout[N−1], in the pixel circuit shown in FIG. 33, after the gate of the write-in transistor T2P receives the Nth negative pulse gate driving signal Pout[N] and the gate of the compensation transistor T3P receives Nth positive pulse gate driving signal Nout[N], the gate of the third initialization transistor T8P could continue to use the existing gate driving signal Pscan2 (it means there is no need to improve the fourth gate driving circuit 154). Furthermore, the gate of the first initialization transistor T4P can also be replaced with the (N−3)th positive pulse gate driving signal Nout [N−3].

Figure 62:
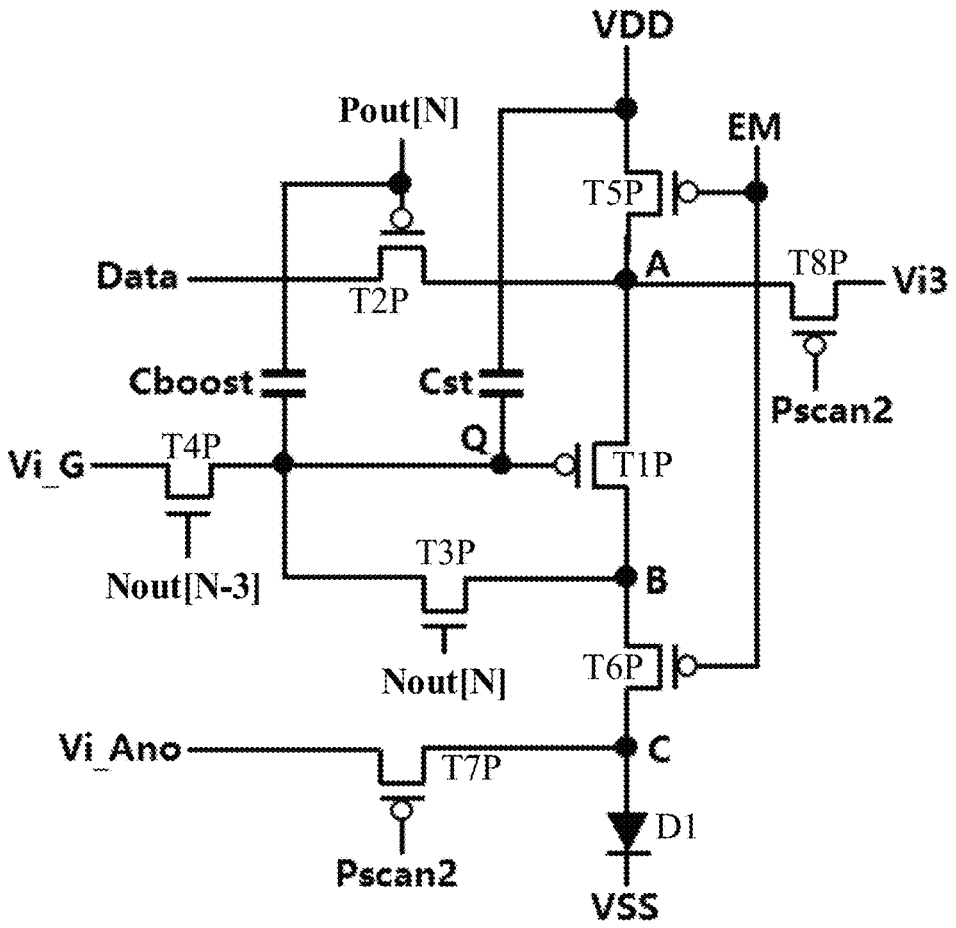
FIG. 62 is a diagram of a pixel circuit according to an embodiment of the present disclosure.
Figure 63:
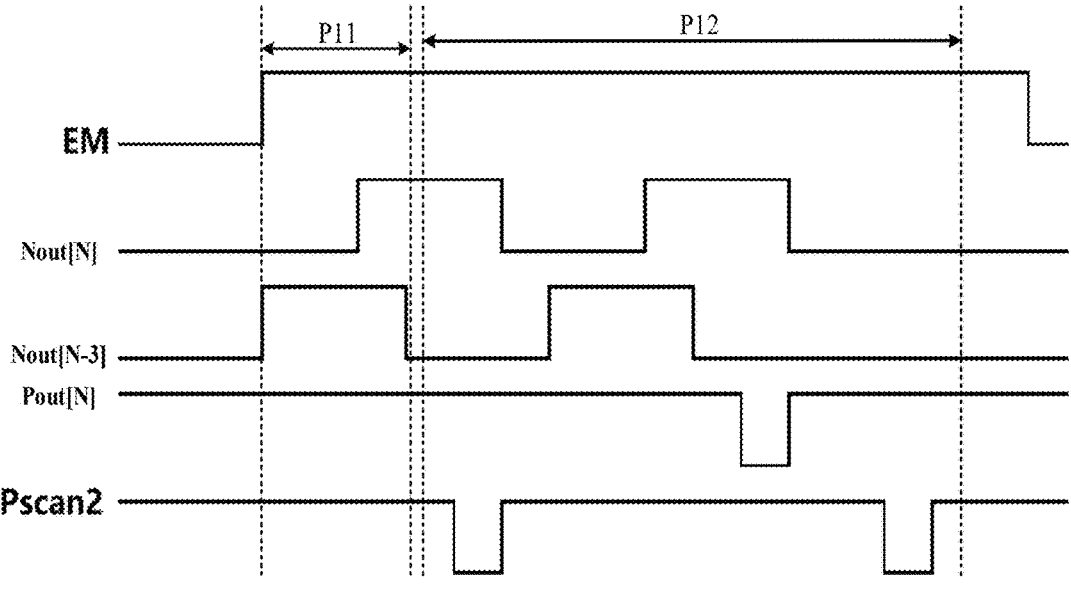
FIG. 63 is a timing diagram of the pixel circuit shown in FIG. 62.

Then, the pixel circuit shown in FIG. 62 can not only work in the existing stage P12 in FIG. 63 but also add an additional stage P11. The phase P11 could reset the voltage levels of the three-terminal (Q, A, B) of the driving transistor TIP due to the synchronous conduction of the first initialization transistor T4P and the compensating transistor T3P, so as to reduce the drift of the threshold voltage of the driving transistor TIP and thus further improve flicker issues at different refresh rates.

According to an embodiment, a display panel is disclosed. The display panel comprises a pixel circuit and the gate driving circuit of at least one of the aforementioned embodiments.

Because the display panel comprises a gate driving circuit of at least one of the above embodiments, the voltage regulator module 71 may stabilize or reduce the gate voltage of the second transistor T10 through a low voltage signal under the control of at least one of the fourth node P, the output end of the second output module 70 and the first node O[n+1] of the shift register of the next stage. This makes the second transistor T10 stable or better in the off state to reduce the leakage current. In addition, the voltage level of the second gate driving signal can be maintained at a high voltage level or a pulse amplitude. This improves the stability of the gate driving signal.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A gate driving circuit, comprising a plurality of shift registers, wherein at least one of the plurality of shift registers comprises:

a cascade signal selection module configured to select signals between a first wiring and a first node;

a pull-up control module responsive to a clock signal for adjusting voltage levels between the first node and a second node;

a filtering module connected between the second node and a third node, wherein a control end of the filtering module receives a reset or filter control signal;

an inverting module for inverting voltage levels between the second node and a fourth node;

a first output module configured to generate gate driving signals based on voltage levels at the third node and the fourth node;

a second output module comprising a first transistor and a second transistor, configured to output a second gate driving signal; and a voltage regulating module connected to the second output module, configured to regulate a voltage level of the second transistor based on signals from internal nodes or the shift register of a next stage.

2. The gate driving circuit of claim 1, wherein the voltage regulating module comprises a third transistor, and a gate of the third transistor is connected to one of the fourth node, an output of the second output module, or the first node of the shift register of the next stage.

3. The gate driving circuit of claim 2, wherein the third transistor and the second transistor share a same low voltage line, and the third transistor operates to further reduce a gate voltage of the second transistor when the second transistor is in an off state.

4. The gate driving circuit of claim 3, wherein a voltage level applied to the third transistor is lower than a voltage level of a first low voltage signal, and a difference between the voltage level applied to the third transistor and the voltage level of a first low voltage signal is greater than or equal to 2V.

5. The gate driving circuit of claim 3, wherein the third transistor is configured to further reduce leakage current by lowering the gate voltage of the second transistor in the off state.

6. The gate driving circuit of claim 2, wherein the second transistor and the third transistor are double-gate transistors, with a first gate of the second transistor connected to the second node, and a second gate of the second transistor connected to the third node; a first gate of the third transistor is connected to the fourth node, and the second gate of the third transistor is connected to a node from the shift register of the next stage.

7. The gate driving circuit of claim 2, further comprising a sixth transistor, wherein the sixth transistor comprises a gate connected to the first clock signal, a first electrode connected to the second node, and a second electrode connected to the gate of the first transistor in the second output module.

8. The gate driving circuit of claim 7, wherein the gate of the third transistor is connected to a node of the shift register of the next stage, allowing the gate driving circuit to pull down a voltage at a fifth node.

9. The gate driving circuit of claim 8, wherein the node of the shift register of the next stage controls the gate of the third transistor, and a voltage level of the fifth node reaches a target voltage of VGL−Vth.

10. The gate driving circuit of claim 1, wherein the inverting module comprises a P-type transistor and an N-type transistor, each connected to the second node, and the N-type transistor is configured to receive a second low voltage signal lower than the first low voltage signal.

11. The gate driving circuit of claim 10, wherein the N-type transistor is configured to maintain a gate-to-source voltage difference of the third transistor at a level.

12. A display panel, comprising:

a pixel circuit, comprising:

a writing transistor, configured to control an input of a data signal; and a compensation transistor, configured to control the data signal to be inputted to a gate of driving transistor; and a gate driving circuit comprising a plurality of shift registers, wherein at least one of the plurality of shift registers comprises:

a cascade signal selection module configured to select signals between a first wiring and a first node;

a pull-up control module responsive to a clock signal for adjusting voltage levels between the first node and a second node;

a filtering module connected between the second node and a third node, wherein a control end of the filtering module receives a reset or filter control signal;

an inverting module for inverting voltage levels between the second node and a fourth node;

a first output module configured to generate gate driving signals based on voltage levels at the third node and the fourth node;

a second output module comprising a first transistor and a second transistor, configured to output a second gate driving signal; and a voltage regulating module connected to the second output module, configured to regulate a voltage level of the second transistor based on signals from internal nodes or the shift register of a next stage.

13. The display panel of claim 12, wherein the voltage regulating module comprises a third transistor, wherein a gate of the third transistor is connected to one of the fourth node, an output of the second output module, or the first node of the shift register of the next stage.

14. The display panel of claim 13, wherein the third transistor and the second transistor share a same low voltage line, and the third transistor operates to further reduce a gate voltage of the second transistor when the second transistor is in an off state.

15. The display panel of claim 14, wherein a voltage level applied to the third transistor is lower than a voltage level of a first low voltage signal, and a difference between the voltage level applied to the third transistor and the voltage level of a first low voltage signal is greater than or equal to 2V.

16. The display panel of claim 14, wherein the third transistor is configured to further reduce leakage current by lowering the gate voltage of the second transistor in the off state.

17. The display panel of claim 13, wherein the second transistor and the third transistor are double-gate transistors, with a first gate of the second transistor connected to the second node, and a second gate of the second transistor connected to the third node; a first gate of the third transistor is connected to the fourth node, and the second gate of the third transistor is connected to a node from the shift register of the next stage.

18. The display panel of claim 13, further comprising a sixth transistor, wherein the sixth transistor comprises a gate connected to the first clock signal, a first electrode connected to the second node, and a second electrode connected to the gate of the first transistor in the second output module.

19. The display panel of claim 18, wherein the gate of the third transistor is connected to a node of the shift register of the next stage, allowing the gate driving circuit to pull down a voltage at a fifth node.

20. The display panel of claim 19, wherein the node of the shift register of the next stage controls the gate of the third transistor, and a voltage level of the fifth node reaches a target voltage of VGL−Vth.

\* \* \* \* \*